(12) United States Patent
Onuma

(10) Patent No.: US 11,069,631 B2
(45) Date of Patent: Jul. 20, 2021

(54) THREE-DIMENSIONAL MEMORY DIE CONTAINING STRESS-COMPENSATING SLIT TRENCH STRUCTURES AND METHODS FOR MAKING THE SAME

(71) Applicant: SANDISK TECHNOLOGIES LLC, Addison, TX (US)

(72) Inventor: Takuji Onuma, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 16/594,959

(22) Filed: Oct. 7, 2019

(65) Prior Publication Data
US 2021/0104473 A1    Apr. 8, 2021

(51) Int. Cl.
| | | |
|---|---|---|
| H01L 27/115 | (2017.01) | |
| H01L 23/58 | (2006.01) | |
| H01L 27/11519 | (2017.01) | |
| H01L 27/11524 | (2017.01) | |
| H01L 27/11529 | (2017.01) | |
| H01L 27/11582 | (2017.01) | |
| H01L 27/11565 | (2017.01) | |
| H01L 27/1157 | (2017.01) | |

(Continued)

(52) U.S. Cl.
CPC ........ *H01L 23/585* (2013.01); *H01L 27/1157* (2013.01); *H01L 27/11519* (2013.01); *H01L 27/11524* (2013.01); *H01L 27/11529* (2013.01); *H01L 27/11556* (2013.01); *H01L 27/11565* (2013.01); *H01L 27/11573* (2013.01); *H01L 27/11582* (2013.01)

(58) Field of Classification Search
None
See application file for complete search history.

(56) References Cited

U.S. PATENT DOCUMENTS

| | | |
|---|---|---|
| 5,915,167 A | 6/1999 | Leedy |
| 9,343,358 B1 | 5/2016 | Xu |

(Continued)

OTHER PUBLICATIONS

Notification of Transmittal of the International Search Report and Written Opinion of the International Search Authority for International Patent Application No. PCT/US2020/025606, dated Jul. 30, 2020, 12 pages.

(Continued)

*Primary Examiner* — Benjamin P Sandvik
(74) *Attorney, Agent, or Firm* — The Marbury Law Group PLLC

(57) ABSTRACT

A semiconductor die includes a plurality of alternating stacks of insulating layers and electrically conductive layers that are located over a substrate and that laterally extend along a first horizontal direction and that are laterally spaced apart along a second horizontal direction which is perpendicular to the first horizontal direction, a plurality of sets of memory stack structures extending through the plurality of alternating stacks, and a plurality of nested seal ring structures which include a first seal ring structure comprising having a first seal ring width between an inner sidewall and an outer sidewall thereof, and a second seal ring structure having a second seal ring width between an inner sidewall and an outer sidewall thereof, such that the first seal ring width is less than the second seal ring width.

9 Claims, 39 Drawing Sheets

(51) Int. Cl.
*H01L 27/11573* (2017.01)
*H01L 27/11556* (2017.01)

(56) References Cited

U.S. PATENT DOCUMENTS

| | | |
|---|---|---|
| 9,419,135 B2 | 8/2016 | Baenninger et al. |
| 9,455,267 B2 | 9/2016 | Zhang et al. |
| 9,589,981 B2 | 3/2017 | Nishikawa et al. |
| 9,646,981 B2 | 5/2017 | Nishikawa et al. |
| 9,698,223 B2 | 7/2017 | Sharangpani et al. |
| 9,799,671 B2 | 10/2017 | Pachamuthu et al. |
| 9,887,207 B2 | 2/2018 | Zhang et al. |
| 9,917,093 B2 | 3/2018 | Chu et al. |
| 10,103,161 B2 | 10/2018 | Ito et al. |
| 10,242,994 B2 | 3/2019 | Inomata et al. |
| 2011/0057250 A1 | 3/2011 | Higashi |
| 2015/0303214 A1* | 10/2015 | Kim .............. H01L 27/11575 257/329 |
| 2016/0049421 A1 | 2/2016 | Zhang et al. |
| 2016/0071872 A1* | 3/2016 | Saito .............. H01L 27/11573 257/314 |
| 2016/0079255 A1 | 3/2016 | Sonehara et al. |
| 2016/0086969 A1 | 3/2016 | Zhang et al. |
| 2016/0141419 A1 | 5/2016 | Baenninger et al. |
| 2016/0149002 A1 | 5/2016 | Sharangpani et al. |
| 2016/0268294 A1 | 9/2016 | Hashimoto et al. |
| 2016/0300848 A1 | 10/2016 | Pachamuthu et al. |
| 2016/0365351 A1 | 12/2016 | Nishikawa et al. |
| 2016/0365352 A1 | 12/2016 | Nishikawa et al. |
| 2017/0103995 A1* | 4/2017 | Hatano ............. H01L 27/11568 |
| 2017/0373078 A1 | 12/2017 | Chu et al. |
| 2017/0373087 A1 | 12/2017 | Ito et al. |
| 2018/0003049 A1 | 1/2018 | Inomata et al. |
| 2018/0047739 A1 | 2/2018 | Dorhout et al. |
| 2019/0006384 A1 | 1/2019 | Iwasaki et al. |
| 2019/0067310 A1 | 2/2019 | Matsuda |
| 2019/0363079 A1* | 11/2019 | Thei ................ H01L 23/585 |

OTHER PUBLICATIONS

Endoh et al., "Novel Ultra High Density Memory with a Stacked-Surrounding Gate Transistor (S-SGT) Structured Cell," IEDM Proc., (2001), 33-36.
U.S. Appl. No. 16/249,352, filed Jan. 16, 2019, SanDisk Technologies LLC.
U.S. Appl. No. 16/251,782, filed Jan. 18, 2019, SanDisk Technologies LLC.
U.S. Appl. No. 16/367,455, filed Mar. 28, 2019, SanDisk Technologies LLC.
U.S. Appl. No. 16/516,726, filed Jul. 19, 2019, SanDisk Technologies LLC.
U.S. Appl. No. 16/552,089, filed Aug. 27, 2019, SanDisk Technologies LLC.
U.S. Appl. No. 16/594,892, filed Oct. 7, 2019, SanDisk Technologies LLC.
USPTO Office Communication, Non-Final Office Action for U.S. Appl. No. 16/594,892, dated Mar. 9, 2021, 33 pages.

\* cited by examiner

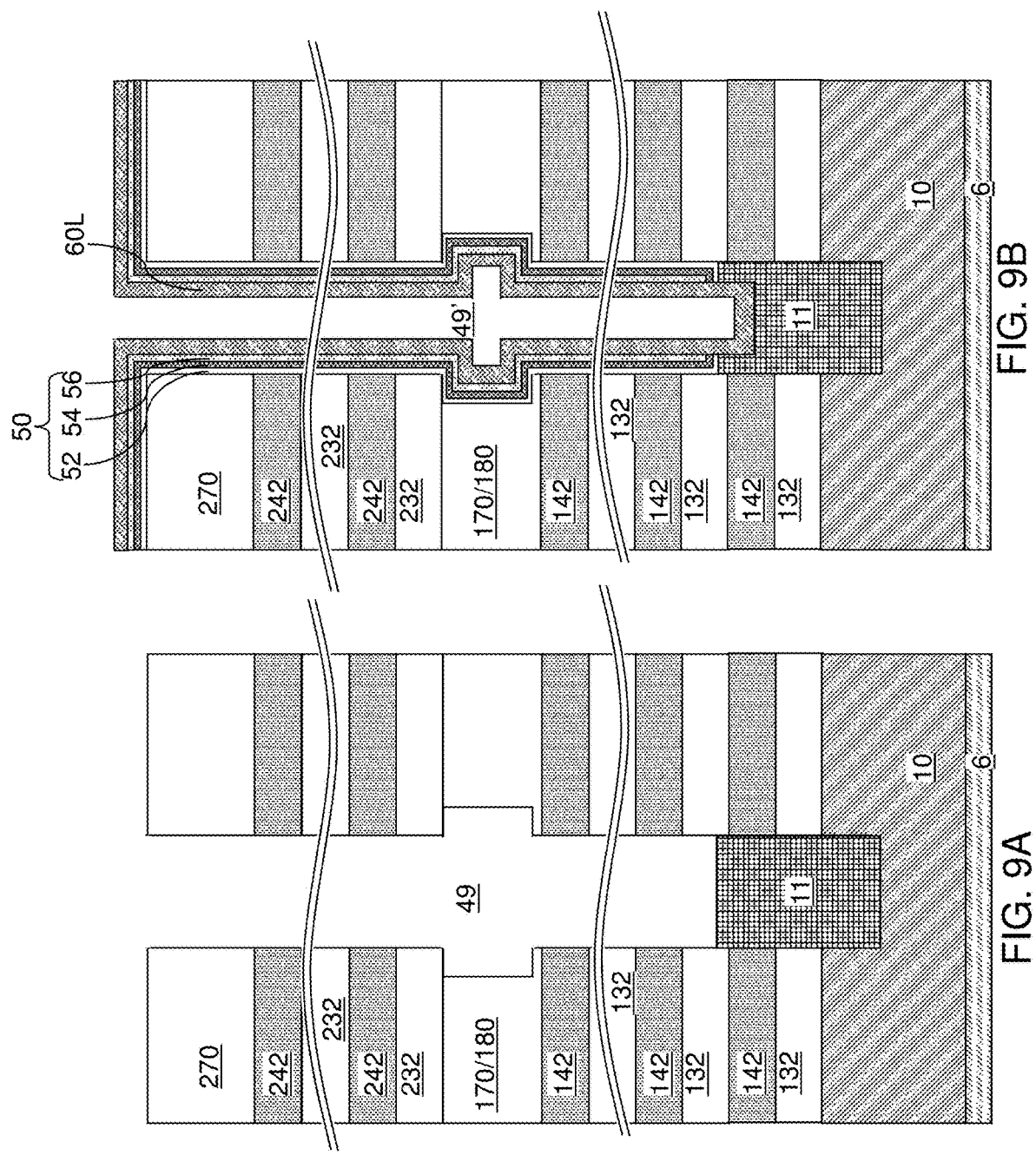

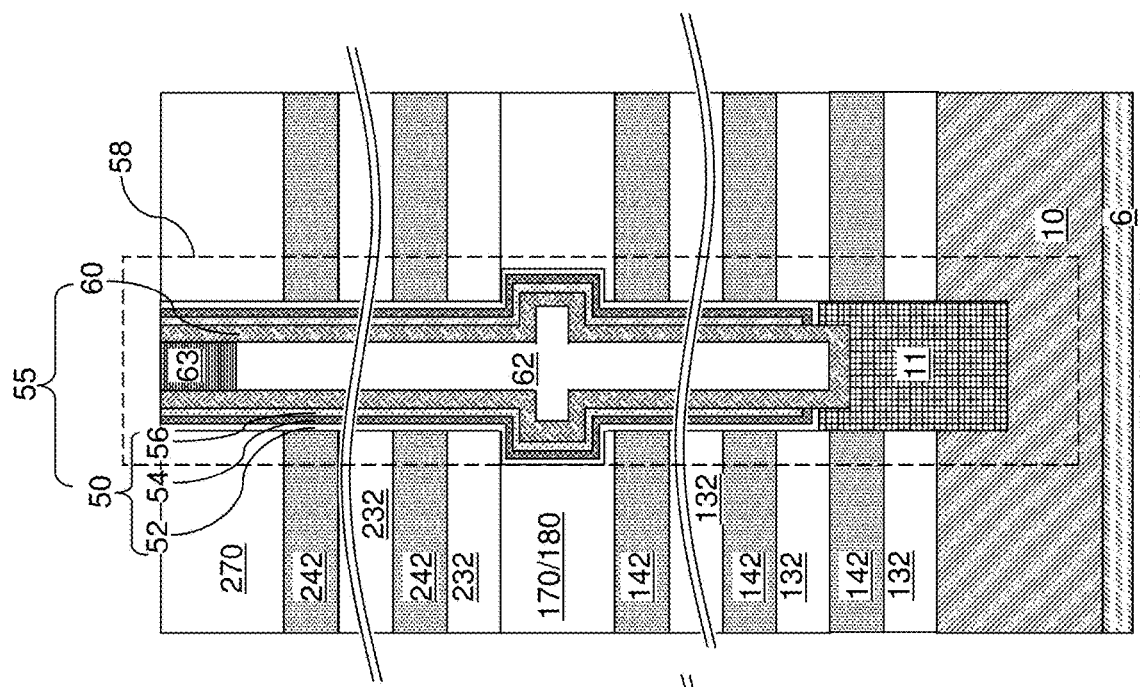
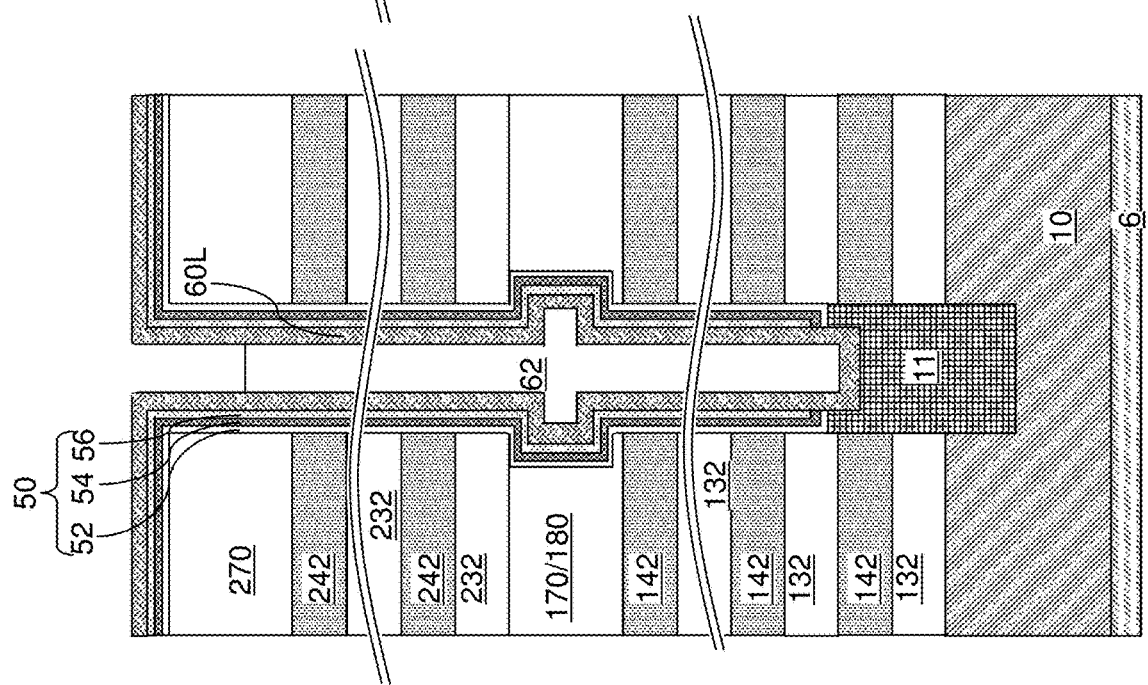

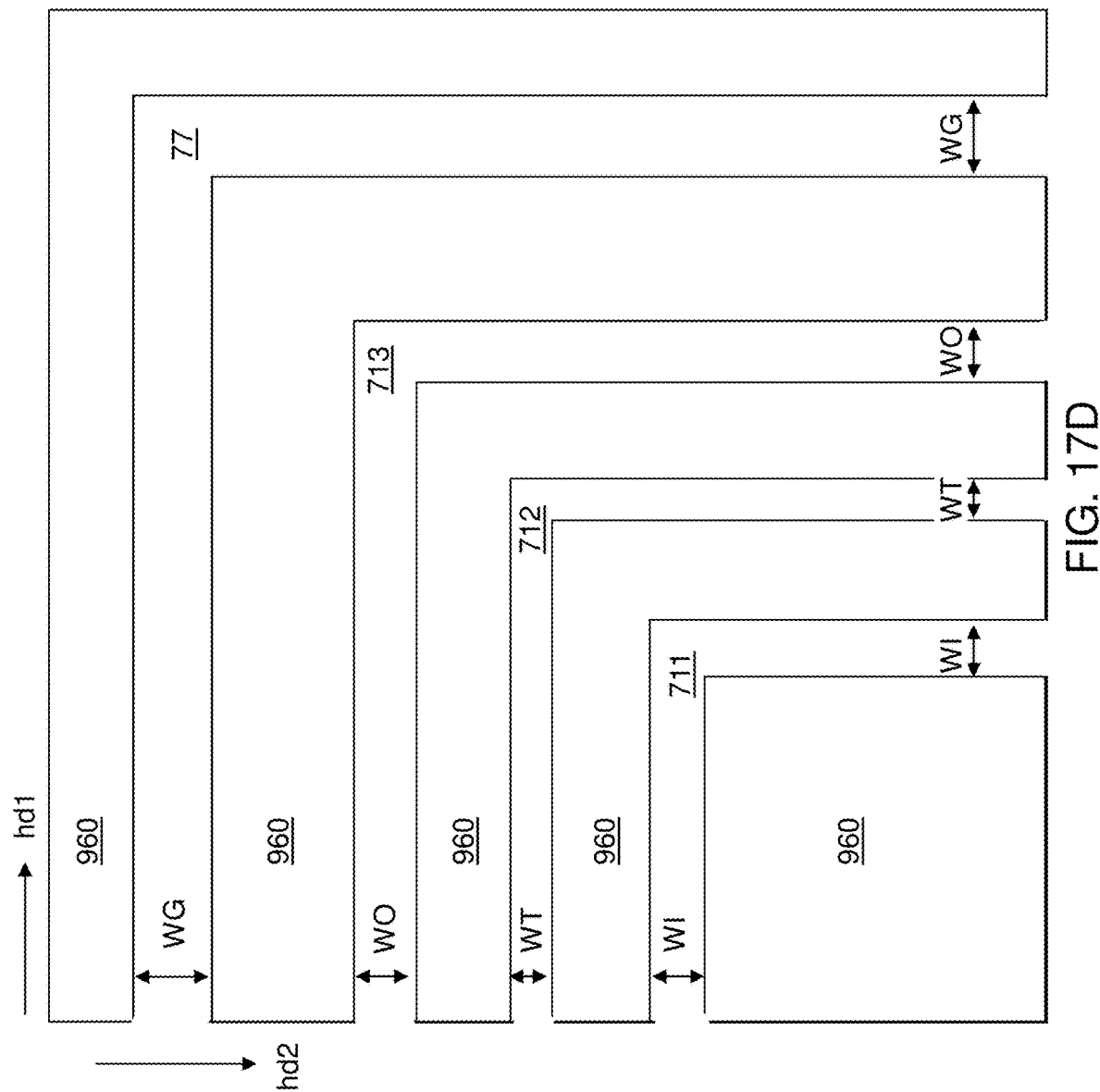

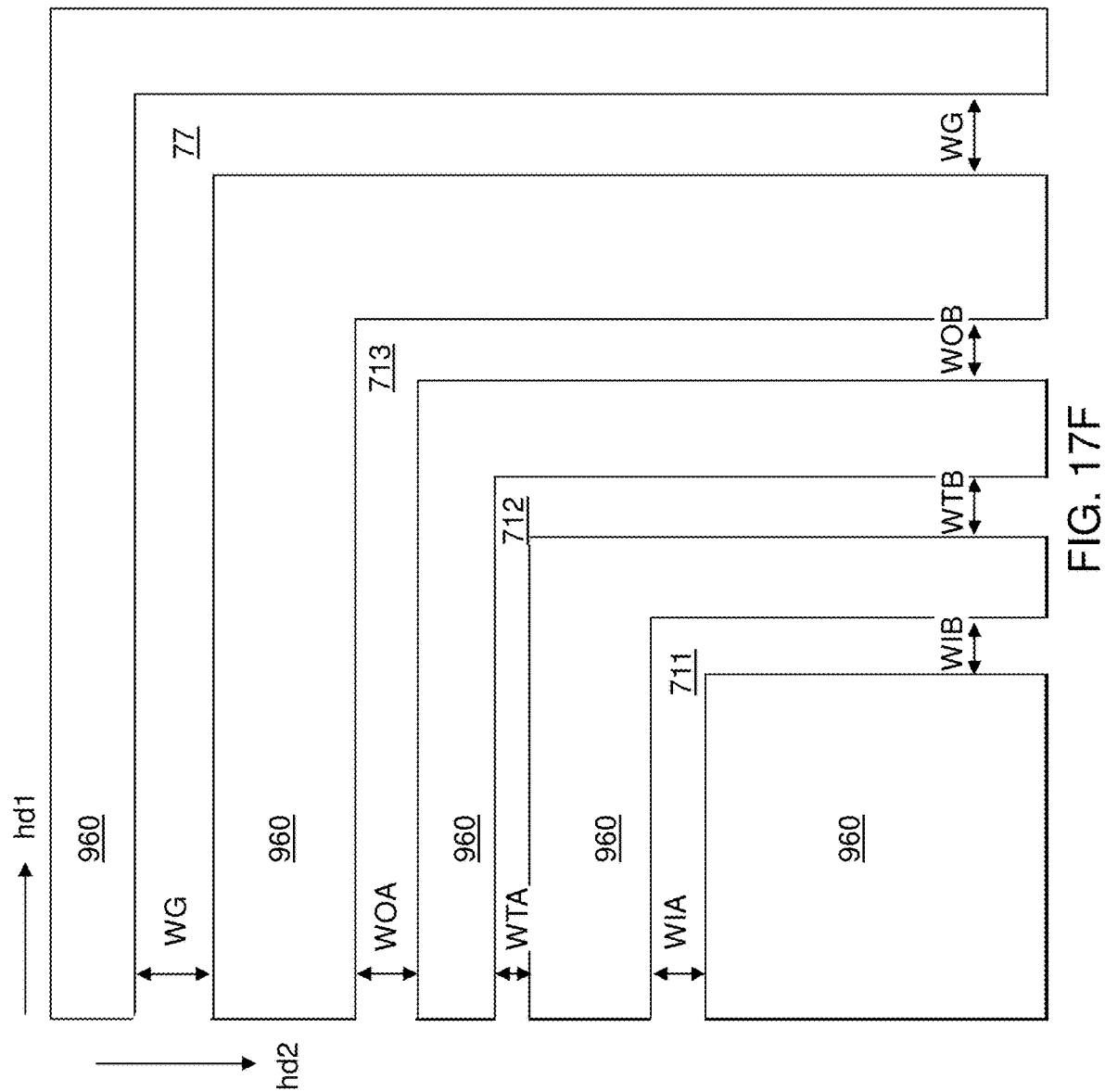

THREE-DIMENSIONAL MEMORY DIE CONTAINING STRESS-COMPENSATING SLIT TRENCH STRUCTURES AND METHODS FOR MAKING THE SAME

FIELD

The present disclosure relates generally to the field of semiconductor devices, and particularly to three-dimensional memory dies including a stress-absorbing seal ring structure and methods for forming the same.

BACKGROUND

A three-dimensional memory device including three-dimensional vertical NAND strings having one bit per cell is disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an embodiment of the present disclosure, a semiconductor die includes a plurality of alternating stacks of insulating layers and electrically conductive layers that are located over a substrate and that laterally extend along a first horizontal direction and that are laterally spaced apart along a second horizontal direction which is perpendicular to the first horizontal direction, a plurality of sets of memory stack structures extending through the plurality of alternating stacks, and a plurality of nested seal ring structures which include a first seal ring structure comprising having a first seal ring width between an inner sidewall and an outer sidewall thereof, and a second seal ring structure having a second seal ring width between an inner sidewall and an outer sidewall thereof, such that the first seal ring width is less than the second seal ring width.

According to another embodiment of the present disclosure, a method of forming a semiconductor structure is provided, which comprises the steps of: forming a vertically alternating sequence of continuous insulating layers and continuous sacrificial material layers over a substrate; forming a plurality of sets of memory stack structures extending through a respective region of the vertically alternating sequence; dividing the vertically alternating sequence into a plurality of alternating stacks of insulating layers and sacrificial material layers by forming backside trenches that laterally extend along a first horizontal direction through the vertically alternating sequence; replacing the sacrificial material layers with electrically conductive layers employing the backside trenches as a conduit for an etchant that etches the sacrificial material layers and for a reactant that deposits a conductive material of the electrically conductive layers; forming dielectric material portions over the insulating layers and the electrically conductive layers; and forming a plurality of nested seal ring structures extending from a topmost surface of the dielectric material portions to the substrate and laterally surrounding, and enclosing, the alternating stacks and an inner region of the dielectric material portions, wherein the plurality of nested seal ring structures comprises a first seal ring structure having a first seal ring width between an inner sidewall and an outer sidewall thereof; and a second seal ring structure laterally enclosing, or laterally enclosed by, the first seal ring structure, and having a second seal ring width between an inner sidewall and an outer sidewall thereof, wherein the first seal ring width is less than the second seal ring width.

BRIEF DESCRIPTION OF THE DRAWINGS

FIGS. 9A-9D illustrate sequential vertical cross-sectional views of a memory opening during formation of a memory opening fill structure according to an embodiment of the present disclosure.

11A. The hinged vertical plane A-A' corresponds to the plane of the vertical cross-sectional view of FIG. 11A.

Figure 11A:
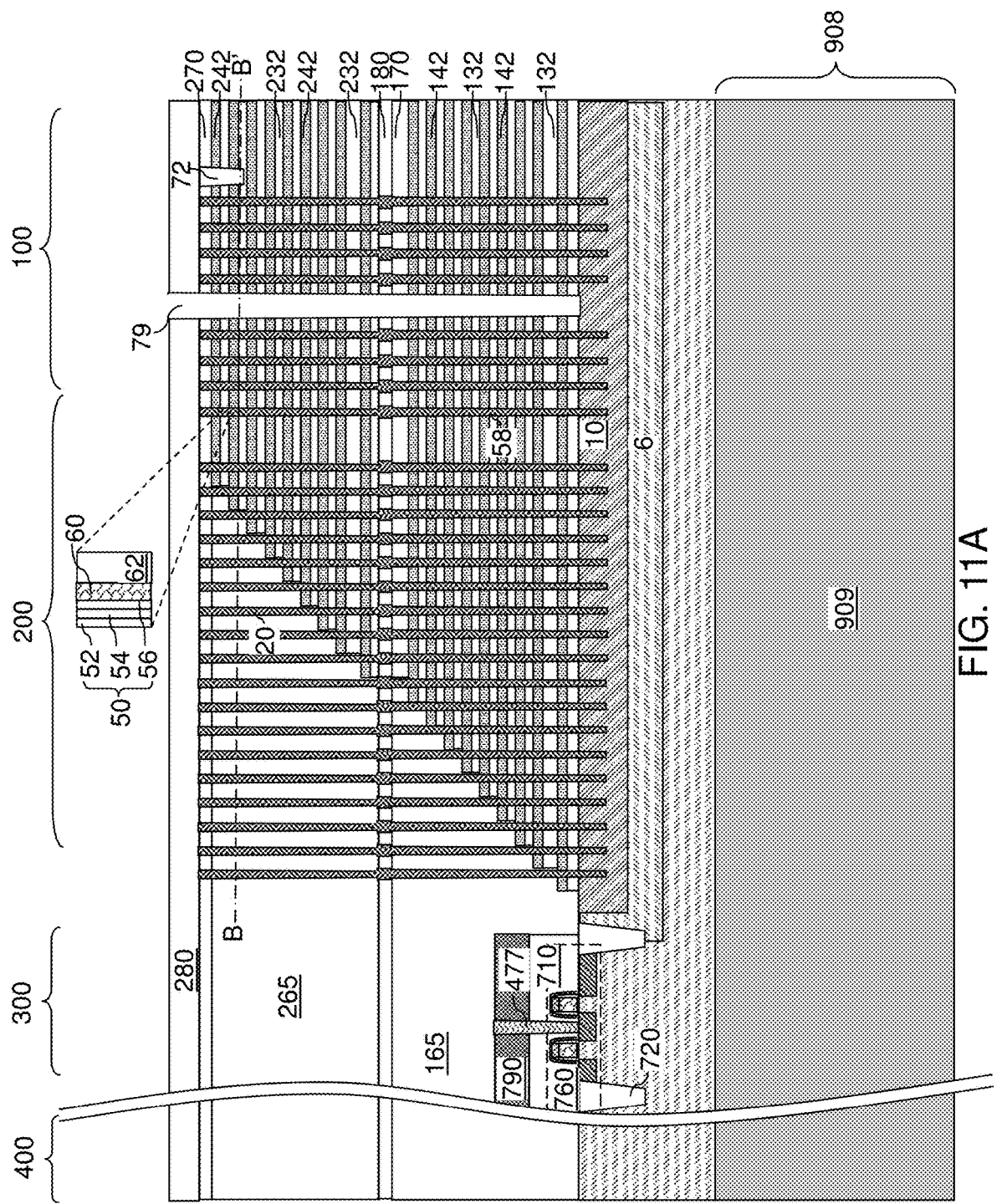
FIG. 11A is a vertical cross-sectional view of a region of the exemplary structure after formation of a first contact-level dielectric layer and backside trenches according to an embodiment of the present disclosure.
Figure 11B:
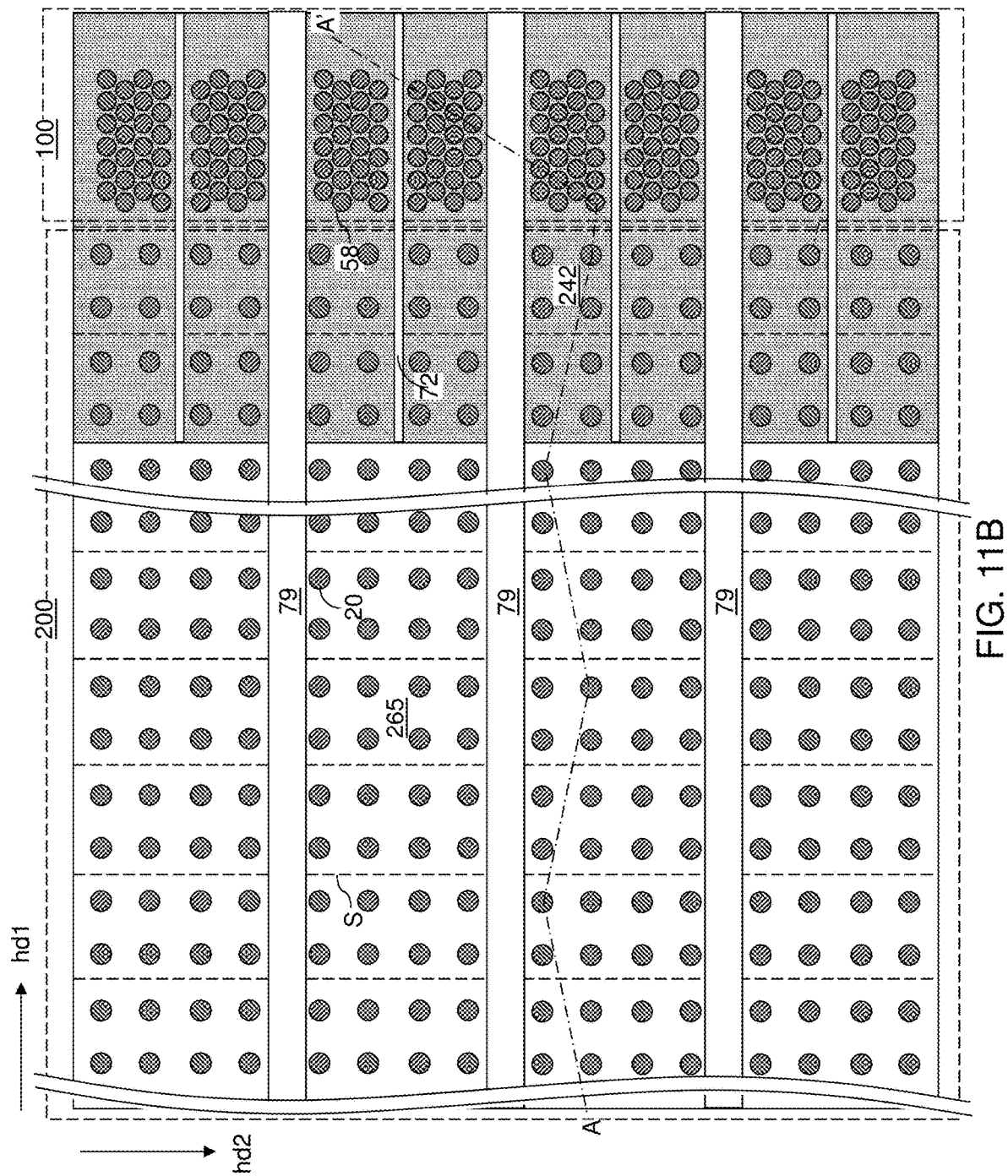
FIG. 11B is a horizontal cross-sectional of a region of the exemplary structure along the horizontal plane B-B' of FIG.
Figure 11C:
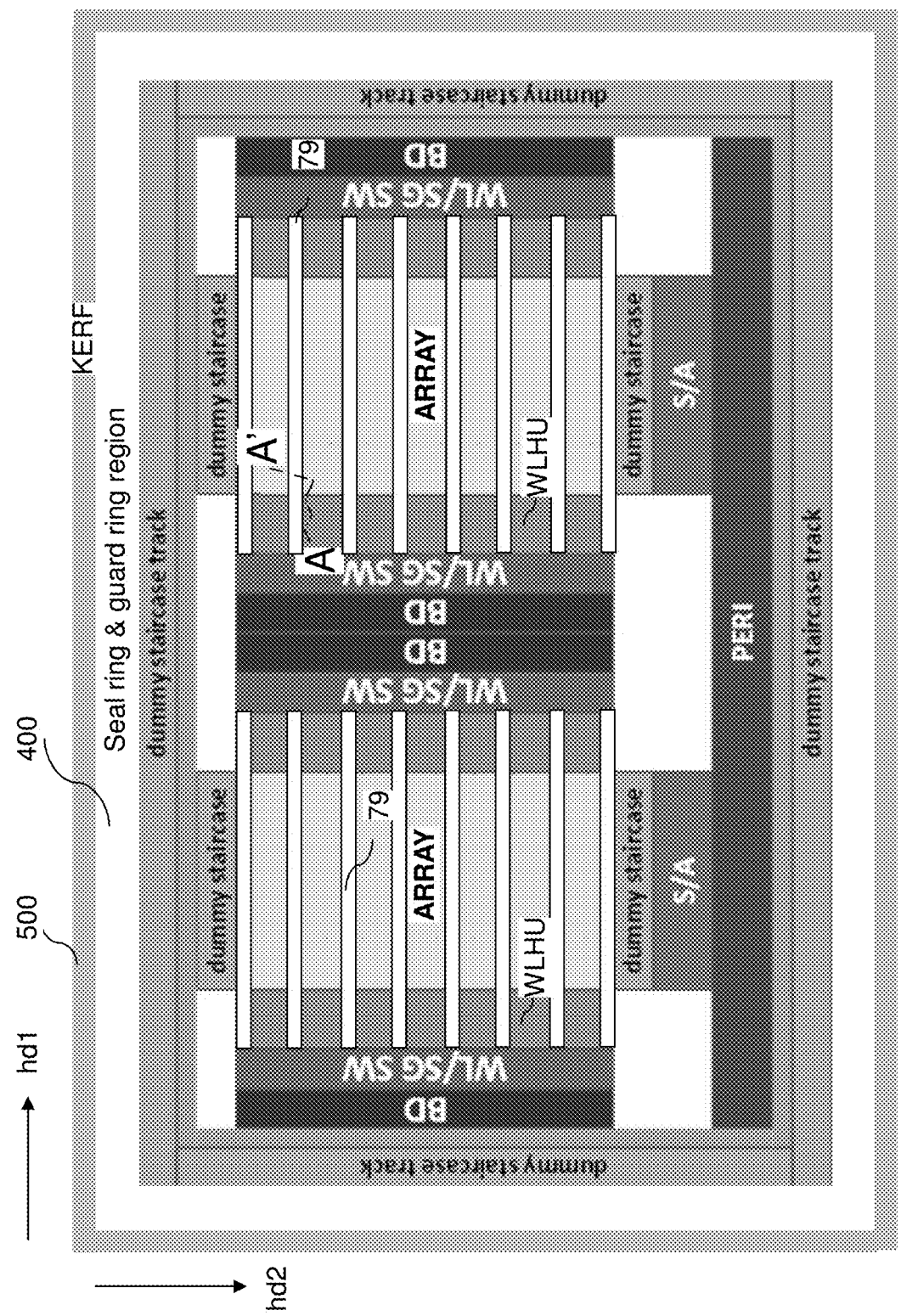

FIG. 11C is a top-down view of a unit die area of the exemplary structure of FIGS. 11A and 11B. The hinged vertical plane A-A' corresponds to the plane of the vertical cross-sectional view of FIG. 11A.

Figure 12:
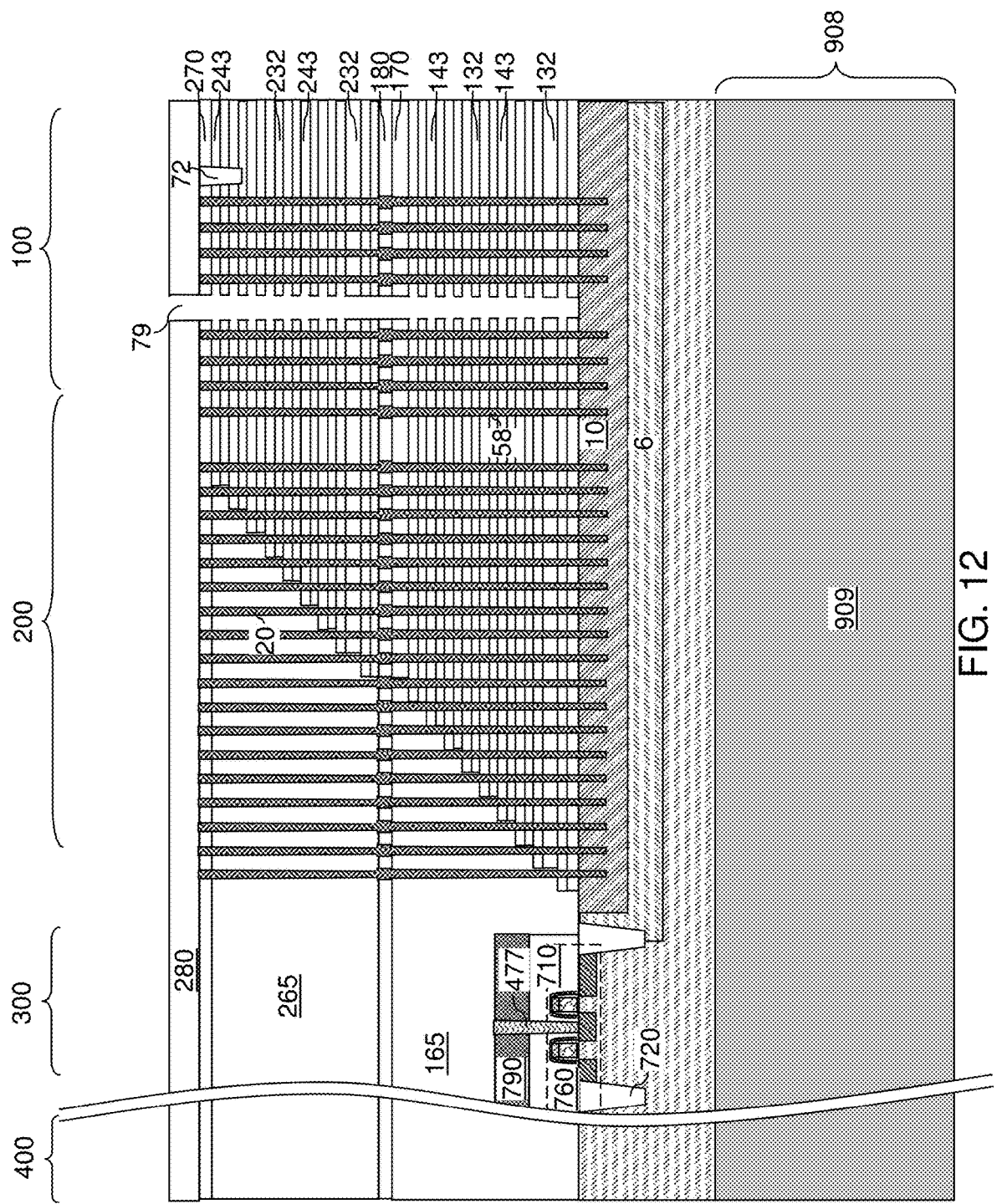

FIG. 12 is a vertical cross-sectional view of a region of the exemplary structure after formation of backside recesses according to an embodiment of the present disclosure.

Figure 13A:
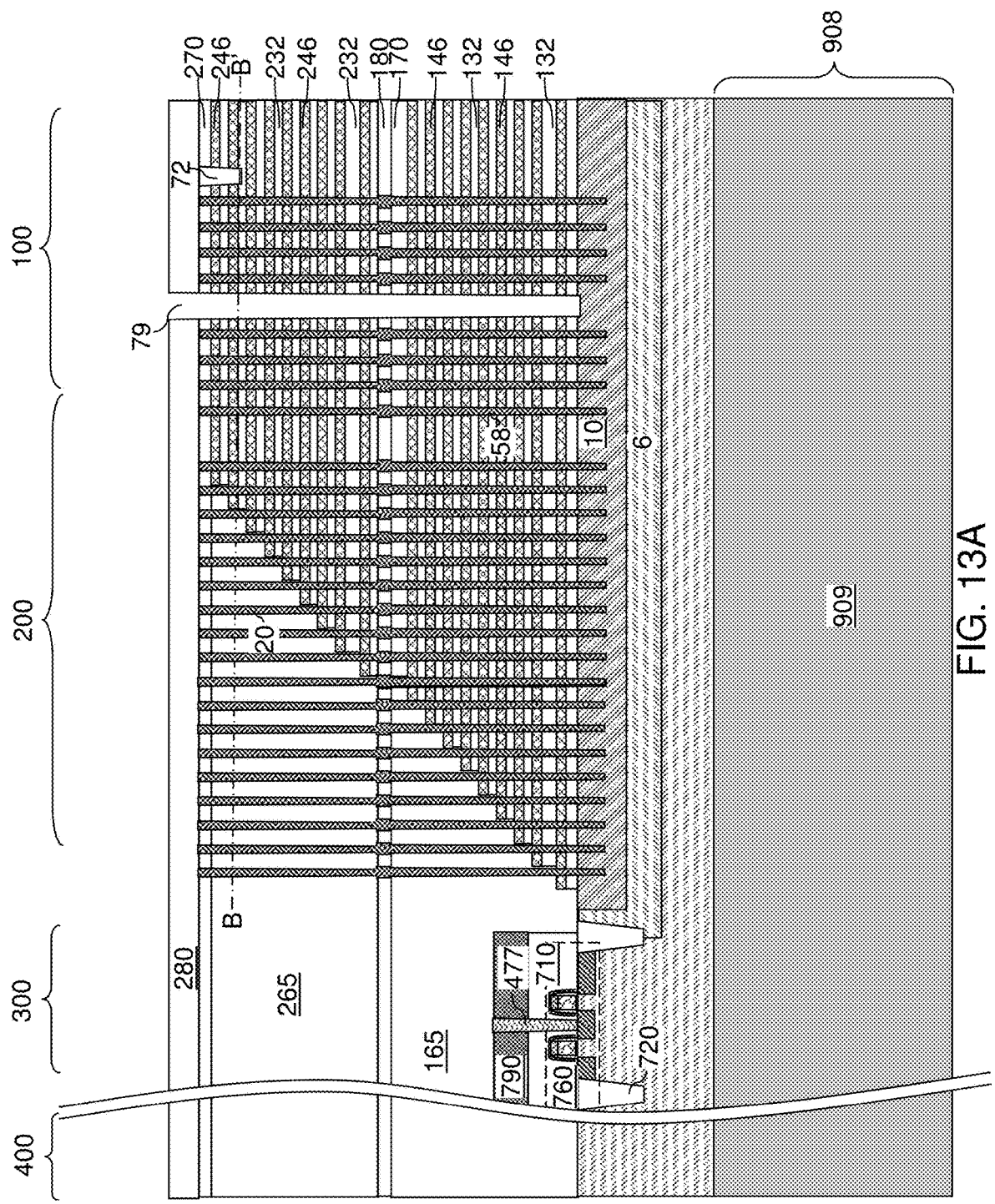

FIG. 13A is a vertical cross-sectional view of a region of the exemplary structure after formation of electrically conductive layers according to an embodiment of the present disclosure.

Figure 13B:
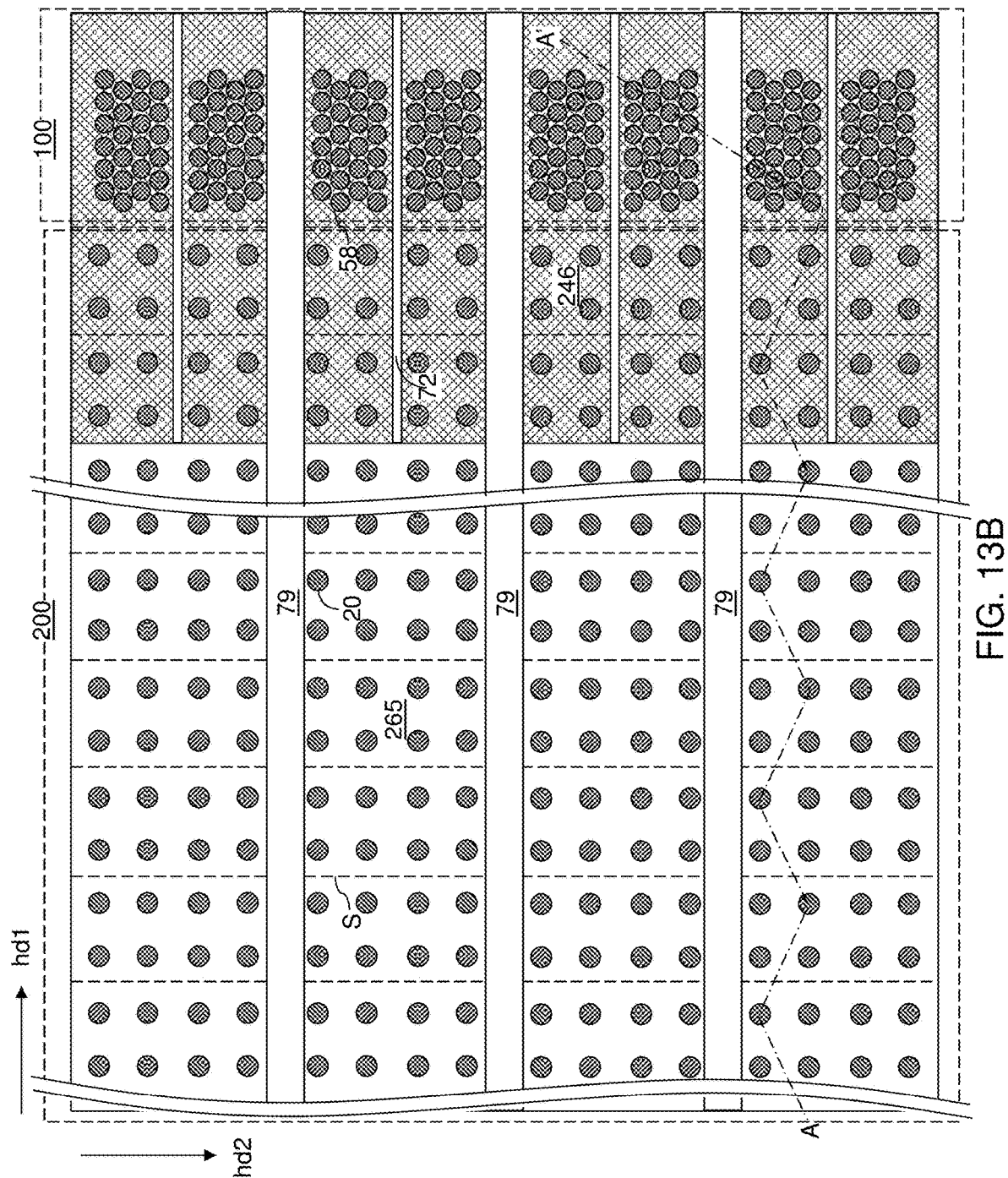

FIG. 13B is a horizontal cross-sectional of a region of the exemplary structure along the horizontal plane B-B' of FIG. 13A. The hinged vertical plane A-A' corresponds to the plane of the vertical cross-sectional view of FIG. 13A.

Figure 14A:
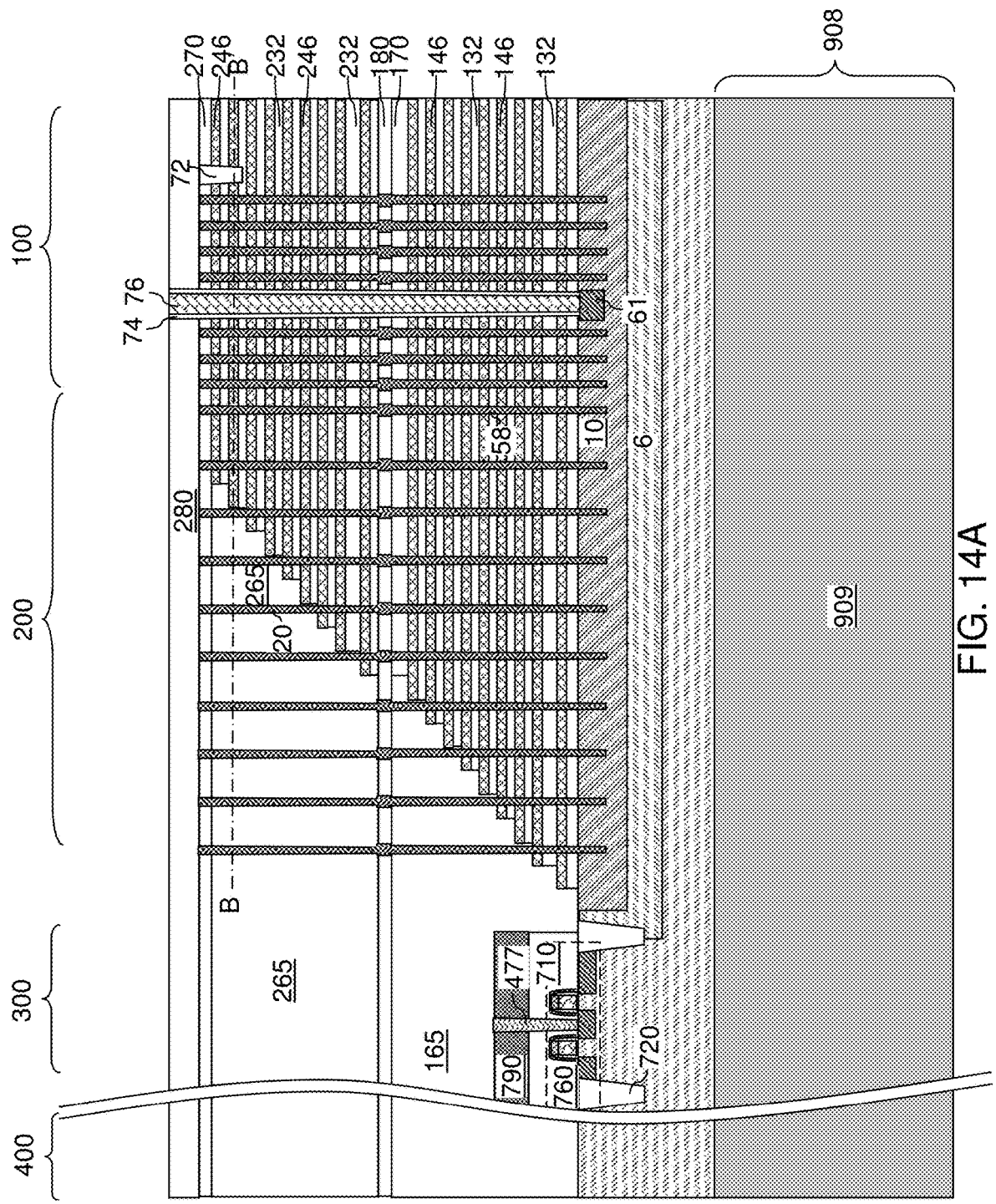

FIG. 14A is a vertical cross-sectional view of a region of the exemplary structure after formation of backside trench fill structures and slit trench fill structures according to an embodiment of the present disclosure.

Figure 14B:
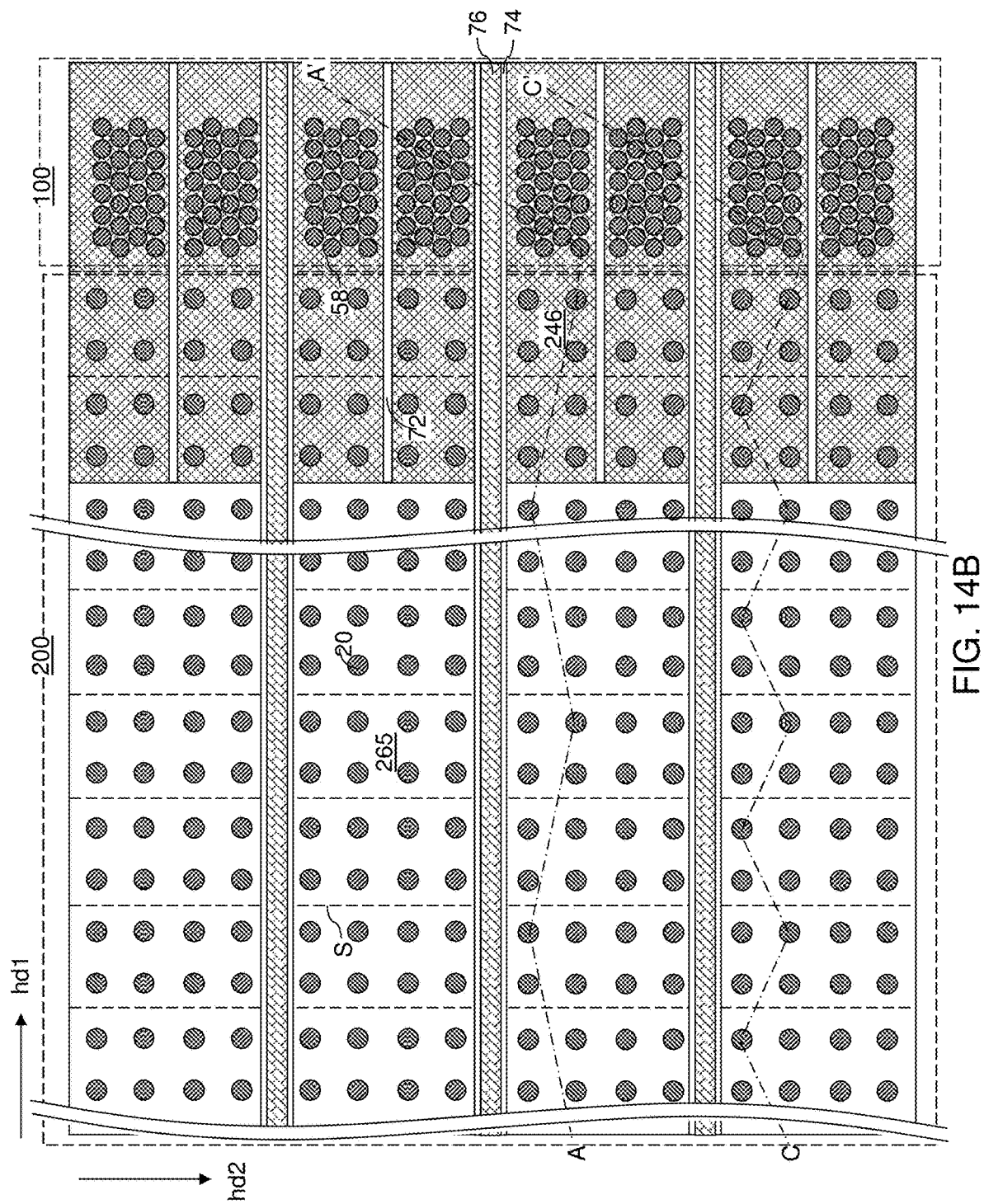

FIG. 14B is a horizontal cross-sectional view of a region of the exemplary structure along the horizontal plane B-B' of FIG. 14A. The hinged vertical plane A-A' corresponds to the plane of the vertical cross-sectional view of FIG. 14A.

Figure 14C:
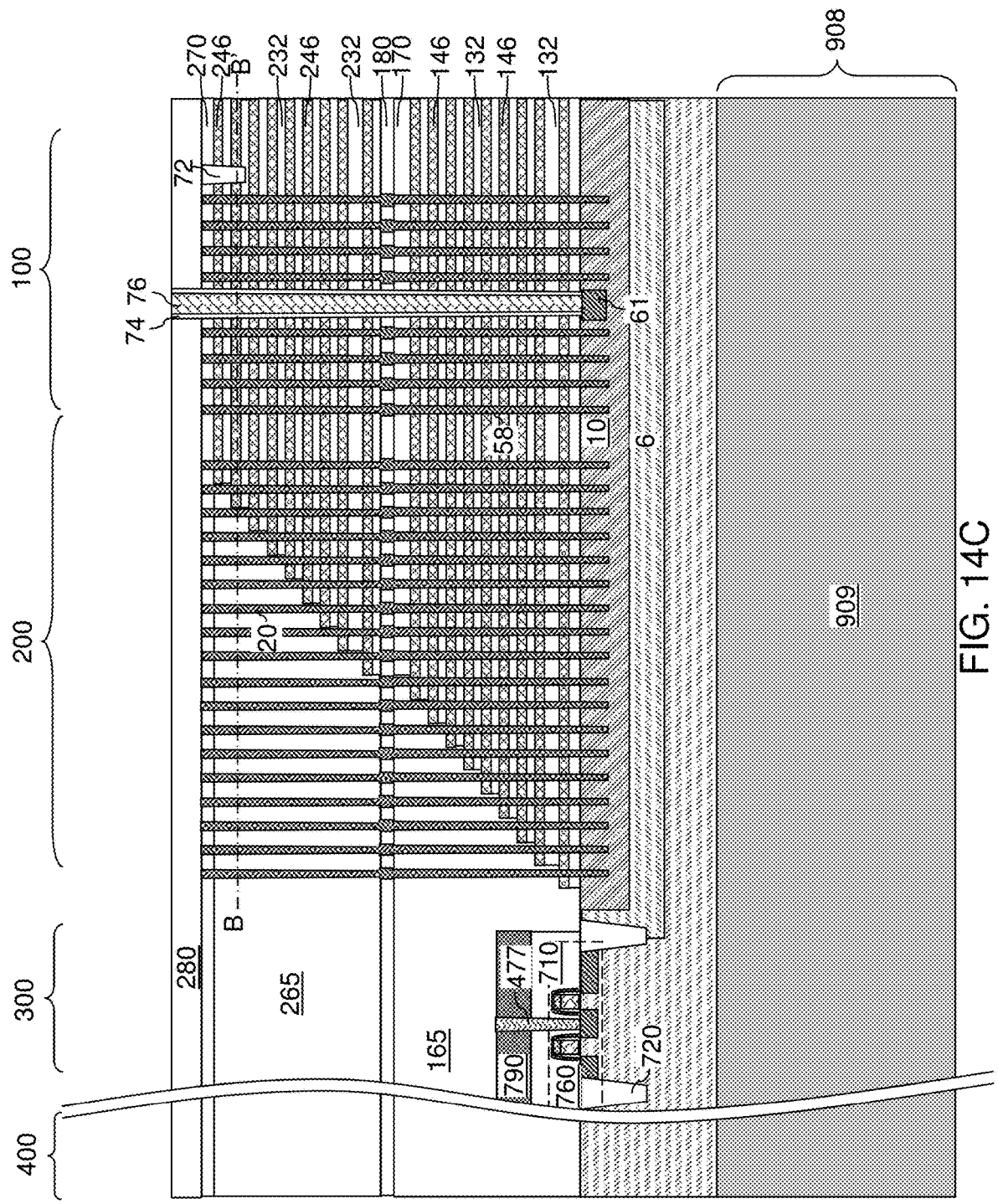

FIG. 14C is a vertical cross-sectional view of the exemplary structure along the vertical plane C-C' of FIG. 14B.

Figure 14D:
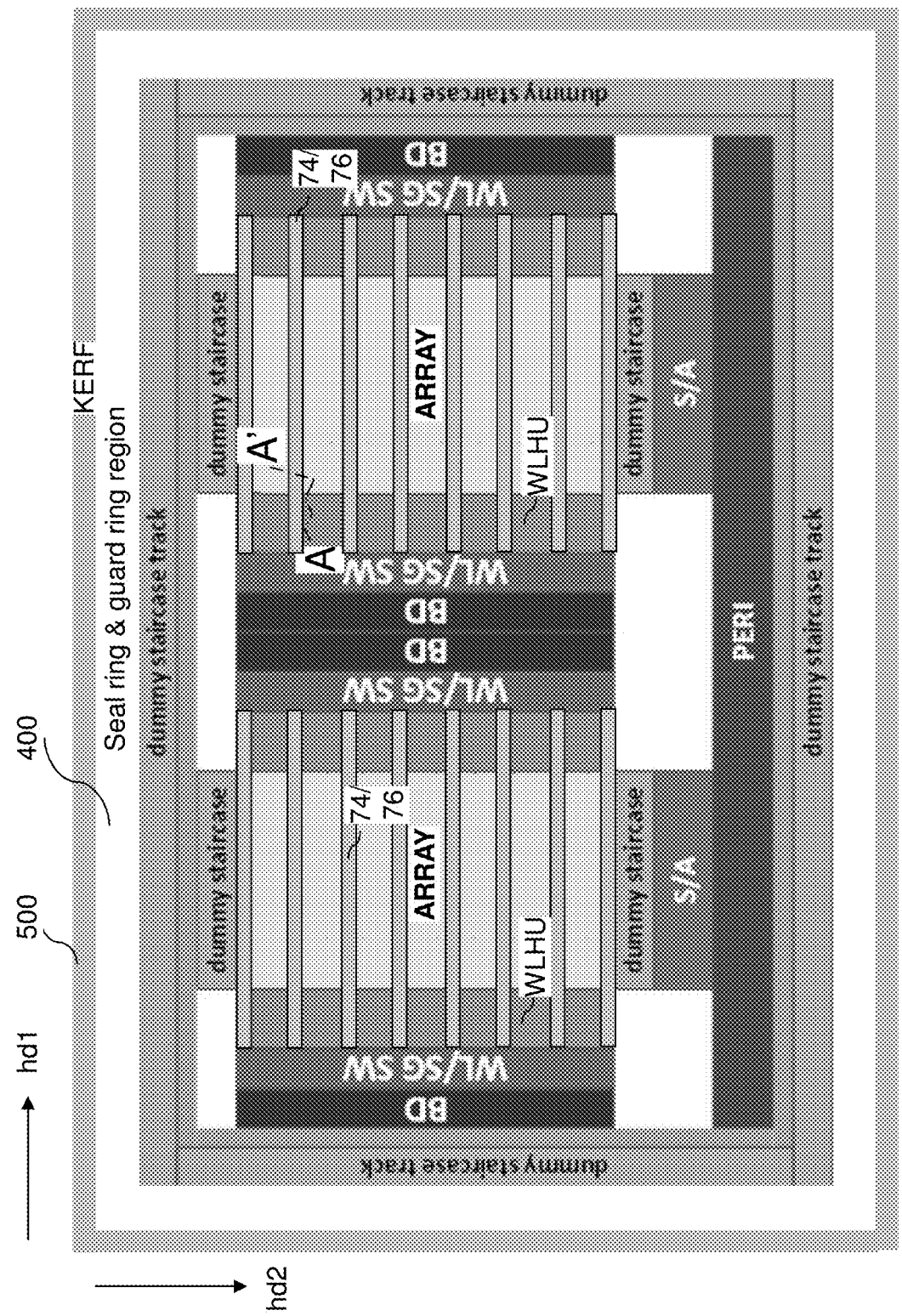

FIG. 14D is a top-down view of a unit die area of the exemplary structure of FIGS. 14A-14C.

Figure 15:
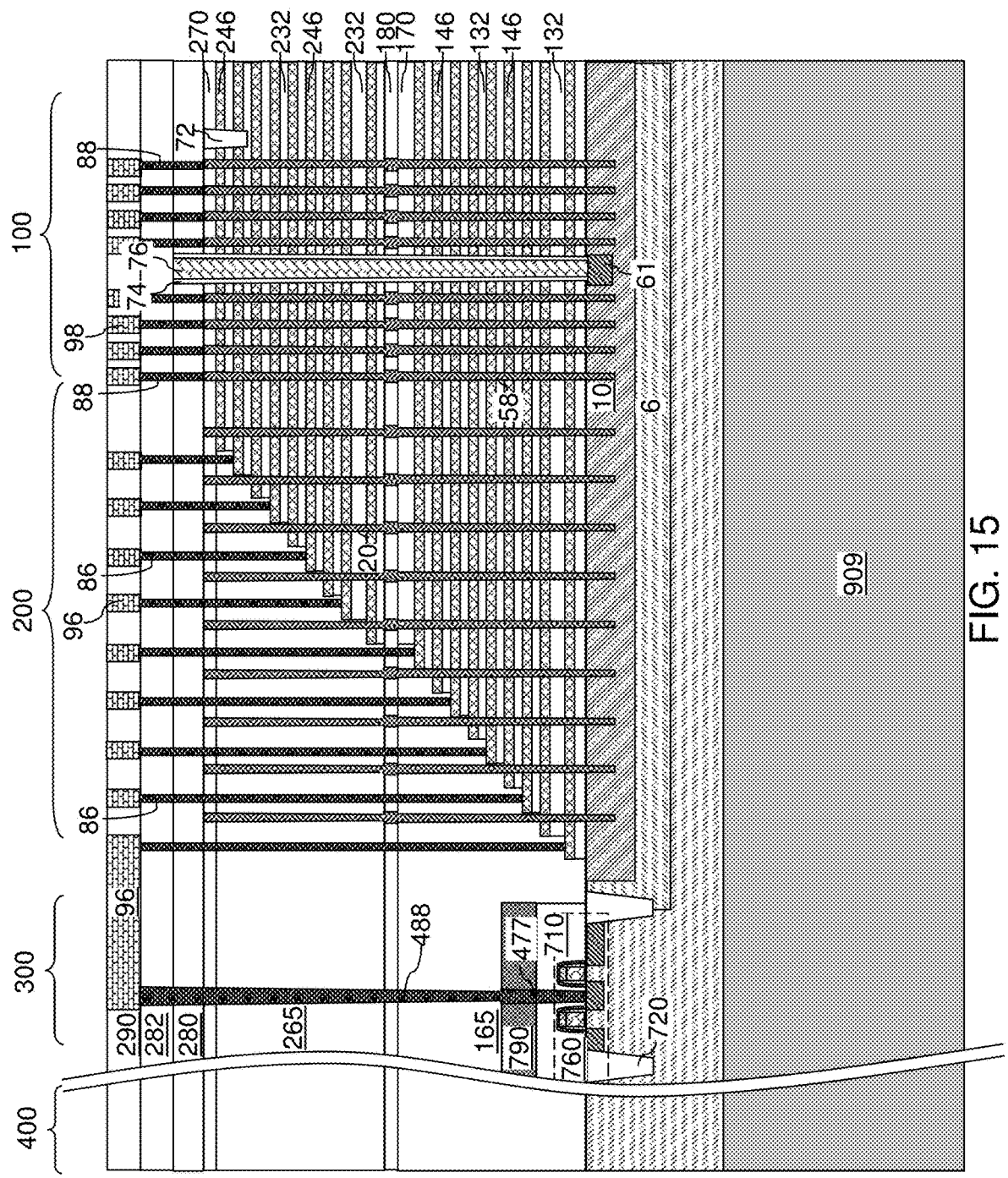

FIG. 15 is a vertical cross-sectional view of a region of the exemplary structure after formation of through-memory-level contact via structures, a bit-line-level dielectric layer, and bit-line-level metal interconnect structures according to an embodiment of the present disclosure.

Figure 16:
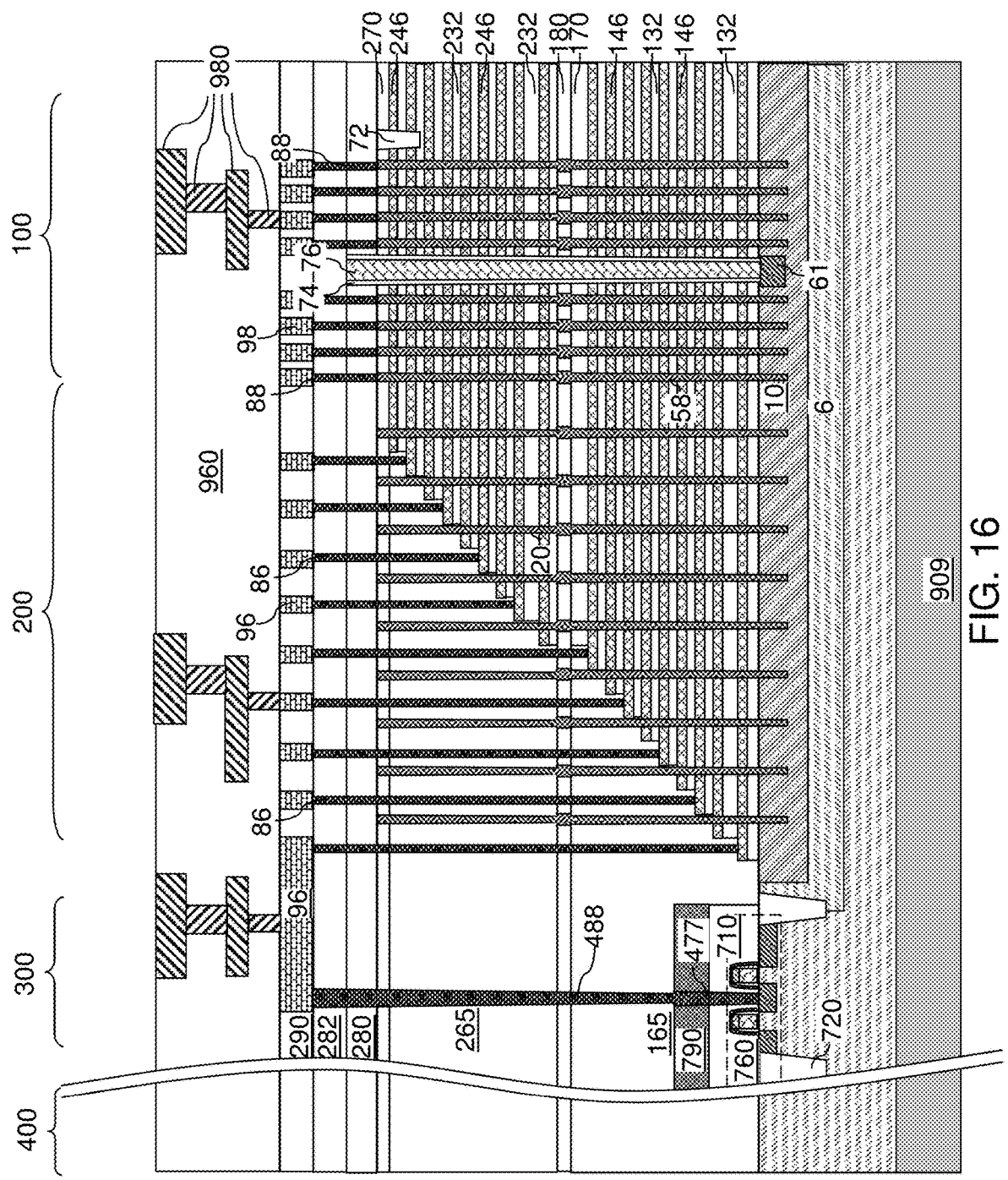

FIG. 16 is a vertical cross-sectional view of a region of the exemplary structure after formation of upper dielectric material layers and upper metal interconnect structures according to an embodiment of the present disclosure.

Figure 17A:
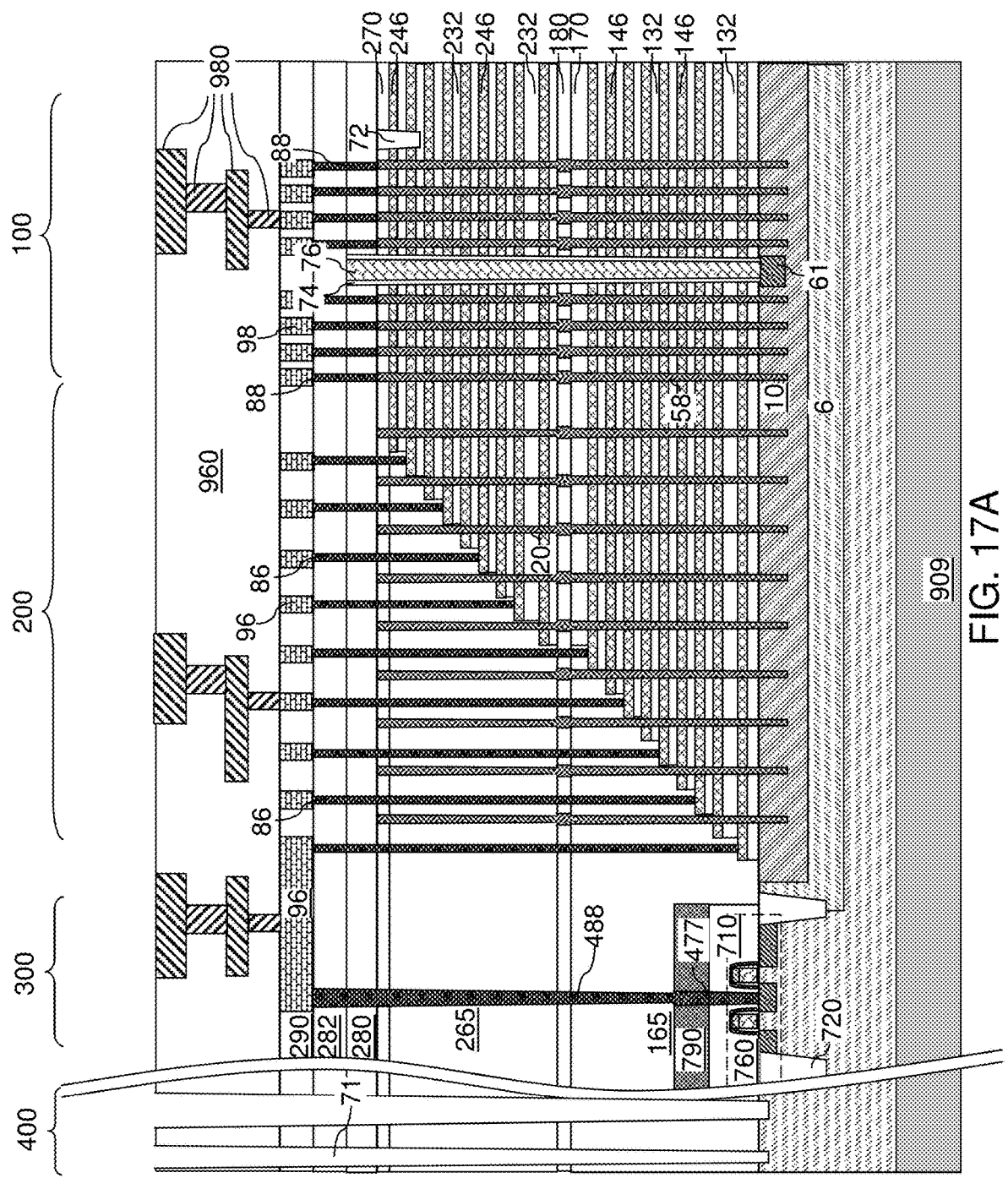

FIG. 17A is a first vertical cross-sectional view of a region of the exemplary structure after formation of seal ring cavities according to an embodiment of the present disclosure.

Figure 17B:
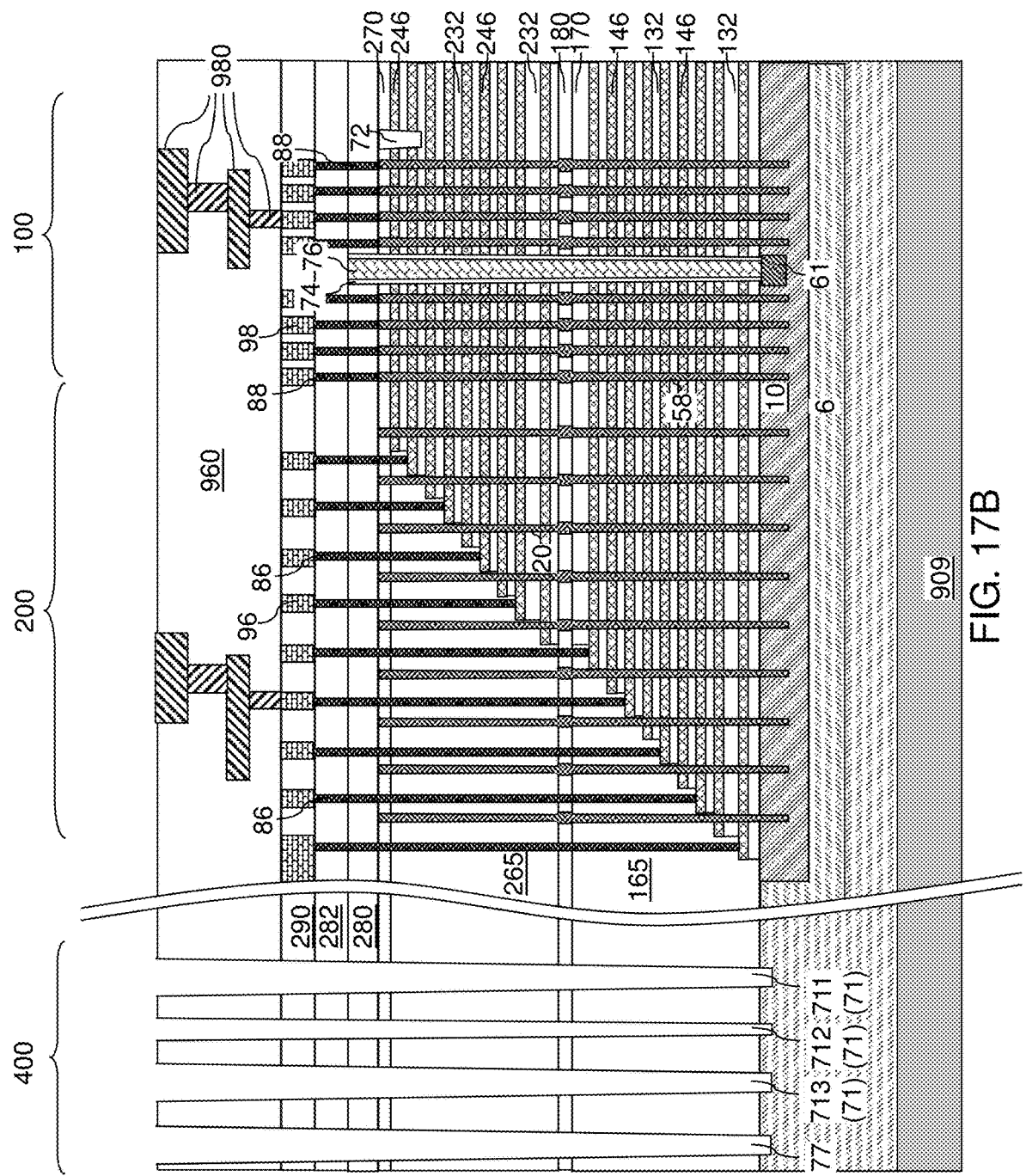

FIG. 17B is a second vertical cross-sectional view of a region of the exemplary structure after formation of seal ring cavities according to an embodiment of the present disclosure.

Figure 17C:
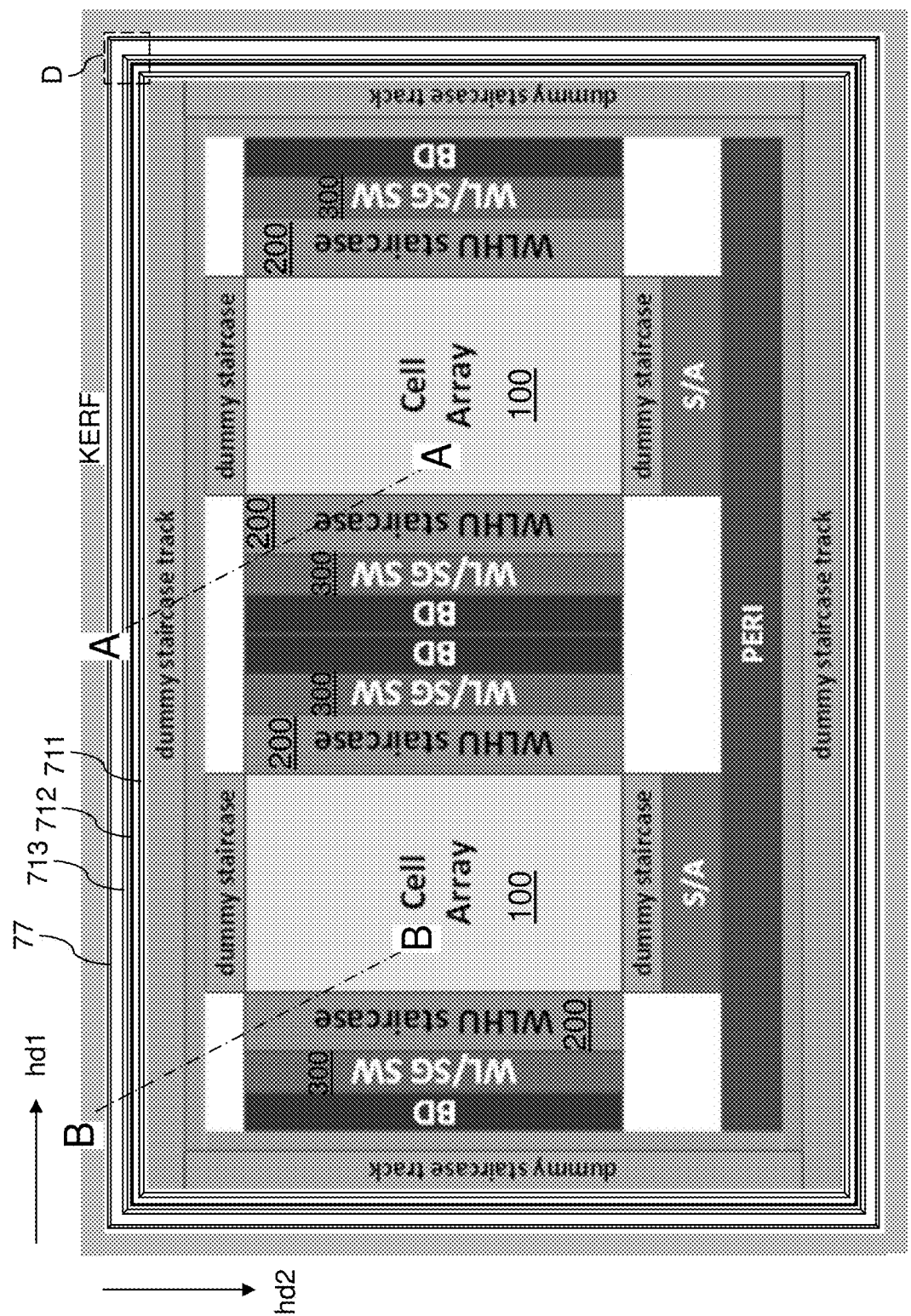

FIG. 17C is a top-down view of a unit die area of the exemplary structure after formation of seal ring cavities according to an embodiment of the present disclosure. The vertical planes A-A and B-B correspond to the planes of the vertical cross-sectional view of FIGS. 14A and 14B, respectively.

FIG. 17D is a magnified view of region D of FIG. 17C.

Figure 17E:
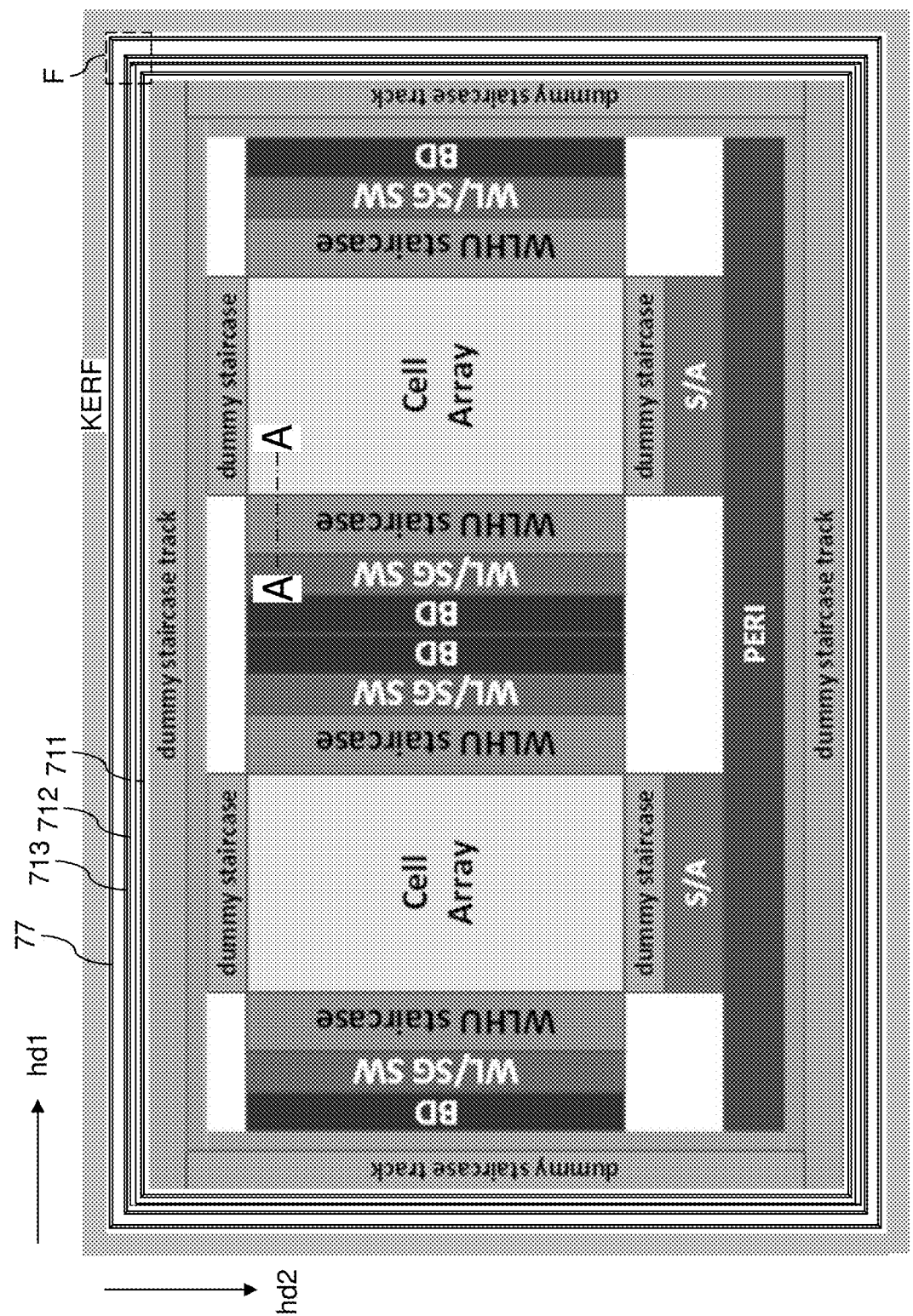

FIG. 17E is a top-down view of a unit die area of an alternative configuration of the exemplary structure after formation of seal ring cavities according to an embodiment of the present disclosure.

FIG. 17F is a magnified view of region F of FIG. 17D.

Figure 18A:
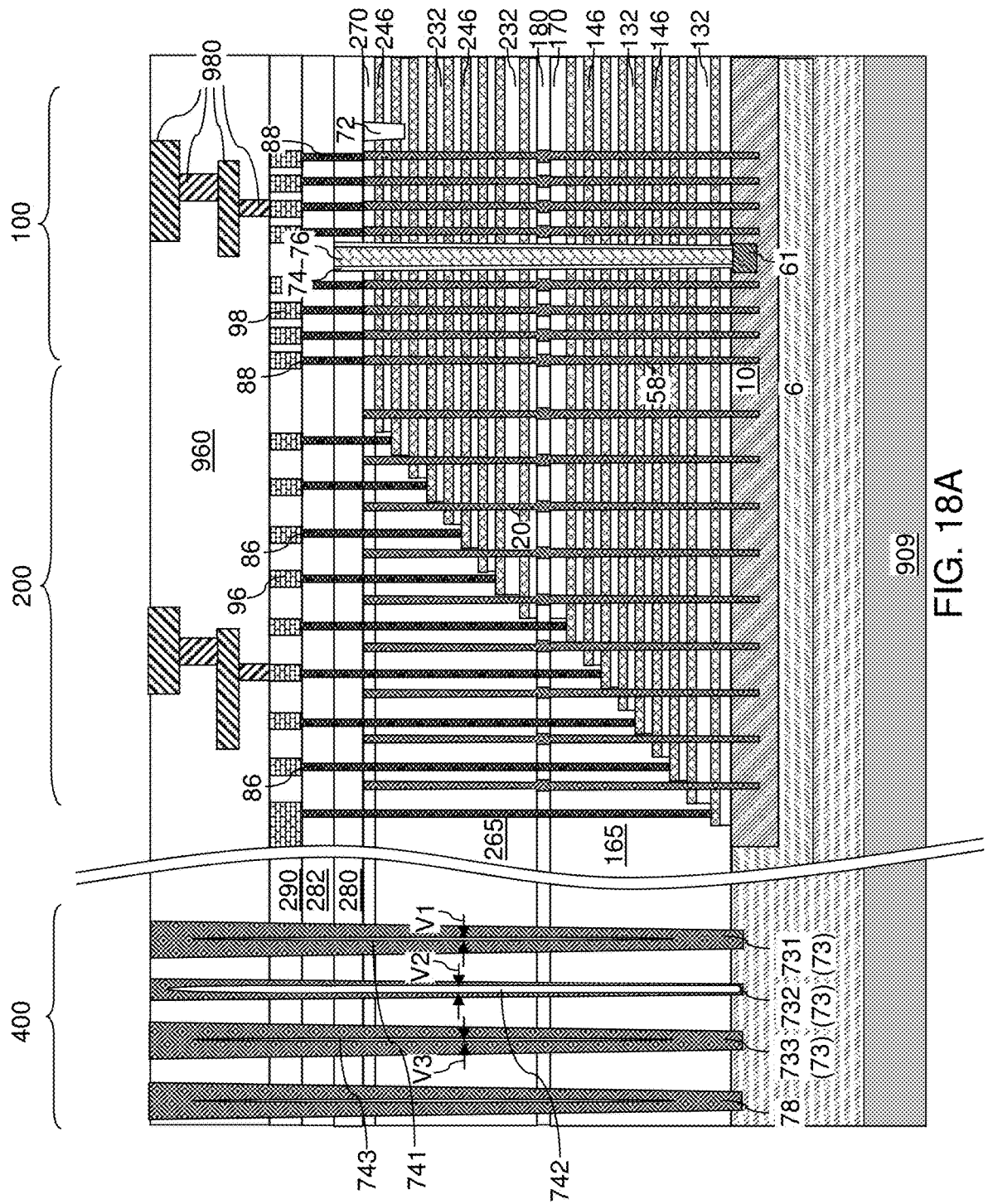

FIG. 18A is a vertical cross-sectional view of a region of the exemplary structure after formation of seal ring structures according to an embodiment of the present disclosure.

Figure 18B:
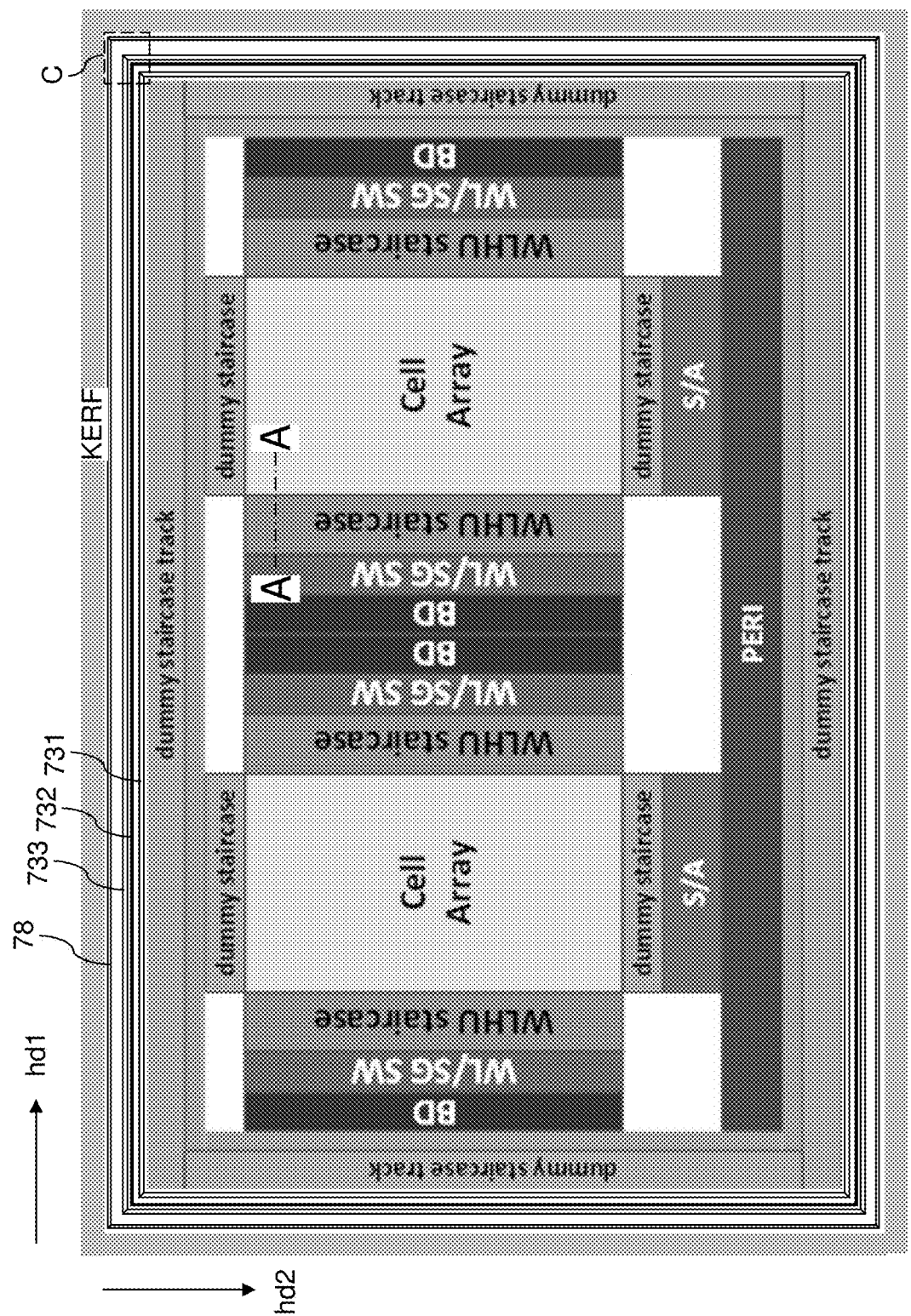

FIG. 18B is a top-down view of a unit die area of the exemplary structure after formation of seal ring structures according to an embodiment of the present disclosure.

Figure 18C:
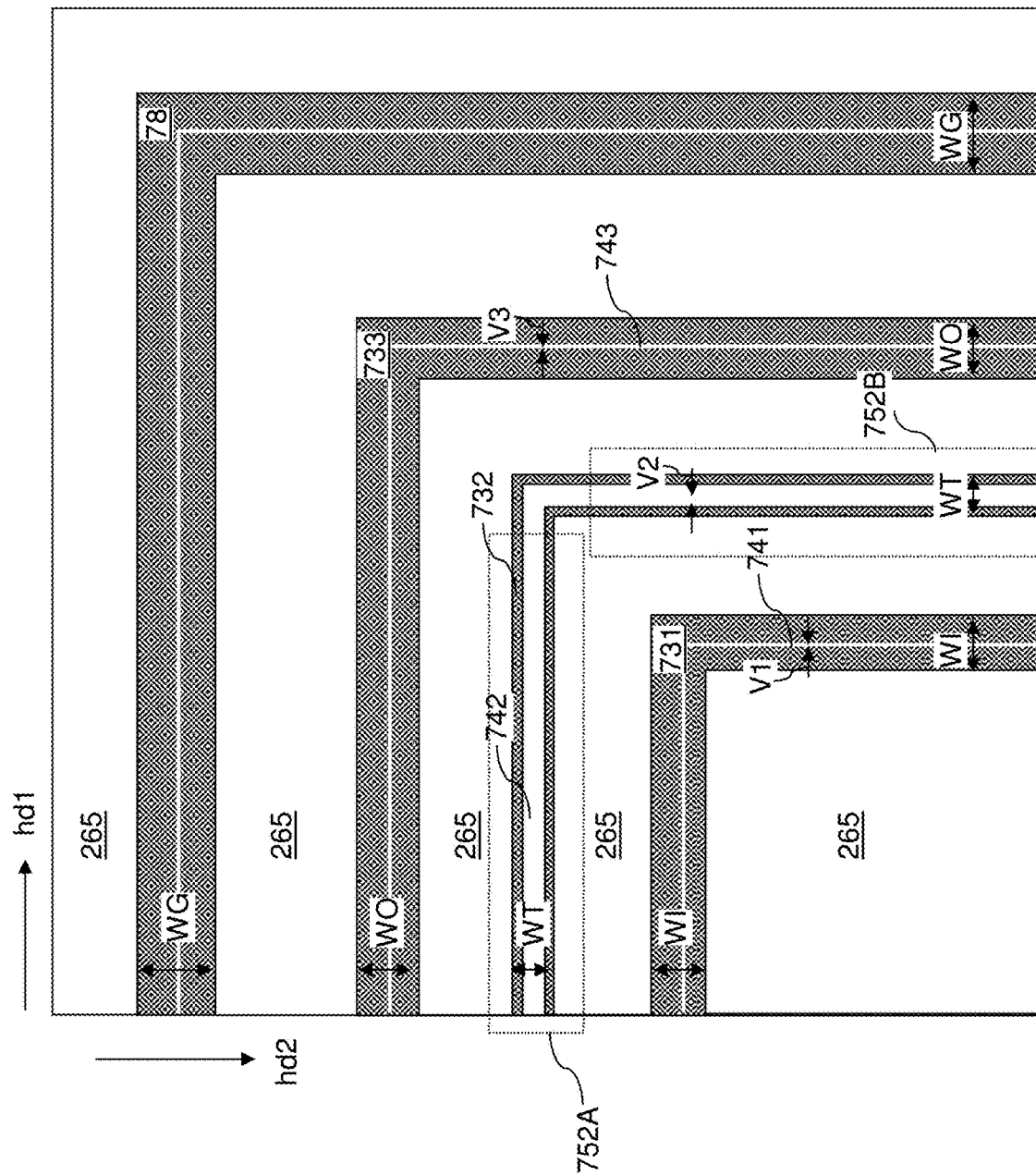

FIG. 18C is a magnified view of region C of FIG. 18B.

Figure 18D:
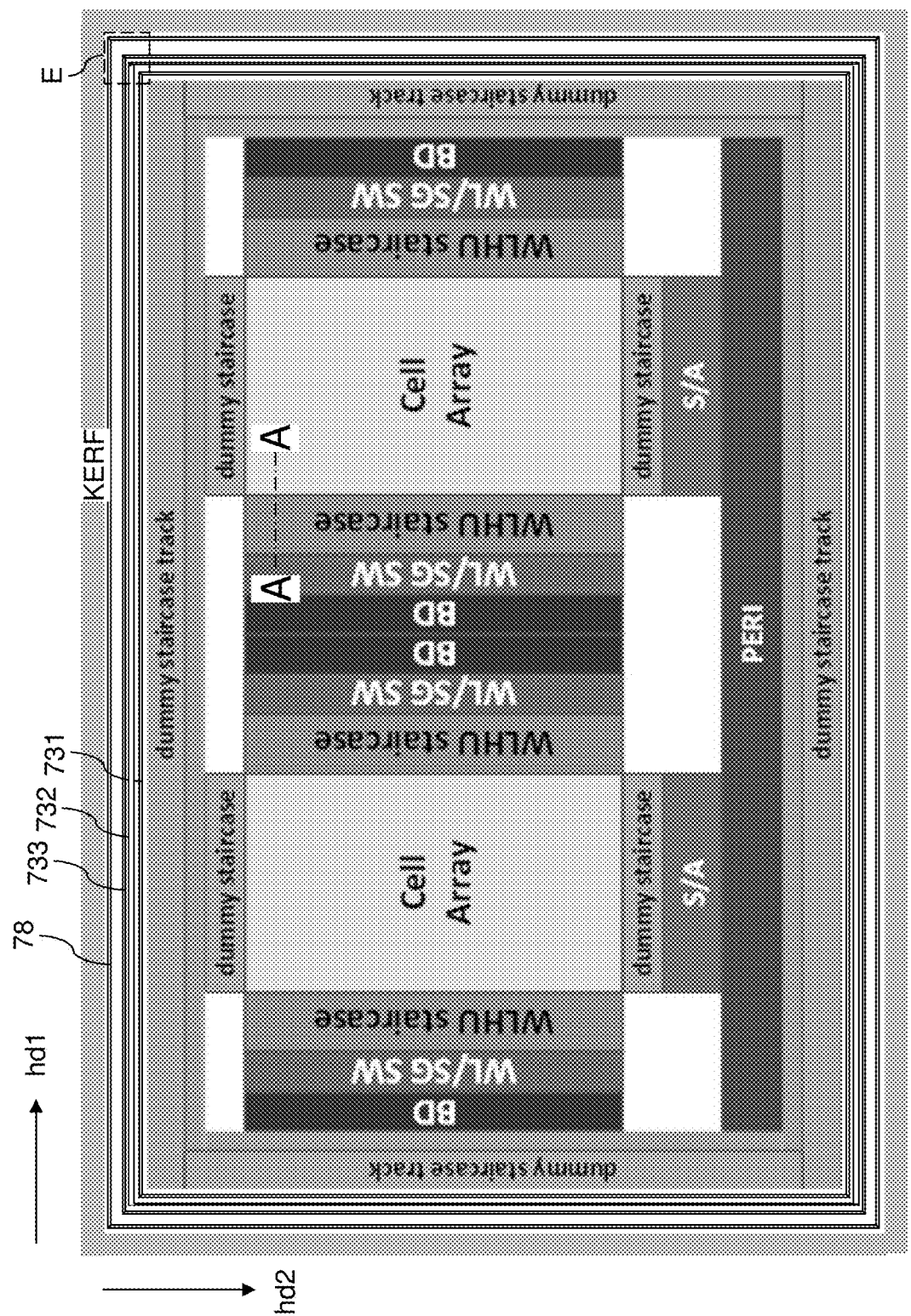

FIG. 18D is a top-down view of a unit die area of an alternative configuration of the exemplary structure after formation of seal ring structures according to an embodiment of the present disclosure.

Figure 18E:
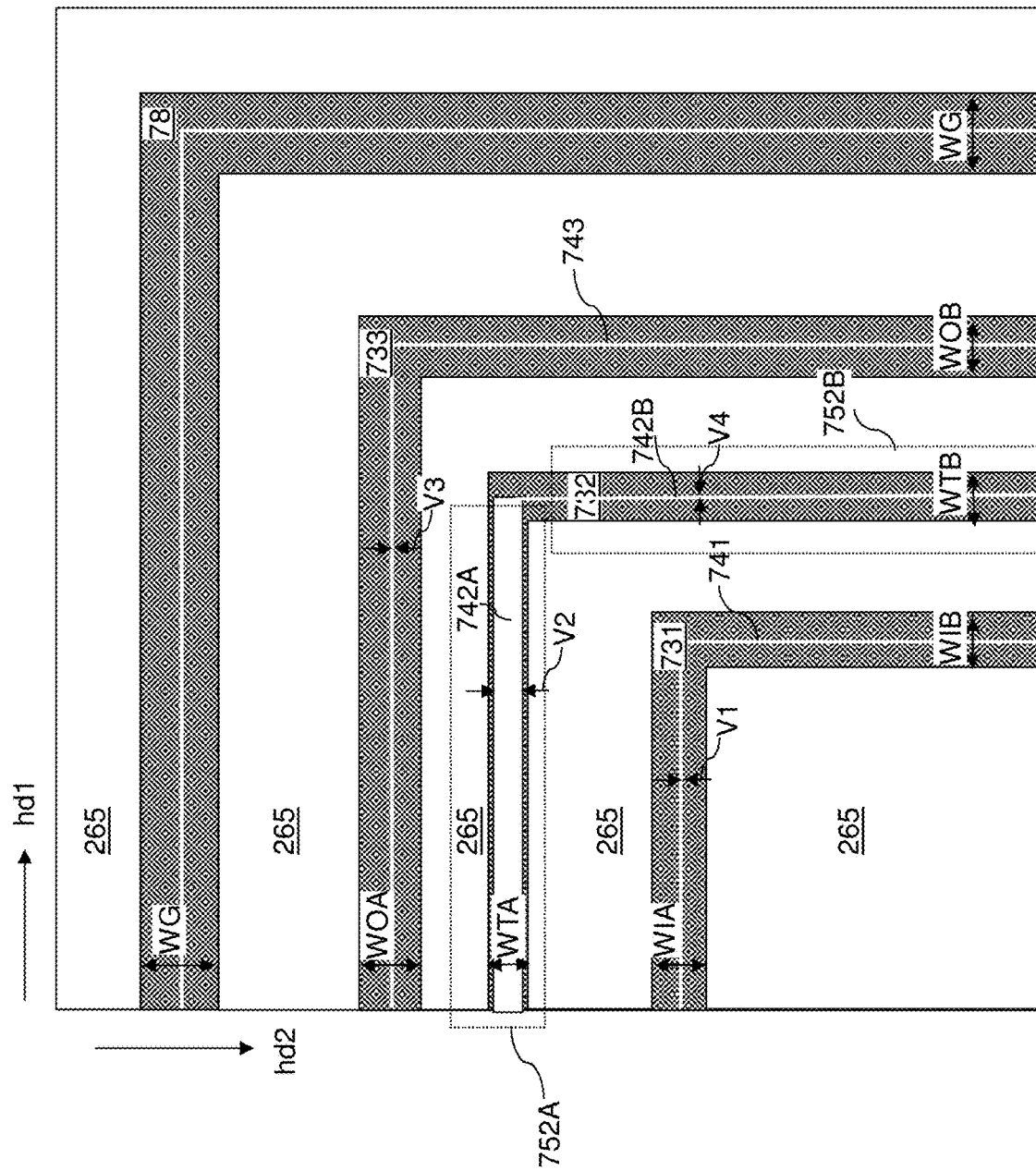

FIG. 18E is a magnified view of region E of FIG. 18D.

Figure 19:
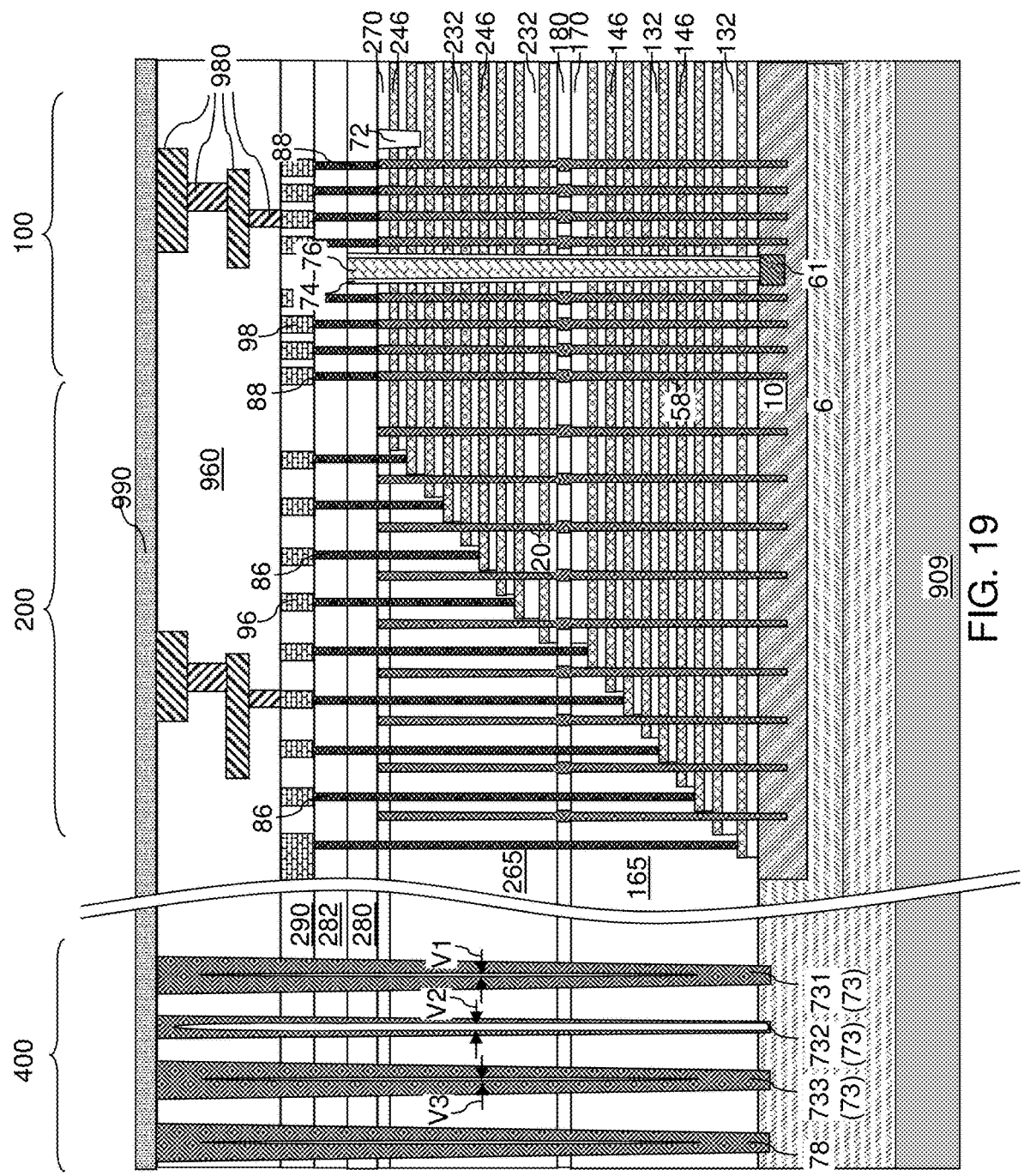

FIG. 19 is a vertical cross-sectional view of a region of the exemplary structure after formation of a dielectric passivation layer according to an embodiment of the present disclosure.

Figure 20:
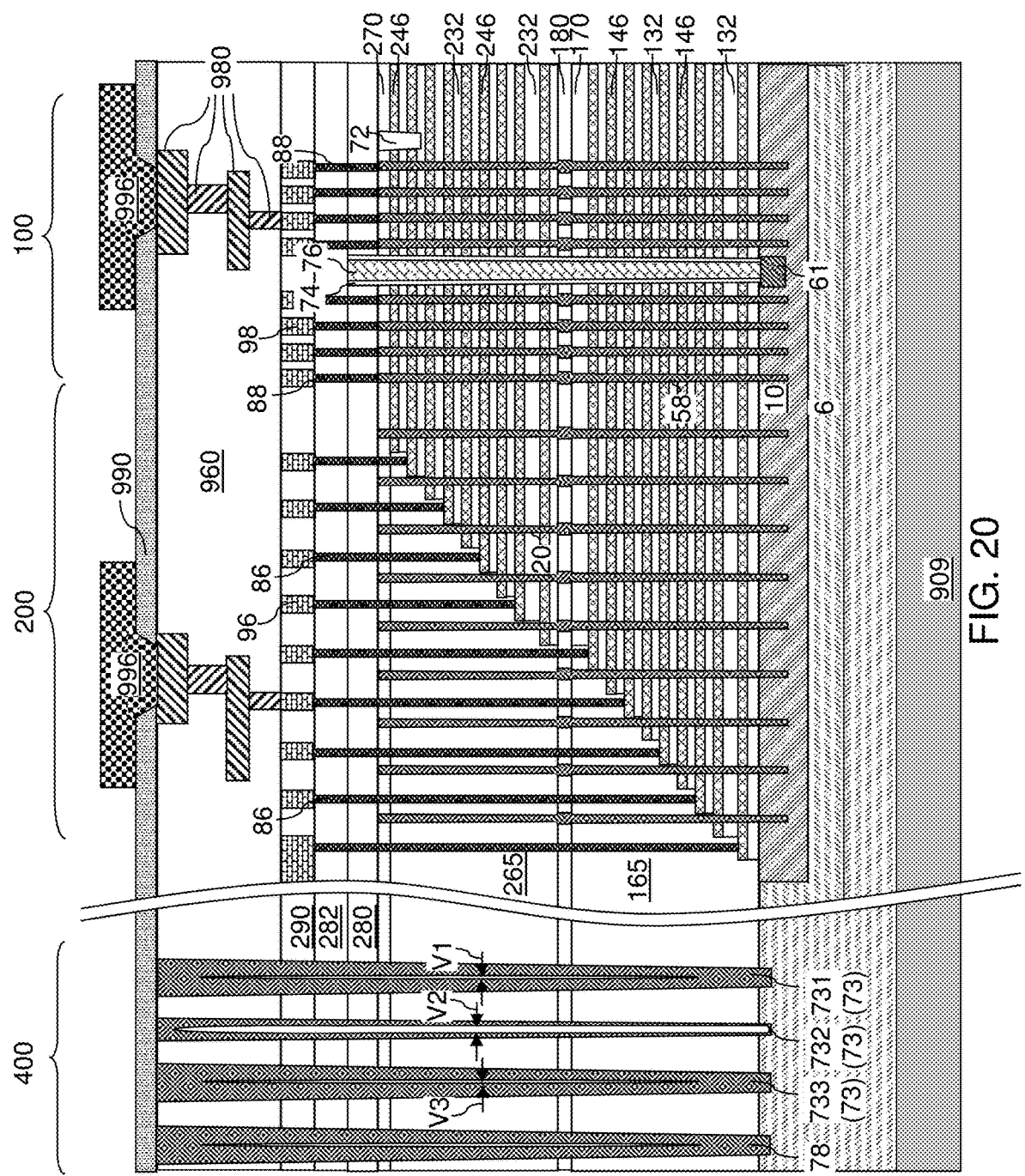

FIG. 20 is a vertical cross-sectional view of a region of the exemplary structure after formation of bonding pads according to an embodiment of the present disclosure.

DETAILED DESCRIPTION

In three-dimensional memory devices, slit trenches laterally extending along a horizontal direction that is perpendicular to vertical steps of an alternating sack of insulating layers and sacrificial material layers may be used to provide conduits through which a liquid etchant is provided to removing the sacrificial material layers to form recesses and through which a reactant is provided for forming electrically conductive layers (e.g., word lines) in the recesses. Because the slit trenches laterally extend along a same horizontal direction (e.g., word line direction), mechanical stress in the three-dimensional memory devices induces deformation of a wafer into a saddleback shape upon replacement of the sacrificial material layers with the electrically conductive layers. A saddleback-shaped deformation of the wafer induces various difficulties during subsequent formation of metal interconnect structures. The embodiments of the present disclosure are directed to three-dimensional memory devices including a stress-absorbing seal ring structure for reducing wafer warpage and methods for forming the same, the various aspects of which are described in detail.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are used merely to identify similar elements, and different ordinals may be used across the specification and the claims of the instant disclosure. The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. As used herein, a first element located "on" a second element may be located on the exterior side of a surface of the second element or on the interior side of the second element. As used herein, a first element is located "directly on" a second element if there exist a physical contact between a surface of the first element and a surface of the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-stack" element refers to an element that vertically extends through a memory level.

As used herein, a "semiconducting material" refers to a material having electrical conductivity in the range from $1.0 \times 10^{-5}$ S/m to $1.0 \times 10^5$ S/m. As used herein, a "semiconductor material" refers to a material having electrical conductivity in the range from $1.0 \times 10^{-5}$ S/m to 1.0 S/m in the absence of electrical dopants therein, and is capable of producing a doped material having electrical conductivity in a range from 1.0 S/m to $1.0 \times 10^5$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/m. As used herein, an "insulator material" or a "dielectric material" refers to a material having electrical conductivity less than $1.0 \times 10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^5$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-5}$ S/m to $1.0 \times 10^5$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The substrate may include integrated circuits fabricated thereon, such as driver circuits for a memory device The various three-dimensional memory devices of the present disclosure include a monolithic three-dimensional NAND string memory device, and may be fabricated using the various embodiments described herein. The monolithic three-dimensional NAND string is located in a monolithic, three-dimensional array of NAND strings located over the substrate. At least one memory cell in the first device level of the three-dimensional array of NAND strings is located over another memory cell in the second device level of the three-dimensional array of NAND strings.

Generally, a semiconductor package (or a "package") refers to a unit semiconductor device that may be attached to a circuit board through a set of pins or solder balls. A semiconductor package may include a semiconductor chip (or a "chip") or a plurality of semiconductor chips that are bonded throughout, for example, by flip-chip bonding or another chip-to-chip bonding. A package or a chip may include a single semiconductor die (or a "die") or a plurality of semiconductor dies. A die is the smallest unit that may independently execute external commands or report status. Typically, a package or a chip with multiple dies is capable of simultaneously executing as many external commands as the total number of planes therein. Each die includes one or more planes. Identical concurrent operations may be executed in each plane within a same die, although there may be some restrictions. In case a die is a memory die, i.e., a die including memory elements, concurrent read operations, concurrent write operations, or concurrent erase operations may be performed in each plane within a same memory die. In a memory die, each plane contains a number of memory blocks (or "blocks"), which are the smallest unit that may be erased by in a single erase operation. Each memory block contains a number of pages, which are the smallest units that may be selected for programming. A page is also the smallest unit that may be selected to a read operation.

Figure 1A:
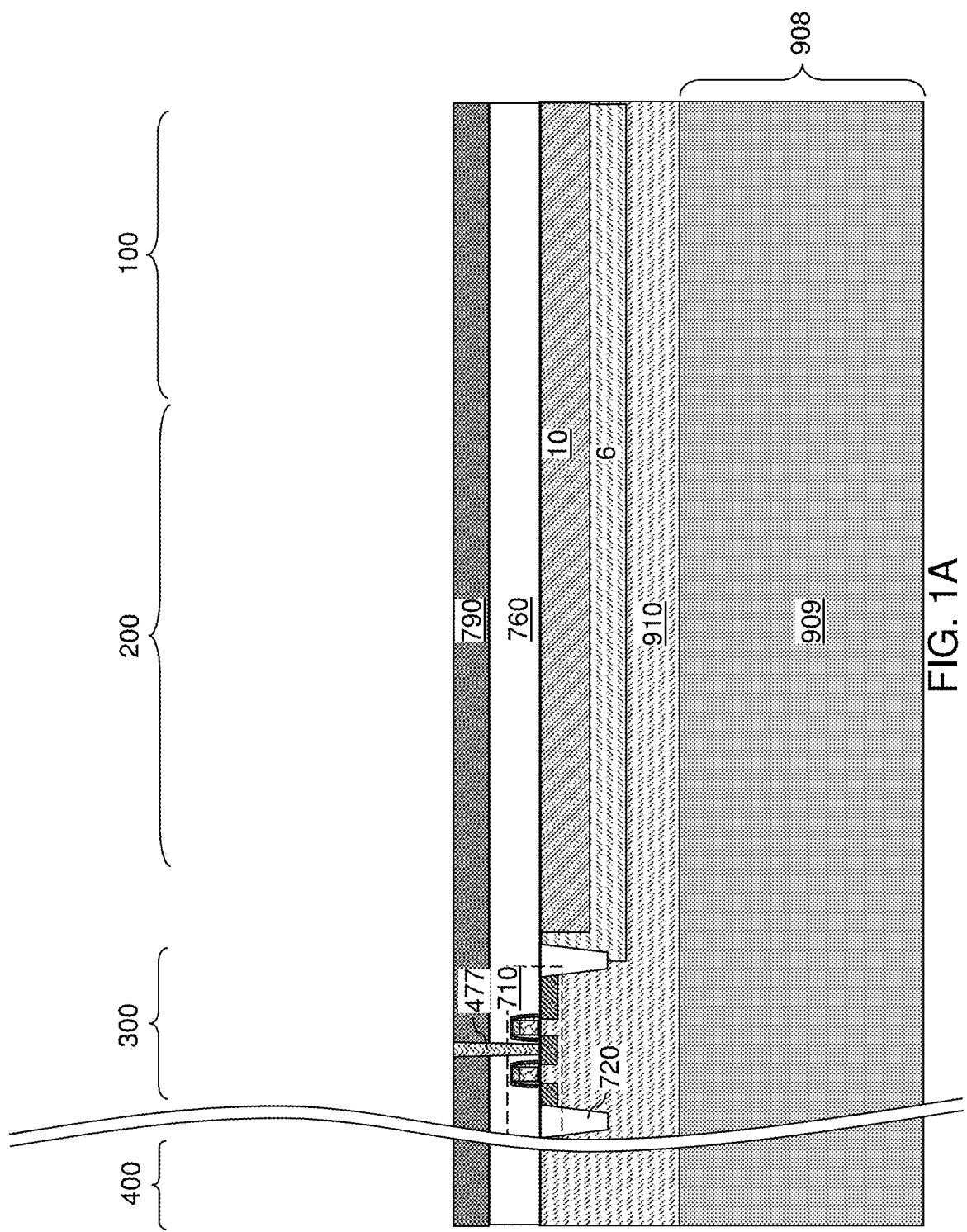
FIG. 1A is a vertical cross-sectional view of a region of an exemplary structure for forming a semiconductor die after formation of various doped semiconductor regions, field effect transistors, a planarization dielectric layer, an etch stop dielectric layer, and sacrificial via structures according to an embodiment of the present disclosure.
Figure 1B:
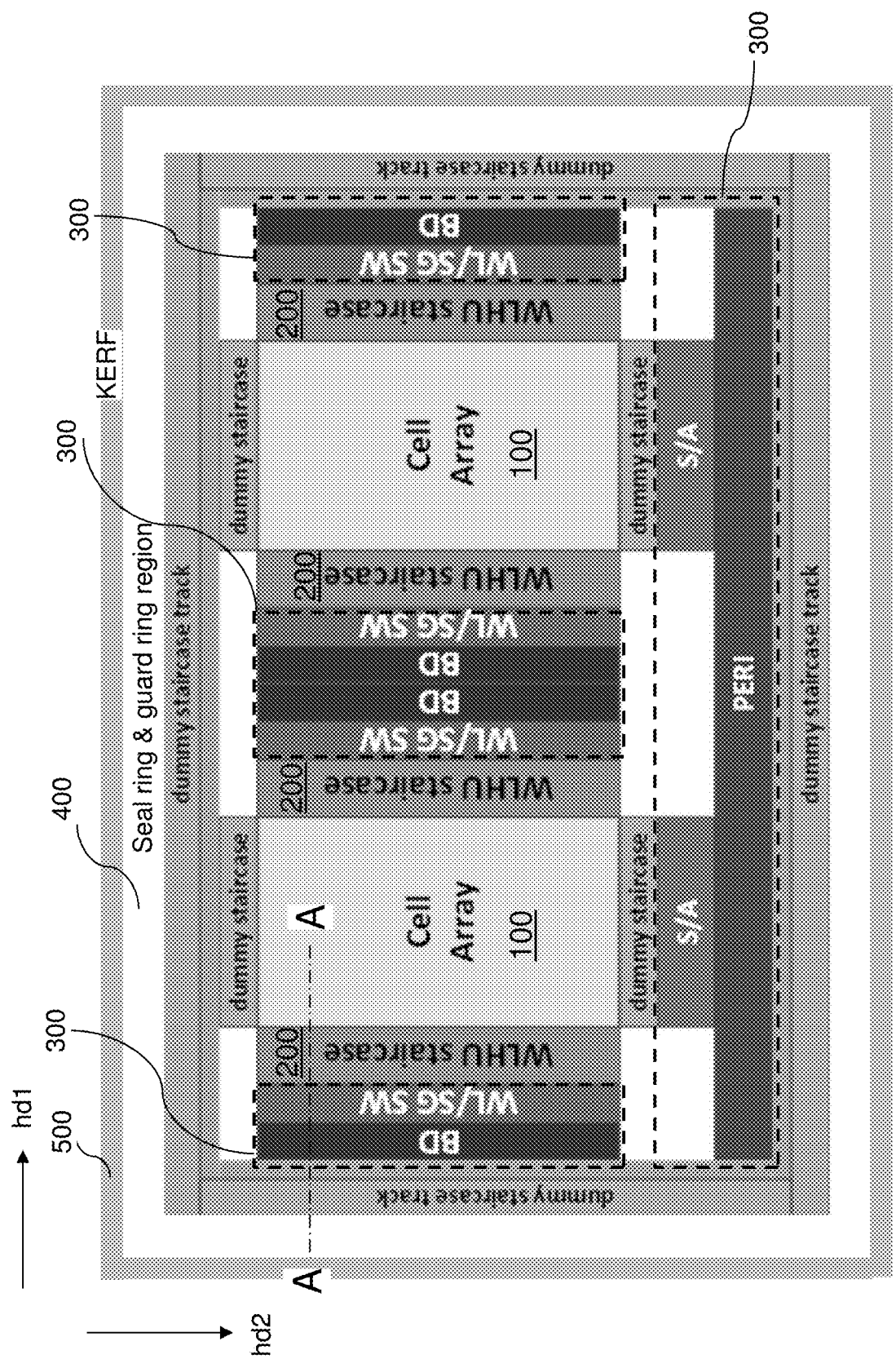
FIG. 1B is a top-down view of a unit die area of the exemplary structure of FIG. 1A.

Referring to FIGS. 1A and 1B, an exemplary structure for forming a semiconductor die is illustrated. FIG. 1B illustrates the layout of various regions within a unit die area of the exemplary structure, and FIG. 1A is a vertical cross-sectional view of the exemplary structure. In one embodiment, the exemplary structure can include a substrate 908, which may be provided by forming various doped semiconductor regions (such as doped wells) in an upper portion of a semiconductor wafer (which may be, for example, a single crystal silicon wafer, such as a 300 mm silicon wafer or a 200 mm silicon wafer). For example, the substrate 908 can include a substrate layer 909, a semiconductor material layer 910, a first doped well 6 that is embedded in the semiconductor material layer 910, and a second doped well 10 that is embedded in the second doped well 6. In an illustrative example, the semiconductor material layer 910 and the second doped well 10 can have p-type doping, and the first doped well 6 can have n-type doping. The substrate layer 909 may be a semiconductor substrate (e.g., silicon wafer), a semiconductor material layer (e.g., an epitaxial silicon layer on silicon wafer), or an insulating layer (as in the case of a semiconductor-on-insulator substrate). Additional doped wells may be formed as needed to provide various semiconductor devices thereupon. Each of the doped wells can be p-doped or n-doped, and can have an atomic concentration of electrical dopants in a range from $1.0 \times 10^{14}/cm^3$ to $1.0 \times 10^{18}/cm^3$, although lesser and greater atomic concentrations may also be used.

Various semiconductor devices 710 can be formed on the substrate. The various semiconductor devices 710 can include complementary metal-oxide-semiconductor (CMOS) devices, and can include various peripheral circuits (i.e., driver circuits) that can be used to operate a three-dimensional array of memory elements to be subsequently formed on the substrate 908 within the cell array regions. As used herein, a "cell array region" refers to a region in which a three-dimensional array of memory elements is formed, such as a memory plane. A cell array region (e.g., a memory plane) is also referred to as a memory array region 100. The semiconductor devices 710 can include field effect transistors that are formed on the top surface of the substrate 908.

Generally, the semiconductor devices 710 can include any circuit that can be used to control operation of at least one three-dimensional array of memory elements to be subsequently formed. For example, the semiconductor devices 710 can include peripheral devices that are used to control operation of a three-dimensional array of memory elements to be subsequently formed. The regions in which the peripheral devices are formed are collectively referred to as a peripheral device region 300. The peripheral device region 300 can include various regions configured to provide specific types of peripheral devices. In an illustrative example, sense amplifier circuits can be formed within sense amplifier regions, which are marked as "S/A" in FIG. 1B. Bit line driver circuits can be formed within bit line driver regions, which are marked as "BD" in FIG. 1B. Word line switches and select gate electrode switch can be formed in word line and select gate electrode switch regions, which are marked as "WL/SG SW" in FIG. 1B. Additional miscellaneous peripheral devices can be formed in a miscellaneous peripheral device region, which is marked as "PERI" in FIG. 1B. Each three-dimensional array of memory elements can be subsequently formed employing alternating stacks of insulating layers and electrically conductive layers (e.g., word lines). In this case, the layers within the alternating stacks can be patterned to provide stepped surfaces, and contact via structures contacting a respective one of the electrically conductive layers can be formed in such stepped surfaces. Such regions are referred to as word line hookup staircase regions, and are marked as "WLHU staircase" in FIG. 1B. The word line hookup staircase regions are also referred to as staircase regions 200. Dummy stepped surfaces that are not used to provide electrical contacts to the electrically conductive layers can be formed around each cell array region (i.e., memory array region 100). Regions including such dummy stepped surfaces are herein referred to as dummy staircase regions, and are marked as "dummy staircase" in FIG. 1B. Additional dummy staircase regions can be formed inside a periphery of a die area. The additional dummy staircase regions are herein referred to as "dummy staircase tracks". Seal ring structures and a guard ring structure are subsequently formed at the outer edge of the dummy staircase tracks, which define the outer boundary of a semiconductor chip.

The region in which the seal ring structures and the guard ring structure are subsequently formed is herein referred to as a seal ring and guard ring region 400. Kerf areas 500 are provided outside the areas of the seal ring structures. The area within an outer periphery of the seal ring and guard ring region defines the area of a semiconductor die to be subsequently formed. The area of the semiconductor die can have a generally rectangular shape. The horizontal direction of a first pair of sidewalls of the semiconductor die is herein referred to as a first horizontal direction hd1 (e.g., word line direction), and the horizontal direction of a second pair of sidewalls of the semiconductor die is herein referred to as a second horizontal direction hd2 (e.g., bit line direction), which is perpendicular to the first horizontal direction hd1. The kerf areas can include various test structures and alignment structures that may, or may not, be destroyed during singulation of the substrate 908 and semiconductor devices thereupon into a plurality of semiconductor dies. The unit die area includes half of the width of each kerf area.

A planarization dielectric layer 760 can be formed over the semiconductor devices 710. For example, the planarization dielectric layer 760 can be formed over gate structures and active regions (such as source regions and drain regions) of the field effect transistors. The planarization dielectric layer 760 can include a planarizable dielectric material such as a silicate glass. The top surface of the planarization dielectric layer 760 can be planarized, for example, by chemical mechanical planarization.

An etch stop dielectric layer 790 can be formed over the planarization dielectric layer 760. The etch stop dielectric layer 790 can include a dielectric material that can be employed as an etch stop material during etching of an overlying dielectric material portion to be subsequently formed. In one embodiment, the etch stop dielectric layer 70 can include at least one dielectric material sublayer including a material that is different from the material of sacrificial material layers of a vertically alternating sequence of insulating layers and sacrificial material layers. For example, if the overlying dielectric material portion includes silicon oxide, the etch stop dielectric layer 790 can include a layer stack of a dielectric metal oxide layer and a silicon nitride layer. In one embodiment, the etch stop dielectric layer 790 can include a layer stack of a silicon nitride layer and an aluminum oxide layer.

Sacrificial via structures 477 can be formed through the etch stop dielectric layer 790 and the planarization dielectric layer 760 onto a top surface of a respective element of the semiconductor devices 710. For example, a photoresist layer (not shown) can be applied over the etch stop dielectric layer 790, and can be lithographically patterned to form openings over components of the semiconductor devices 710. An anisotropic etch process can be performed to form via cavities through the etch stop dielectric layer 790 and the planarization dielectric layer 760 underneath the openings in the photoresist layer. The via cavities can extend to a top surface of a respective underlying component of the semiconductor devices 710. The photoresist layer may be removed, for example, by ashing, and a sacrificial fill material (such as amorphous silicon, a silicon-germanium alloy, a polymer material, borosilicate glass, or organosilicate glass) can be deposited in the via cavities to form the sacrificial via structures 477. Excess portions of the sacrificial fill material can be removed from above the horizontal plane including the top surface of the etch stop dielectric layer 790. Each of the sacrificial via structures 477 can contact a component of a respective one of the semiconductor devices 710. For example, a subset of the sacrificial via structures 477 can contact a respective gate electrode, and another subset of the sacrificial via structures can contact a respective active region (such as a source region or a drain region). Generally, electrically active nodes of the semiconductor devices 710 can be contacted by a respective sacrificial via structure 477. Top surfaces of the sacrificial via structures 477 can be coplanar with the top surface of the etch stop dielectric layer 790.

Figure 2:
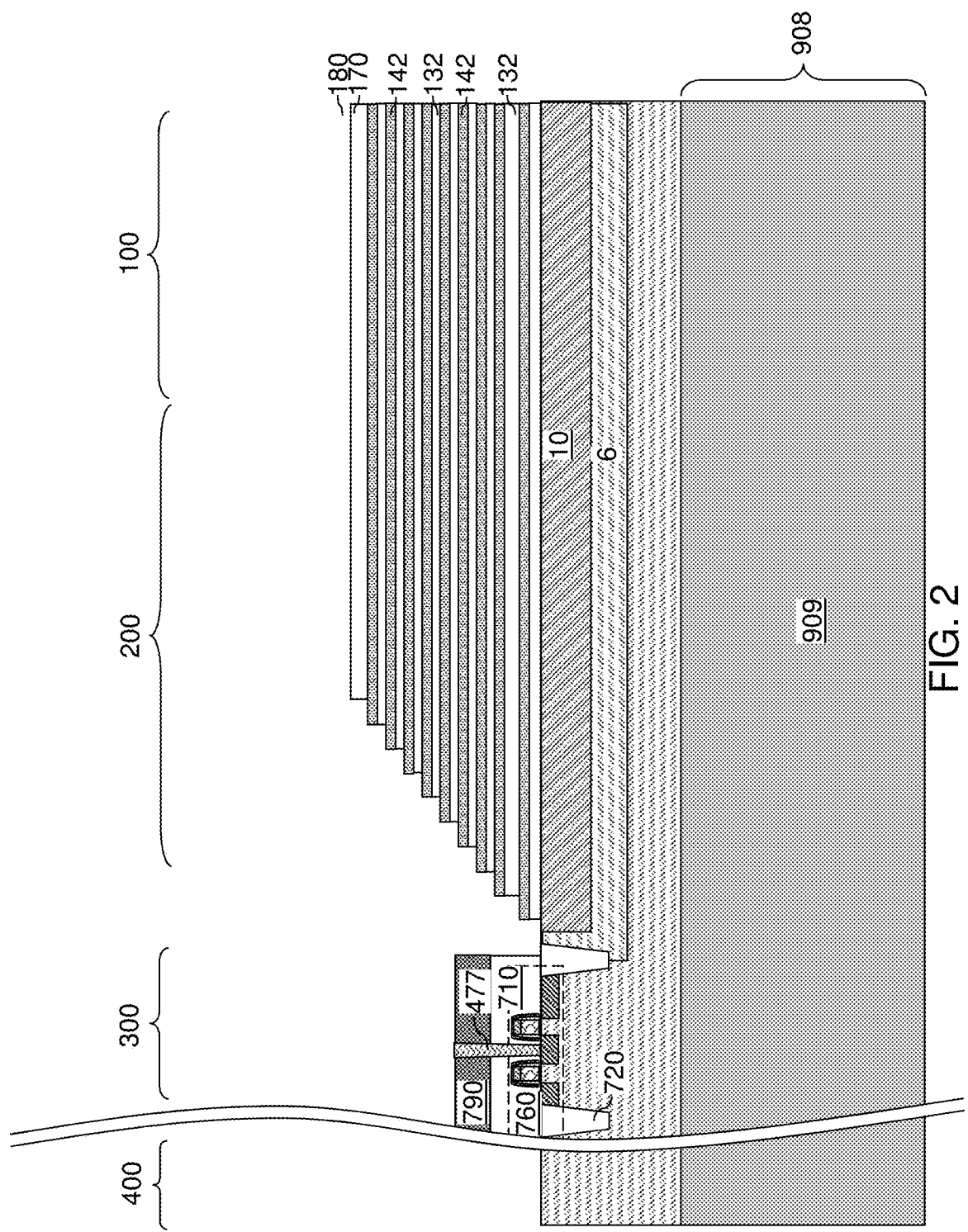
FIG. 2 is a vertical cross-sectional view of a region of the exemplary structure after formation of a first-tier alternating stack of first insulating layers and first spacer material layers and after patterning a first-tier staircase region according to an embodiment of the present disclosure.

Referring to FIG. 2, the etch stop dielectric layer 790 and the planarization dielectric layer 760 can be removed from each memory array region 100 and from each staircase region 200. For example, a photoresist layer (not shown) can cover each area including the semiconductor devices 710, and portions of the etch stop dielectric layer 790 and the planarization dielectric layer 760 that are not covered by the photoresist layer can be removed by at least one etch process, which may include an isotropic etch process (such as a wet etch process) and/or an anisotropic etch process (such as a reactive ion etch process). A top surface of the substrate 908 (such as a top surface of a second doped well 10) can be physically exposed within a memory array region 100 and adjacent staircase regions 200. The etch stop dielectric layer 790 and the planarization dielectric layer 760 can remain in the peripheral device region 300, and can be removed from the seal ring and guard ring region 400.

An alternating stack of first material layers and second material layers is subsequently formed. Each first material layer may include a first material, and each second material layer may include a second material that is different from the first material. In case at least another alternating stack of material layers is subsequently formed over the alternating stack of the first material layers and the second material layers, the alternating stack is herein referred to as a first-tier alternating stack. The level of the first-tier alternating stack is herein referred to as a first-tier level, and the level of the alternating stack to be subsequently formed immediately above the first-tier level is herein referred to as a second-tier level, etc.

The first-tier alternating stack may include first insulating layers 132 as the first material layers, and first spacer material layers as the second material layers. In one embodiment, the first spacer material layers may be sacrificial material layers that are subsequently replaced with electrically conductive layers. In another embodiment, the first spacer material layers may be electrically conductive layers that are not subsequently replaced with other layers. While the present disclosure is described using embodiments in which sacrificial material layers are replaced with electrically conductive layers, embodiments in which the spacer material layers are formed as electrically conductive layers (thereby obviating the need to perform replacement processes) are expressly contemplated herein.

In one embodiment, the first material layers and the second material layers may be first insulating layers 132 and first sacrificial material layers 142, respectively. In one embodiment, each first insulating layer 132 may include a first insulating material, and each first sacrificial material layer 142 may include a first sacrificial material. An alternating plurality of first insulating layers 132 and first sacrificial material layers 142 is formed over the substrate 908. As used herein, a "sacrificial material" refers to a material that is removed during a subsequent processing step.

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness throughout, or may have different thicknesses. The second elements may have the same thickness throughout, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

The first-tier alternating stack (132, 142) may include first insulating layers 132 composed of the first material, and first sacrificial material layers 142 composed of the second material, which is different from the first material. The first material of the first insulating layers 132 may be at least one insulating material. Insulating materials that may be used for the first insulating layers 132 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the first insulating layers 132 may be silicon oxide.

The second material of the first sacrificial material layers 142 may be a sacrificial material that may be removed selective to the first material of the first insulating layers 132. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The first sacrificial material layers 142 may comprise an insulating material, a semiconductor material, or a conductive material. The second material of the first sacrificial material layers 142 may be subsequently replaced with electrically conductive electrodes which may function, for example, as control gate electrodes of a vertical NAND device. In one embodiment, the first sacrificial material layers 142 may be material layers that comprise silicon nitride.

In one embodiment, the first insulating layers 132 may include silicon oxide, and sacrificial material layers may include silicon nitride sacrificial material layers. The first material of the first insulating layers 132 may be deposited, for example, by chemical vapor deposition (CVD). For example, if silicon oxide is used for the first insulating layers 132, tetraethylorthosilicate (TEOS) may be used as the precursor material for the CVD process. The second material of the first sacrificial material layers 142 may be formed, for example, CVD or atomic layer deposition (ALD).

The thicknesses of the first insulating layers 132 and the first sacrificial material layers 142 may be in a range from 20 nm to 50 nm, although lesser and greater thicknesses may be used for each first insulating layer 132 and for each first sacrificial material layer 142. The number of repetitions of the pairs of a first insulating layer 132 and a first sacrificial material layer 142 may be in a range from 2 to 1,024, and typically from 8 to 256, although a greater number of repetitions may also be used. In one embodiment, each first sacrificial material layer 142 in the first-tier alternating stack (132, 142) may have a uniform thickness that is substantially invariant within each respective first sacrificial material layer 142.

A first insulating cap layer 170 is subsequently formed over the first alternating stack (132, 142). The first insulating cap layer 170 includes a dielectric material, which may be any dielectric material that may be used for the first insulating layers 132. In one embodiment, the first insulating cap layer 170 includes the same dielectric material as the first insulating layers 132. The thickness of the first insulating cap layer 170 may be in a range from 20 nm to 300 nm, although lesser and greater thicknesses may also be used.

The first insulating cap layer 170 and the first-tier alternating stack (132, 142) may be patterned to form first stepped surfaces in the staircase region 200. Each layer of the first-tier alternating stack (132, 142) can be removed from above the etch stop dielectric layer 790. The staircase region 200 may include a respective first stepped area in which first stepped surfaces are formed, and a second stepped area in which additional stepped surfaces are to be subsequently formed in a second-tier structure (to be subsequently formed over a first-tier structure) and/or additional tier structures. The first stepped surfaces may be formed, for example, by forming a mask layer with an opening therein, etching a cavity within the levels of the first insulating cap layer 170, and iteratively expanding the etched area and vertically recessing the cavity by etching each pair of a first insulating layer 132 and a first sacrificial material layer 142 located directly underneath the bottom surface of the etched cavity within the etched area. In one embodiment, top surfaces of the first sacrificial material layers 142 may be physically exposed at the first stepped surfaces. The cavity overlying the first stepped surfaces is herein referred to as a first stepped cavity.

The first insulating layers 132 and the first sacrificial material layers 142 continuously extend over an entire area of a memory array region 100, and thus, are also referred to as first continuous insulating layers and first continuous sacrificial material layers, respectively. A vertically alternating sequence of the first continuous insulating layers and the first continuous sacrificial material layers can be formed over the substrate 908. The first stepped surfaces are formed at peripheral portions of the vertically alternating sequence. Each layer of the vertically alternating sequence is present within the memory array region 100. The lateral extent of the first continuous sacrificial material layers decreases with a vertical distance from the substrate 908 in each staircase region 200. In one embodiment, all layers of the vertically alternating sequence are removed from above the etch stop dielectric layer 790, and the stepped surfaces of the remaining portions of the vertically alternating sequence do not extend to areas in which the etch stop dielectric layer 790 is present.

Figure 3:
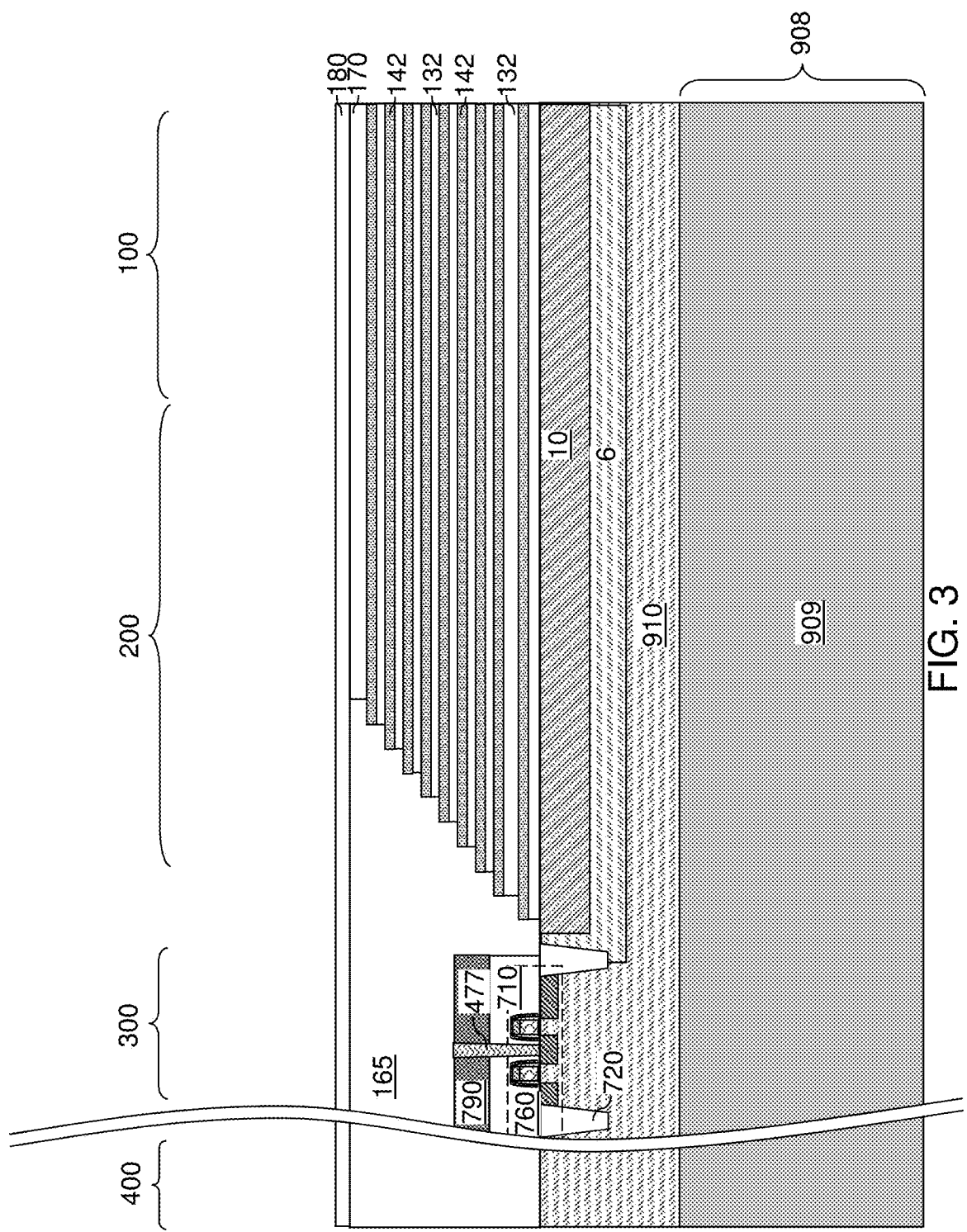
FIG. 3 is a vertical cross-sectional view of a region of the exemplary structure after formation of a first retro-stepped dielectric material portion and an inter-tier dielectric layer according to an embodiment of the present disclosure.

Referring to FIG. 3, a dielectric fill material (such as undoped silicate glass or doped silicate glass) may be deposited to fill the first stepped cavity. Excess portions of the dielectric fill material may be removed from above the horizontal plane including the top surface of the first insulating cap layer 170. A remaining portion of the dielectric fill material that fills the region overlying the first stepped surfaces constitutes a first stepped dielectric material portion 165. As used herein, a "stepped" element refers to an element that has stepped surfaces and a horizontal cross-sectional area that increases monotonically as a function of a vertical distance from a top surface of a substrate on which the element is present. The first retro-stepped dielectric material portion overlies, and contacts, the etch stop dielectric layer 790. The first-tier alternating stack (132, 142) and the first stepped dielectric material portion 165 collectively constitute a first-tier structure, which is an in-process structure that is subsequently modified.

An inter-tier dielectric layer 180 may be optionally deposited over the first-tier structure (132, 142, 170, 165). The inter-tier dielectric layer 180 includes a dielectric material such as silicon oxide. In one embodiment, the inter-tier dielectric layer 180 may include a doped silicate glass having a greater etch rate than the material of the first insulating layers 132 (which may include an undoped silicate glass). For example, the inter-tier dielectric layer 180 may include phosphosilicate glass. The thickness of the inter-tier dielectric layer 180 may be in a range from 30 nm to 300 nm, although lesser and greater thicknesses may also be used.

Figure 4A:
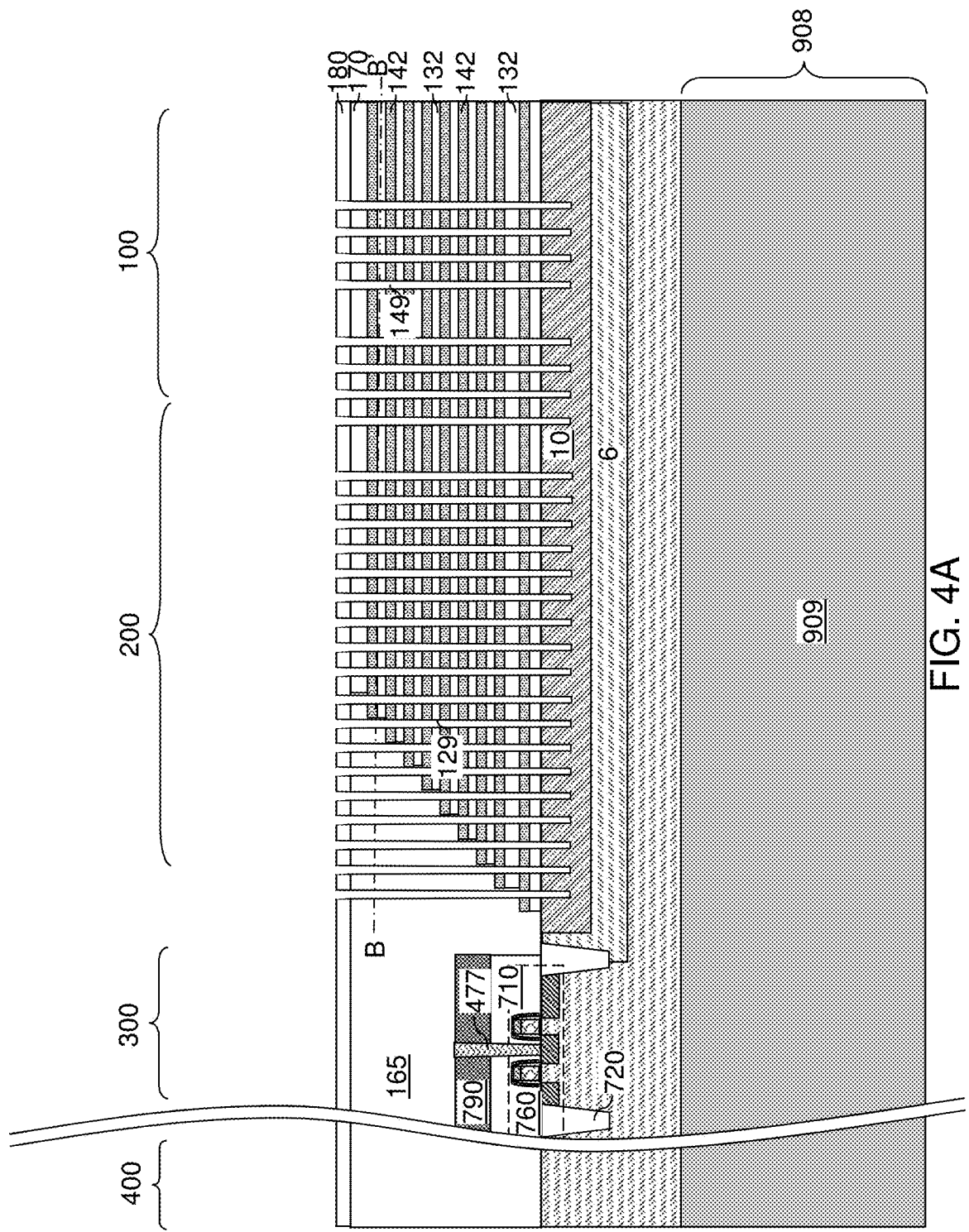
FIG. 4A is a vertical cross-sectional view of a region of the exemplary structure after formation of first-tier memory openings and first-tier support openings according to an embodiment of the present disclosure.
Figure 4B:
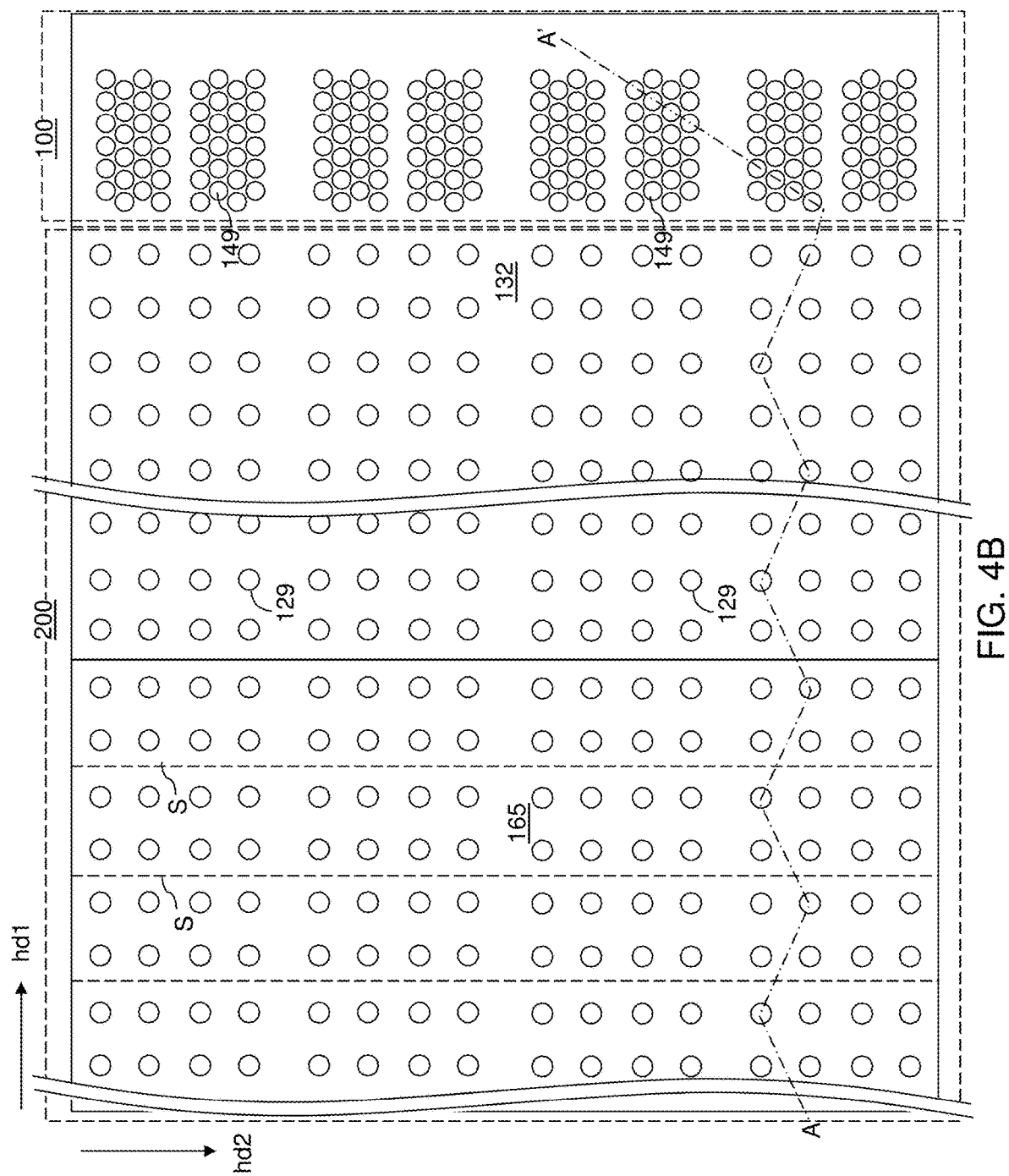
FIG. 4B is a horizontal cross-sectional view of a region of the exemplary structure of FIG. 4A. The hinged vertical plane A-A' corresponds to the plane of the vertical cross-sectional view of FIG. 4A.

Referring to FIGS. 4A and 4B, various first-tier openings (149, 129) may be formed through the inter-tier dielectric layer 180 and the first-tier structure (132, 142, 170, 165) and into the substrate 908. A photoresist layer (not shown) may be applied over the inter-tier dielectric layer 180, and may be lithographically patterned to form various openings therethrough. The pattern of openings in the photoresist layer may be transferred through the inter-tier dielectric layer 180 and the first-tier structure (132, 142, 170, 165) and into the substrate 908 by a first anisotropic etch process to form the various first-tier openings (149, 129) concurrently, i.e., during the first isotropic etch process. The various first-tier openings (149, 129) may include first-tier memory openings 149 and first-tier support openings 129. Locations of steps S in the first alternating stack (132, 142) are illustrated as dotted lines in FIG. 4B.

The first-tier memory openings 149 are openings that are formed in the memory array region 100 through each layer within the first alternating stack (132, 142) and are subsequently used to form memory stack structures therein. The first-tier memory openings 149 may be formed in clusters of first-tier memory openings 149 that are laterally spaced apart along the second horizontal direction hd2. Each cluster of first-tier memory openings 149 may be formed as a two-dimensional array of first-tier memory openings 149.

The first-tier support openings 129 are openings that are formed in the staircase region 200. A subset of the first-tier support openings 129 that is formed through the first stepped dielectric material portion 165 may be formed through a respective horizontal surface of the first stepped surfaces.

In one embodiment, the first anisotropic etch process may include an initial step in which the materials of the first-tier alternating stack (132, 142) are etched concurrently with the material of the first stepped dielectric material portion 165. The chemistry of the initial etch step may alternate to optimize etching of the first and second materials in the first-tier alternating stack (132, 142) while providing a comparable average etch rate to the material of the first stepped dielectric material portion 165. The first anisotropic etch process may use, for example, a series of reactive ion etch processes or a single reaction etch process (e.g., $CF_4$/$O_2$/Ar etch). The sidewalls of the various first-tier openings (149, 129) may be substantially vertical, or may be tapered. In one embodiment, the terminal portion of the anisotropic etch process may include an overetch step that etches into an upper portion of the second doped well 10. The photoresist layer may be subsequently removed, for example, by ashing.

Optionally, the portions of the first-tier memory openings 149 and the first-tier support openings 129 at the level of the inter-tier dielectric layer 180 may be laterally expanded by an isotropic etch. In this case, the inter-tier dielectric layer 180 may comprise a dielectric material (such as borosilicate glass) having a greater etch rate than the first insulating layers 132 (that may include undoped silicate glass) in dilute hydrofluoric acid. An isotropic etch (such as a wet etch using HF) may be used to expand the lateral dimensions of the first-tier memory openings 149 at the level of the inter-tier dielectric layer 180. The portions of the first-tier memory openings 149 located at the level of the inter-tier dielectric layer 180 may be optionally widened to provide a larger landing pad for second-tier memory openings to be subsequently formed through a second-tier alternating stack (to be subsequently formed prior to formation of the second-tier memory openings).

Figure 5:
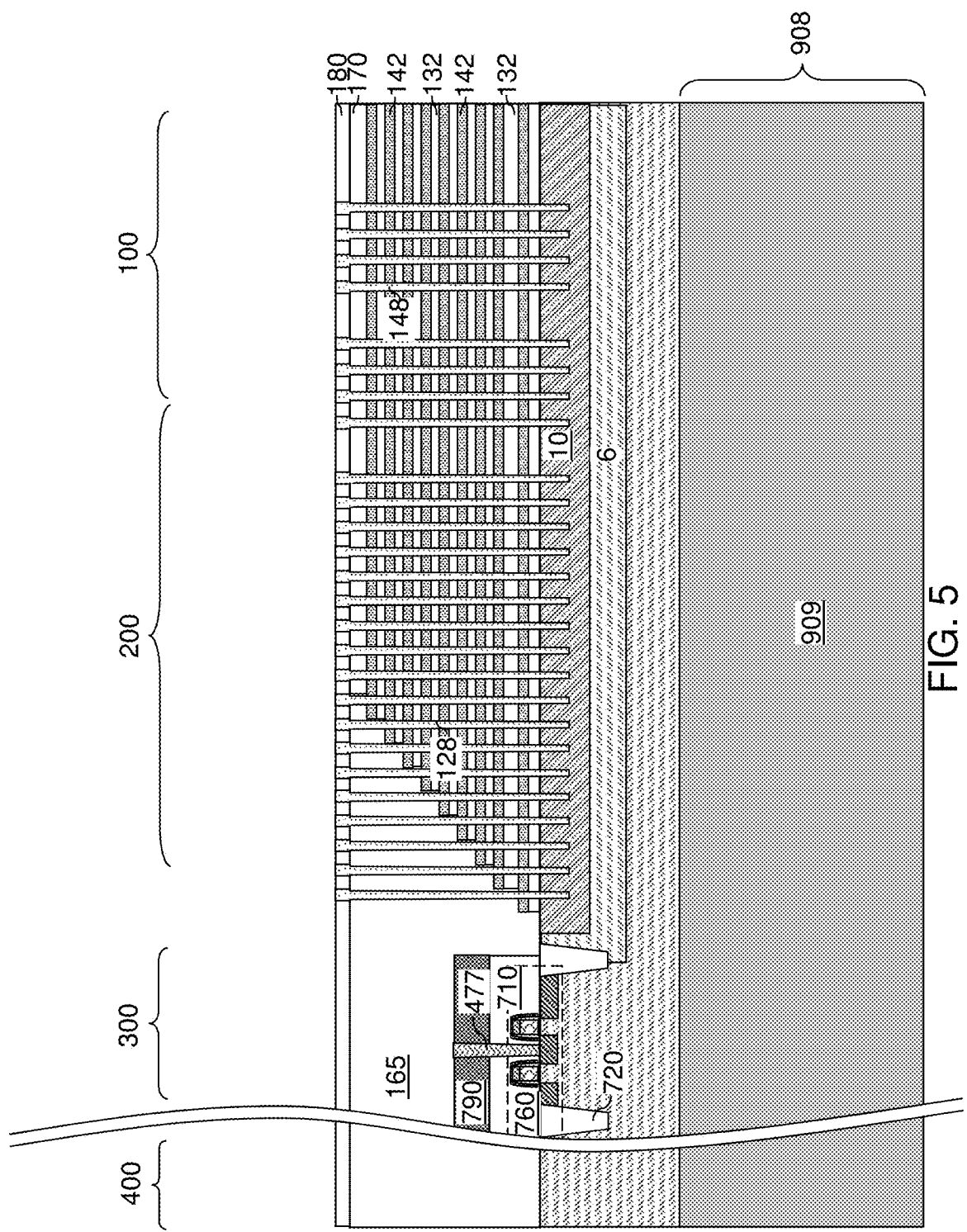
FIG. 5 is a vertical cross-sectional view of a region of the exemplary structure after formation of various sacrificial fill structures according to an embodiment of the present disclosure.

Referring to FIG. 5, sacrificial first-tier opening fill portions (148, 128) may be formed in the various first-tier openings (149, 129). For example, a sacrificial first-tier fill material is deposited concurrently deposited in each of the first-tier openings (149, 129). The sacrificial first-tier fill material includes a material that may be subsequently removed selective to the materials of the first insulating layers 132 and the first sacrificial material layers 142.

In one embodiment, the sacrificial first-tier fill material may include a semiconductor material such as silicon (e.g., a-Si or polysilicon), a silicon-germanium alloy, germanium, a III-V compound semiconductor material, or a combination thereof. Optionally, a thin etch stop liner (such as a silicon oxide layer or a silicon nitride layer having a thickness in a range from 1 nm to 3 nm) may be used prior to depositing the sacrificial first-tier fill material. The sacrificial first-tier fill material may be formed by a non-conformal deposition or a conformal deposition method.

In another embodiment, the sacrificial first-tier fill material may include a silicon oxide material having a higher etch rate than the materials of the first insulating layers 132, the first insulating cap layer 170, and the inter-tier dielectric layer 180. For example, the sacrificial first-tier fill material may include borosilicate glass or porous or non-porous organosilicate glass having an etch rate that is at least 100 times higher than the etch rate of densified TEOS oxide (i.e., a silicon oxide material formed by decomposition of tetraethylorthosilicate glass in a chemical vapor deposition process and subsequently densified in an anneal process) in a 100:1 dilute hydrofluoric acid. In this case, a thin etch stop liner (such as a silicon nitride layer having a thickness in a range from 1 nm to 3 nm) may be used prior to depositing the sacrificial first-tier fill material. The sacrificial first-tier fill material may be formed by a non-conformal deposition or a conformal deposition method.

In yet another embodiment, the sacrificial first-tier fill material may include an amorphous carbon-containing material (such as amorphous carbon or diamond-like carbon) that may be subsequently removed by ashing, or a silicon-based polymer that may be subsequently removed selective to the materials of the first alternating stack (132, 142).

Portions of the deposited sacrificial material may be removed from above the topmost layer of the first-tier alternating stack (132, 142), such as from above the inter-tier dielectric layer 180. For example, the sacrificial first-tier fill material may be recessed to a top surface of the inter-tier dielectric layer 180 using a planarization process. The planarization process may include a recess etch, chemical mechanical planarization (CMP), or a combination thereof. The top surface of the inter-tier dielectric layer 180 may be used as an etch stop layer or a planarization stop layer.

Remaining portions of the sacrificial first-tier fill material comprise sacrificial first-tier opening fill portions (148, 128). Specifically, each remaining portion of the sacrificial material in a first-tier memory opening 149 constitutes a sacrificial first-tier memory opening fill portion 148. Each remaining portion of the sacrificial material in a first-tier support opening 129 constitutes a sacrificial first-tier support opening fill portion 128. The various sacrificial first-tier opening fill portions (148, 128) are concurrently formed, i.e., during a same set of processes including the deposition process that deposits the sacrificial first-tier fill material and the planarization process that removes the first-tier deposition process from above the first alternating stack (132, 142) (such as from above the top surface of the inter-tier dielectric layer 180). The top surfaces of the sacrificial first-tier opening fill portions (148, 128) may be coplanar with the top surface of the inter-tier dielectric layer 180. Each of the sacrificial first-tier opening fill portions (148, 128) may, or may not, include cavities therein.

Figure 6:
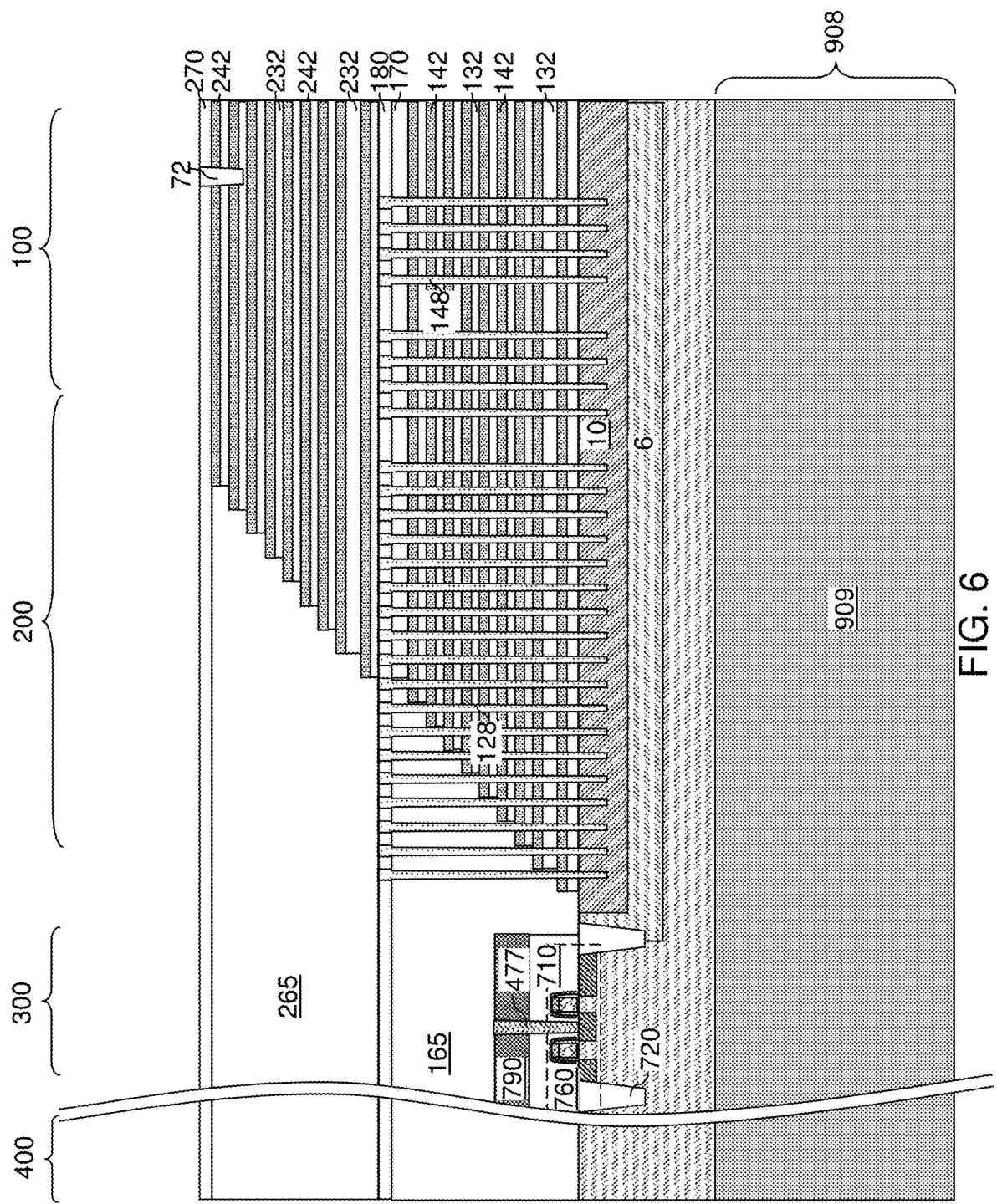
FIG. 6 is a vertical cross-sectional view of a region of the exemplary structure after formation of a second-tier alternating stack of second insulating layers and second spacer material layers, second stepped surfaces, and a second stepped dielectric material portion according to an embodiment of the present disclosure.

Referring to FIG. 6, a second-tier structure may be formed over the first-tier structure (132, 142, 170, 148). The second-tier structure may include an additional alternating stack of insulating layers and spacer material layers, which may be sacrificial material layers. For example, a second alternating stack (232, 242) of material layers may be subsequently formed on the top surface of the first alternating stack (132, 142). The second alternating stack (232, 242) may include an alternating plurality of third material layers and fourth material layers. Each third material layer may include a third material, and each fourth material layer may include a fourth material that is different from the third material. In one embodiment, the third material may be the same as the first material of the first insulating layer 132, and the fourth material may be the same as the second material of the first sacrificial material layers 142.

In one embodiment, the third material layers may be second insulating layers 232 and the fourth material layers may be second spacer material layers that provide vertical spacing between each vertically neighboring pair of the second insulating layers 232. In one embodiment, the third material layers and the fourth material layers may be second insulating layers 232 and second sacrificial material layers 242, respectively. The third material of the second insulating layers 232 may be at least one insulating material. The fourth material of the second sacrificial material layers 242 may be a sacrificial material that may be removed selective to the third material of the second insulating layers 232. The second sacrificial material layers 242 may comprise an insulating material, a semiconductor material, or a conductive material. The fourth material of the second sacrificial material layers 242 may be subsequently replaced with electrically conductive electrodes which may function, for example, as control gate electrodes of a vertical NAND device.

In one embodiment, each second insulating layer 232 may include a second insulating material, and each second sacrificial material layer 242 may include a second sacrificial material. In this case, the second alternating stack (232, 242) may include an alternating plurality of second insulating layers 232 and second sacrificial material layers 242. The third material of the second insulating layers 232 may be deposited, for example, by chemical vapor deposition (CVD). The fourth material of the second sacrificial material layers 242 may be formed, for example, CVD or atomic layer deposition (ALD).

The third material of the second insulating layers 232 may be at least one insulating material. Insulating materials that may be used for the second insulating layers 232 may be any material that may be used for the first insulating layers 132. The fourth material of the second sacrificial material layers 242 is a sacrificial material that may be removed selective to the third material of the second insulating layers 232. Sacrificial materials that may be used for the second sacrificial material layers 242 may be any material that may be used for the first sacrificial material layers 142. In one embodiment, the second insulating material may be the same as the first insulating material, and the second sacrificial material may be the same as the first sacrificial material.

The thicknesses of the second insulating layers 232 and the second sacrificial material layers 242 may be in a range from 20 nm to 50 nm, although lesser and greater thicknesses may be used for each second insulating layer 232 and for each second sacrificial material layer 242. The number of repetitions of the pairs of a second insulating layer 232 and a second sacrificial material layer 242 may be in a range from 2 to 1,024, and typically from 8 to 256, although a greater number of repetitions may also be used. In one embodiment, each second sacrificial material layer 242 in the second alternating stack (232, 242) may have a uniform thickness that is substantially invariant within each respective second sacrificial material layer 242.

Second stepped surfaces in the second stepped area may be formed in the staircase region 200 using a same set of processing steps as the processing steps used to form the first stepped surfaces in the first stepped area with suitable adjustment to the pattern of at least one masking layer. A second stepped dielectric material portion 265 may be formed over the second stepped surfaces in the staircase region 200.

A second insulating cap layer 270 may be subsequently formed over the second alternating stack (232, 242). The second insulating cap layer 270 includes a dielectric material that is different from the material of the second sacrificial material layers 242. In one embodiment, the second insulating cap layer 270 may include silicon oxide. In one embodiment, the first and second sacrificial material layers (142, 242) may comprise silicon nitride.

The second insulating layers 232 and the second sacrificial material layers 242 continuously extend over an entire area of a memory array region 100, and thus, are also referred to as second continuous insulating layers and second continuous sacrificial material layers, respectively. A vertically alternating sequence of the second continuous insulating layers and the second continuous sacrificial material layers can be formed over the substrate 908. The second stepped surfaces are formed at peripheral portions of the vertically alternating sequence. Each layer of the vertically alternating sequence is present within the memory array region 100. The lateral extent of the second continuous sacrificial material layers 242 decreases with a vertical distance from the substrate 908 in each staircase region 200. In one embodiment, all layers of the vertically alternating sequence are removed from above the etch stop dielectric layer 790, and the stepped surfaces of the remaining portions of the vertically alternating sequence do not extend to areas in which the etch stop dielectric layer 790 is present.

Generally speaking, at least one vertically alternating sequence of continuous insulating layers (132, 232) and continuous spacer material layers (such as continuous sacrificial material layers (142, 242)) may be formed over the substrate 908, and at least one stepped dielectric material portion (165, 265) may be formed over the staircase regions on the at least one vertically alternating sequence (132, 142, 232, 242).

Optionally, drain-select-level isolation structures 72 may be formed through a subset of layers in an upper portion of the second-tier alternating stack (232, 242). The second sacrificial material layers 242 that are cut by the drain-select-level isolation structures 72 correspond to the levels in which drain-select-level electrically conductive layers are subsequently formed. The drain-select-level isolation structures 72 include a dielectric material such as silicon oxide. The drain-select-level isolation structures 72 may laterally extend along the first horizontal direction hd1, and may be laterally spaced apart along the second horizontal direction hd2 that is perpendicular to the first horizontal direction hd1. The second alternating stack (232, 242), the second stepped dielectric material portion 265, the second insulating cap layer 270, and the optional drain-select-level isolation structures 72 collectively constitute a second-tier structure (232, 242, 265, 270, 72).

Figure 7A:
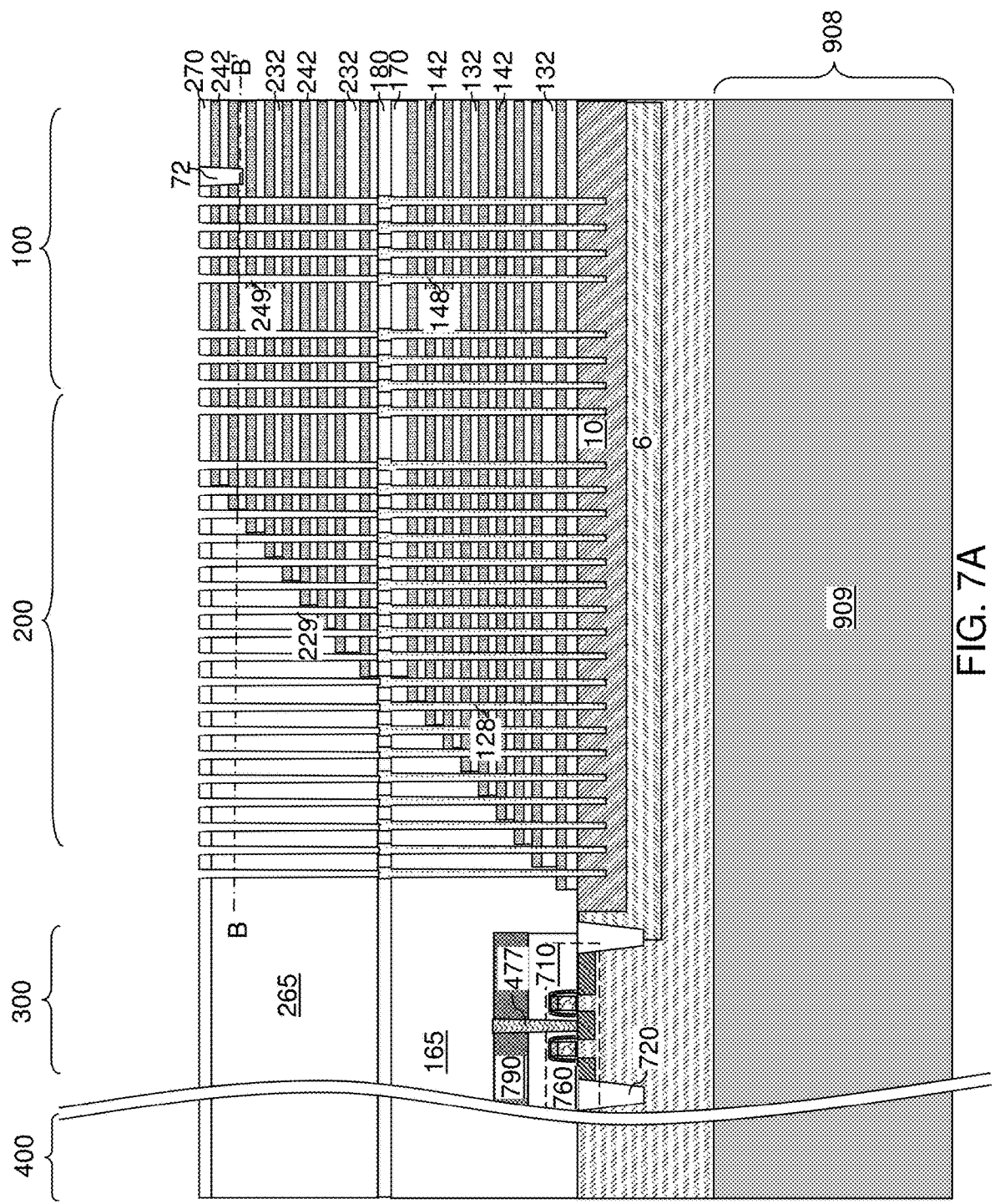
FIG. 7A is a vertical cross-sectional view of a region of the exemplary structure after formation of second-tier memory openings and second-tier support openings according to an embodiment of the present disclosure.
Figure 7B:
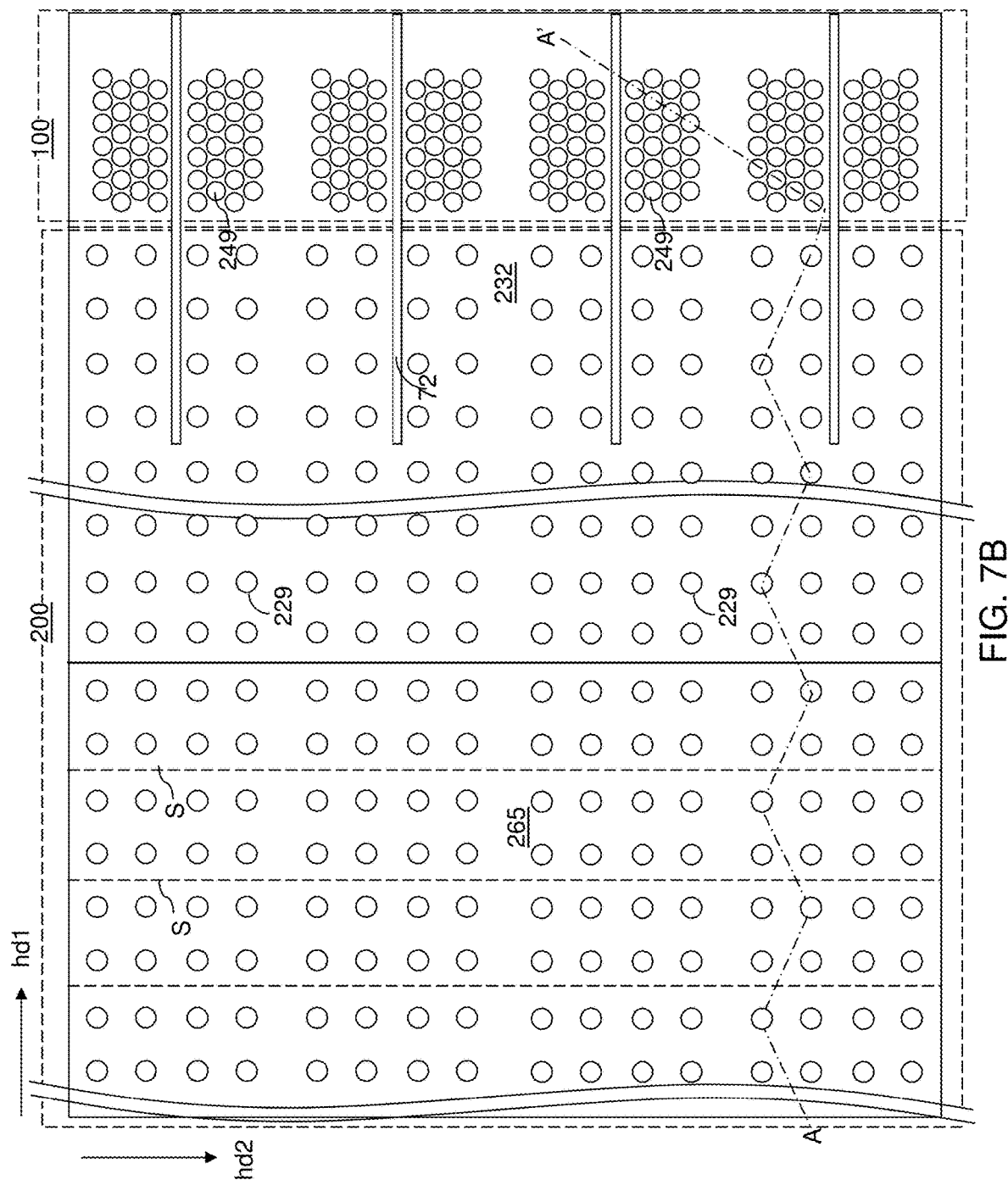
FIG. 7B is a horizontal cross-sectional of a region of the exemplary structure along the horizontal plane B-B' of FIG. 7A. The hinged vertical plane A-A' corresponds to the plane of the vertical cross-sectional view of FIG. 7A.

Referring to FIGS. 7A and 7B, various second-tier openings (249, 229) may be formed through the second-tier structure (232, 242, 265, 270, 72). A photoresist layer (not shown) may be applied over the second insulating cap layer 270, and may be lithographically patterned to form various openings therethrough. The pattern of the second-tier memory openings 249 in the memory array region 100 may be the same as the pattern of the first-tier memory openings 149, which is the same as the pattern of the first-tier memory opening fill portion 148. The lateral extent of the pattern of the second-tier support openings 229 in the staircase region 200 can be limited within the areas of the stepped surfaces of the second-tier alternating stack (232, 242). In other words, the second-tier support openings 229 may be absent within an area in which the second retro-stepped dielectric material portion 265 contacts a top surface of the inter-stack dielectric layer 180. Thus, the lithographic mask used to pattern the first-tier openings (149, 129) may be used to pattern the photoresist layer.

The pattern of openings in the photoresist layer may be transferred through the second-tier structure (232, 242, 265, 270, 72) by a second anisotropic etch process to form various second-tier openings (249, 229) concurrently, i.e., during the second anisotropic etch process. The various second-tier openings (249, 229) may include second-tier memory openings 249 and second-tier support openings 229.

The second-tier memory openings 249 are formed directly on a top surface of a respective one of the sacrificial first-tier memory opening fill portions 148. The second-tier support openings 229 are formed directly on a top surface of a respective one of the sacrificial first-tier support opening fill portions 128. Further, each second-tier support openings 229 may be formed through a horizontal surface within the second stepped surfaces, which include the interfacial surfaces between the second alternating stack (232, 242) and the second stepped dielectric material portion 265. Locations of steps S in the first-tier alternating stack (132, 142) and the second-tier alternating stack (232, 242) are illustrated as dotted lines in FIG. 7B.

The second anisotropic etch process may include an etch step in which the materials of the second-tier alternating stack (232, 242) are etched concurrently with the material of the second stepped dielectric material portion 265. The chemistry of the etch step may alternate to optimize etching of the materials in the second-tier alternating stack (232, 242) while providing a comparable average etch rate to the material of the second stepped dielectric material portion 265. The second anisotropic etch process may use, for example, a series of reactive ion etch processes or a single reaction etch process (e.g., $CF_4/O_2/Ar$ etch). The sidewalls of the various second-tier openings (249, 229) may be substantially vertical, or may be tapered. A bottom periphery of each second-tier opening (249, 229) may be laterally offset, and/or may be located entirely within, a periphery of a top surface of an underlying sacrificial first-tier opening fill portion (148, 128). The photoresist layer may be subsequently removed, for example, by ashing.

Figure 8:
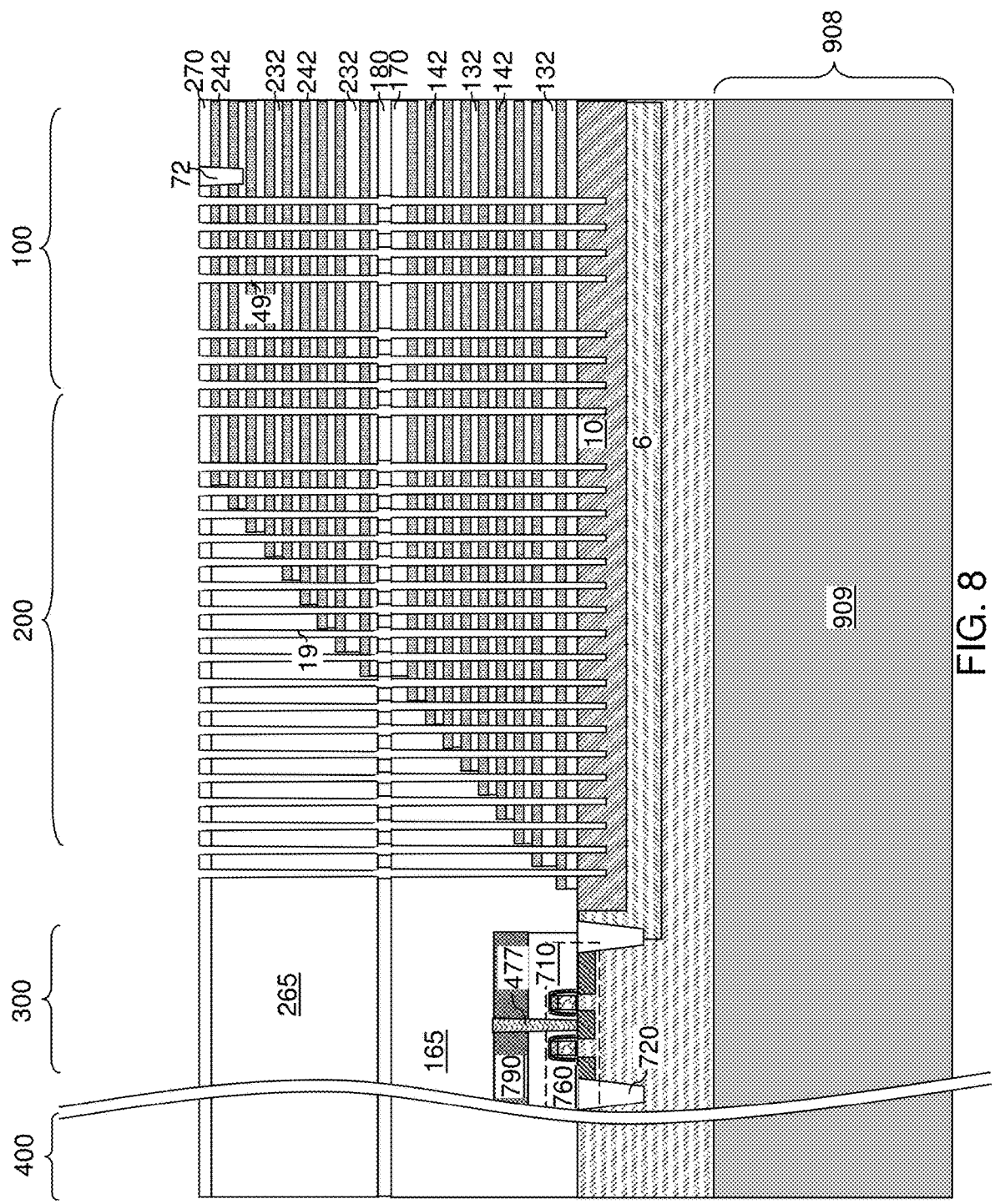
FIG. 8 is a vertical cross-sectional view of a region of the exemplary structure after formation of inter-tier memory openings and inter-tier support openings according to an embodiment of the present disclosure.

Referring to FIG. 8, the sacrificial first-tier fill material of the sacrificial first-tier opening fill portions (148, 128) may be removed using an etch process that etches the sacrificial first-tier fill material selective to the materials of the first and second insulating layers (132, 232), the first and second sacrificial material layers (142, 242), the first and second insulating cap layers (170, 270), and the inter-tier dielectric layer 180. A memory opening 49, which is also referred to as an inter-tier memory opening 49, is formed in each combination of a second-tier memory openings 249 and a volume from which a sacrificial first-tier memory opening fill portion 148 is removed. A support opening 19, which is also referred to as an inter-tier support opening 19, is formed in each combination of a second-tier support openings 229 and a volume from which a sacrificial first-tier support opening fill portion 128 is removed.

FIGS. 9A-9D provide sequential cross-sectional views of a memory opening 49 during formation of a memory opening fill structure. The same structural change occurs in each of the memory openings 49 and the support openings 19.

Referring to FIG. 9A, a pedestal channel portion 11 may be formed by a selective semiconductor material deposition process at the bottom of each memory opening 49 and at the bottom of each support opening 19. A doped semiconductor material having a doping of a first conductivity type may be selectively grown from the physically exposed surfaces of the second doped well 10, while growth of the doped semiconductor material from dielectric surfaces is suppressed during the selective semiconductor material deposition process. A semiconductor precursor gas, a dopant gas including dopants atoms of the first conductivity type, and an etchant may be flowed into a process chamber including the exemplary structure concurrently or alternately. A periphery of a top surface each pedestal channel portion 11 may contact a sidewall of a first insulating layer 132 that overlies, and contacts, a bottommost first sacrificial material layer 142. The atomic concentration of first conductivity type dopants in the pedestal channel portions 11 may be in a range from $1.0 \times 10^{14}/cm^3$ to $1.0 \times 10^{18}/cm^3$, although lesser and greater dopant atomic concentrations may also be used. A p-n junction may be formed at each interface between the second doped well 10 and the pedestal channel portions 11.

Referring to FIG. 9B, a stack of layers including a blocking dielectric layer 52, a charge storage layer 54, a tunneling dielectric layer 56, and a semiconductor channel material layer 60L may be sequentially deposited in the memory openings 49. The blocking dielectric layer 52 may include a single dielectric material layer or a stack of a plurality of dielectric material layers. In one embodiment, the blocking dielectric layer may include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 may include a dielectric metal oxide having a dielectric constant greater than 7.9, i.e., having a dielectric constant greater than the dielectric constant of silicon nitride. The thickness of the dielectric metal oxide layer may be in a range from 1 nm to 20 nm, although lesser and greater thicknesses may also be used. The dielectric metal oxide layer may subsequently function as a dielectric material portion that blocks leakage of stored electrical charges to control gate electrodes. In one embodiment, the blocking dielectric layer 52 includes aluminum oxide. Alternatively or additionally, the blocking dielectric layer 52 may include a dielectric semiconductor compound such as silicon oxide, silicon oxynitride, silicon nitride, or a combination thereof.

Subsequently, the charge storage layer 54 may be formed. In one embodiment, the charge storage layer 54 may be a continuous layer or patterned discrete portions of a charge trapping material including a dielectric charge trapping material, which may be, for example, silicon nitride. Alternatively, the charge storage layer 54 may include a continuous layer or patterned discrete portions of a conductive material such as doped polysilicon or a metallic material that is patterned into multiple electrically isolated portions (e.g., floating gates), for example, by being formed within lateral recesses into sacrificial material layers (142, 242). In one embodiment, the charge storage layer 54 includes a silicon nitride layer. In one embodiment, the sacrificial material layers (142, 242) and the insulating layers (132, 232) may have vertically coincident sidewalls, and the charge storage layer 54 may be formed as a single continuous layer. Alternatively, the sacrificial material layers (142, 242) may be laterally recessed with respect to the sidewalls of the insulating layers (132, 232), and a combination of a deposition process and an anisotropic etch process may be used to form the charge storage layer 54 as a plurality of memory material portions that are vertically spaced apart. The thickness of the charge storage layer 54 may be in a range from 2 nm to 20 nm, although lesser and greater thicknesses may also be used.

The tunneling dielectric layer 56 includes a dielectric material through which charge tunneling may be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 may include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 may include a stack of a first silicon oxide layer, a silicon oxynitride layer, and a second silicon oxide layer, which is commonly known as an ONO stack. In one embodiment, the tunneling dielectric layer 56 may include a silicon oxide layer that is substantially free of carbon or a silicon oxynitride layer that is substantially free of carbon. The thickness of the tunneling dielectric layer 56 may be in a range from 2 nm to 20 nm, although lesser and greater thicknesses may also be used. The stack of the blocking dielectric layer 52, the charge storage layer 54, and the tunneling dielectric layer 56 constitutes a memory film 50 that stores memory bits.

The semiconductor channel material layer 60L includes a p-doped semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel material layer 60L may have a uniform doping. In one embodiment, the semiconductor channel material layer 60L has a p-type doping in which p-type dopants (such as boron atoms) are present at an atomic concentration in a range from $1.0 \times 10^{12}/\text{cm}^3$ to $1.0 \times 10^{18}/\text{cm}^3$, such as from $1.0 \times 10^{14}/\text{cm}^3$ to $1.0 \times 10^{17}/\text{cm}^3$. In one embodiment, the semiconductor channel material layer 60L includes, and/or consists essentially of, boron-doped amorphous silicon or boron-doped polysilicon. In another embodiment, the semiconductor channel material layer 60L has an n-type doping in which n-type dopants (such as phosphor atoms or arsenic atoms) are present at an atomic concentration in a range from $1.0 \times 10^{15}/\text{cm}^3$ to $1.0 \times 10^{19}/\text{cm}^3$, such as from $1.0 \times 10^{16}/\text{cm}^3$ to $1.0 \times 10^{18}/\text{cm}^3$. The semiconductor channel material layer 60L may be formed by a conformal deposition method such as low pressure chemical vapor deposition (LPCVD). The thickness of the semiconductor channel material layer 60L may be in a range from 2 nm to 10 nm, although lesser and greater thicknesses may also be used. A cavity 49' is formed in the volume of each memory opening 49 that is not filled with the deposited material layers (52, 54, 56, 60L).

Referring to FIG. 9C, in case the cavity 49' in each memory opening is not completely filled by the semiconductor channel material layer 60L, a dielectric core layer may be deposited in the cavity 49' to fill any remaining portion of the cavity 49' within each memory opening. The dielectric core layer includes a dielectric material such as silicon oxide or organosilicate glass. The dielectric core layer may be deposited by a conformal deposition method such as low pressure chemical vapor deposition (LPCVD), or by a self-planarizing deposition process such as spin coating. The horizontal portion of the dielectric core layer overlying the second insulating cap layer 270 may be removed, for example, by a recess etch. The recess etch continues until top surfaces of the remaining portions of the dielectric core layer are recessed to a height between the top surface of the second insulating cap layer 270 and the bottom surface of the second insulating cap layer 270. Each remaining portion of the dielectric core layer constitutes a dielectric core 62.

Referring to FIG. 9D, a doped semiconductor material may be deposited in cavities overlying the dielectric cores 62. The doped semiconductor material has a doping of the opposite conductivity type of the doping of the semiconductor channel material layer 60L. Thus, the doped semiconductor material has an n-type doping. Portions of the deposited doped semiconductor material, the semiconductor channel material layer 60L, the tunneling dielectric layer 56, the charge storage layer 54, and the blocking dielectric layer 52 that overlie the horizontal plane including the top surface of the second insulating cap layer 270 may be removed by a planarization process such as a chemical mechanical planarization (CMP) process.

Each remaining portion of the n-doped semiconductor material constitutes a drain region 63. The dopant concentration in the drain regions 63 may be in a range from $5.0 \times 10^{19}/\text{cm}^3$ to $2.0 \times 10^{21}/\text{cm}^3$, although lesser and greater dopant concentrations may also be used. The doped semiconductor material may be, for example, doped polysilicon.

Each remaining portion of the semiconductor channel material layer 60L constitutes a vertical semiconductor channel 60 through which electrical current may flow when a vertical NAND device including the vertical semiconductor channel 60 is turned on. A tunneling dielectric layer 56 is surrounded by a charge storage layer 54, and laterally surrounds a vertical semiconductor channel 60. Each adjoining set of a blocking dielectric layer 52, a charge storage layer 54, and a tunneling dielectric layer 56 collectively constitute a memory film 50, which may store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Each combination of a memory film 50 and a vertical semiconductor channel 60 (which is a vertical semiconductor channel) within a memory opening 49 constitutes a memory stack structure 55. The memory stack structure 55 is a combination of a vertical semiconductor channel 60, a tunneling dielectric layer 56, a plurality of memory elements comprising portions of the charge storage layer 54, and an optional blocking dielectric layer 52. Each combination of a memory stack structure 55, a dielectric core 62, and a drain region 63 within a memory opening 49 constitutes a memory opening fill structure 58. The semiconductor material layer 910 and doped wells embedded therein, the first-tier structure (132, 142, 170, 165), the second-tier structure (232, 242, 270, 265, 72), the inter-tier dielectric layer 180, and the memory opening fill structures 58 collectively constitute a memory-level assembly.

Figure 10:
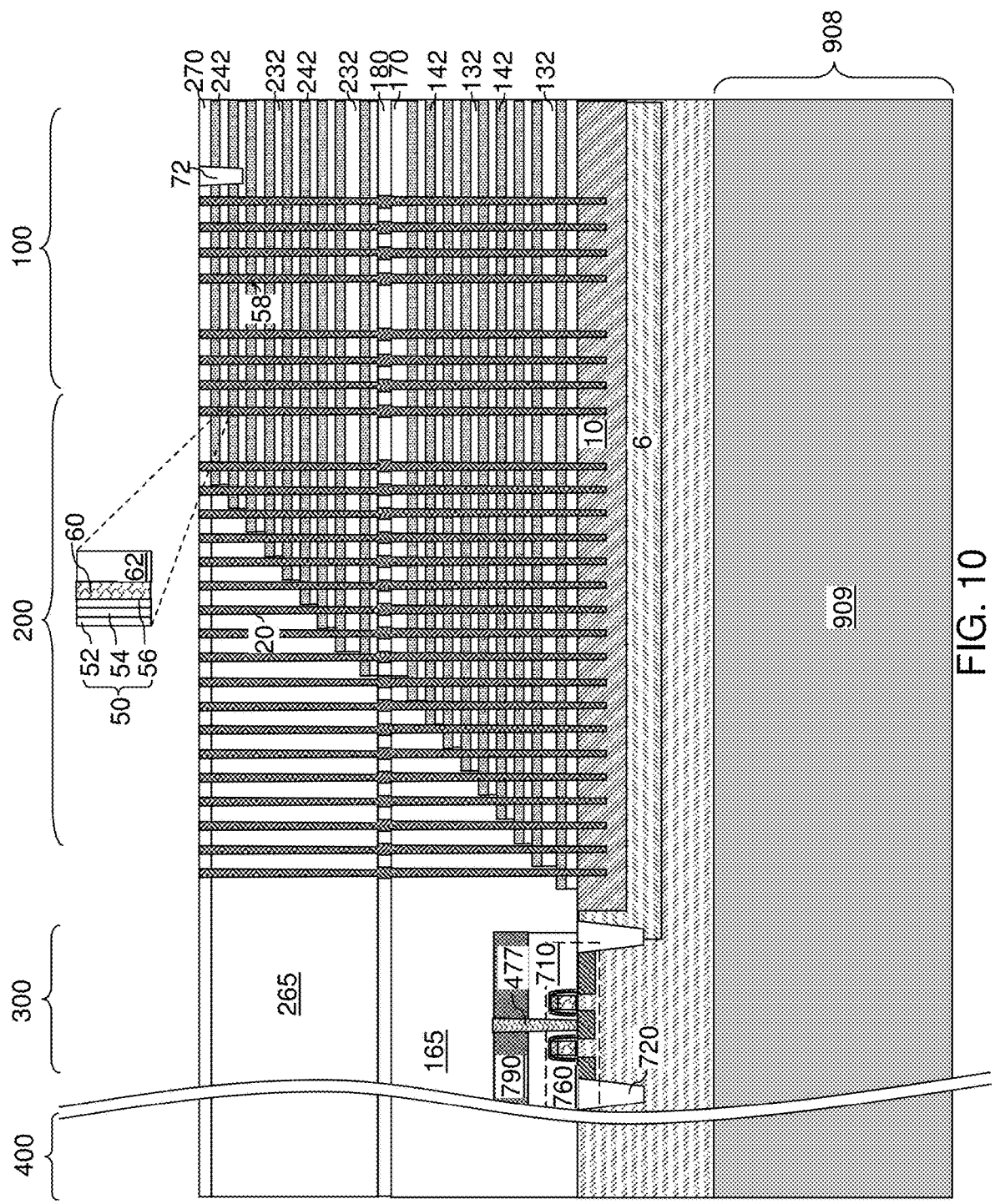
FIG. 10 is a vertical cross-sectional view of a region of the exemplary structure after formation of memory opening fill structures and support pillar structures according to an embodiment of the present disclosure.

Referring to FIG. 10, the exemplary structure is illustrated after formation of the memory opening fill structures 58. Support pillar structures 20 are formed in the support openings 19 concurrently with formation of the memory opening fill structures 58. Each support pillar structure 20 may have a same set of components as a memory opening fill structure 58. Generally, a plurality of sets of memory stack structures 55 can be formed through the vertically alternating sequence of the first continuous insulating layers 132 and the first continuous sacrificial material layers 142 and through the vertically alternating sequence of the second continuous insulating layers 232 and the second continuous sacrificial material layers 242. The first continuous insulating layers 132 and the second continuous insulating layers 232 can be considered as a set of continuous insulating layers (132, 232) and a set of continuous sacrificial material layers (142, 242). Thus, each set of memory stack structures 55 can vertically extend through the vertically alternating sequence of the continuous insulating layers (132, 232) and the continuous sacrificial material layers (142, 242). Each set of memory stack structures 55 vertically extends through a respective region of the vertically alternating sequence that are laterally spaced apart along the second horizontal direction hd2. Each of the memory stack structures 55 comprises a respective vertical semiconductor channel 60 and a respective memory film 60.

Referring to FIGS. 11A-11C, a first contact-level dielectric layer 280 may be formed over the second-tier structure (232, 242, 270, 265, 72). The first contact-level dielectric layer 280 includes a dielectric material such as silicon oxide, and may be formed by a conformal or non-conformal deposition process. For example, the first contact-level dielectric layer 280 may include undoped silicate glass and may have a thickness in a range from 100 nm to 600 nm, although lesser and greater thicknesses may also be used.

A photoresist layer (not shown) may be applied over the first contact-level dielectric layer 280 and may be lithographically patterned to form elongated openings that extend along the first horizontal direction hd1 between clusters of memory opening fill structures 58. The backside trenches 79 may be formed by transferring the pattern in the photoresist layer through the first contact-level dielectric layer 280, the second-tier structure (232, 242, 270, 265, 72), and the first-tier structure (132, 142, 170, 165), and to a top surface of the substrate 908. As used herein, a "backside trench" refers to a trench that laterally divides the vertically alternating sequence of the continuous insulating layers (132, 232) and the continuous sacrificial material layers (142, 242). Thus, portions of the first contact-level dielectric layer 280, the second-tier structure (232, 242, 270, 265, 72), the first-tier structure (132, 142, 170, 165), and the substrate 908 that underlie the openings in the photoresist layer may be removed to form the backside trenches 79. Each of the backside trenches 79 can be formed entirely within a memory array region 100 and adjoining staircase regions 200.

In one embodiment, the backside trenches 79 may be formed between clusters of memory stack structures 55. According to an embodiment of the present disclosure, the backside trenches 79 can laterally extend along the first horizontal direction hd1, and divide the vertically alternating sequence into a plurality of alternating stacks of insulating layers (132, 232) and sacrificial material layers (142, 242). Each alternating stack of insulating layers (132, 232) and sacrificial material layers (142, 242) can include a first-tier alternating stack of first insulating layers 132 and first sacrificial material layers 142, and a second-tier alternating stack of second insulating layers 232 and second sacrificial material layers 242. The clusters of the memory stack structures 55 may be laterally spaced apart along the second horizontal direction hd2 by the backside trenches 79.

In one embodiment, each alternating stack {(132, 142), (232, 2342)} among the plurality of alternating stacks {(132, 142), (232, 2342)} comprises a respective staircase region 200 in which spacer material layers (132, 232) have lateral extents that decrease with an increase in a vertical distance from the substrate 908. In one embodiment, each of the plurality of backside trenches 79 can be laterally bounded by sidewalls of at least one alternating stack {(132, 142), (232, 2342)}. A first subset of the diver trenches 79 may laterally extend along the first horizontal direction hd1 between a pair of alternating stacks {(132, 142), (232, 2342)}.

Referring to FIG. 12, the sacrificial material layers (142, 242) are may be removed selective to the insulating layers (132, 232), the first and second insulating cap layers (170, 270), the first contact-level dielectric layer 280, and the substrate 908. For example, an etchant that selectively etches the materials of the sacrificial material layers (142, 242) with respect to the materials of the insulating layers (132, 232), the first and second insulating cap layers (170, 270), the stepped dielectric material portions (165, 265), and the material of the outermost layer of the memory films 50 may be introduced into the backside trenches 79, for example, using an isotropic etch process. For example, the sacrificial material layers (142, 242) may include silicon nitride, the materials of the insulating layers (132, 232), the first and second insulating cap layers (170, 270), the stepped dielectric material portions (165, 265), and the outermost layer of the memory films 50 may include silicon oxide materials.

The isotropic etch process may be a wet etch process using a wet etch solution, or may be a gas phase (dry) etch process in which the etchant is introduced in a vapor phase into the backside trench 79. For example, if the sacrificial material layers (142, 242) include silicon nitride, the etch process may be a wet etch process in which the exemplary structure is immersed within a wet etch tank including phosphoric acid, which etches silicon nitride selective to silicon oxide, silicon, and various other materials used in the art.

Backside recesses (143, 243) are formed in volumes from which the sacrificial material layers (142, 242) are removed. The backside recesses (143, 243) include first backside recesses 143 that are formed in volumes from which the first sacrificial material layers 142 are removed and second backside recesses 243 that are formed in volumes from which the second sacrificial material layers 242 are removed. Each of the backside recesses (143, 243) may be a laterally extending cavity having a lateral dimension that is greater than the vertical extent of the cavity. In other words, the lateral dimension of each of the backside recesses (143, 243) may be greater than the height of the respective backside recess (143, 243). A plurality of backside recesses (143, 243) may be formed in the volumes from which the material of the sacrificial material layers (142, 242) is removed. Each of the backside recesses (143, 243) may extend substantially parallel to the top surface of the semiconductor substrate layer 909. A backside recess (143, 243) may be vertically bounded by a top surface of an underlying insulating layer (132, 232) and a bottom surface of an overlying insulating layer (132, 232). In one embodiment, each of the backside recesses (143, 243) may have a uniform height throughout.

Referring to FIGS. 13A and 13B, an oxidation process may be performed to oxidize physically exposed portions of the pedestal channel portions 11. Tubular insulating spacers (not expressly illustrated) may be formed around each pedestal channel portion 11. A backside blocking dielectric layer (not shown) may be optionally deposited in the backside recesses (143, 243) and the backside trenches 79 and over the first contact-level dielectric layer 280. The backside blocking dielectric layer includes a dielectric material such as a dielectric metal oxide, silicon oxide, or a combination thereof. For example, the backside blocking dielectric layer may include aluminum oxide. The backside blocking dielectric layer may be formed by a conformal deposition process such as atomic layer deposition or chemical vapor deposition. The thickness of the backside blocking dielectric layer may be in a range from 1 nm to 20 nm, such as from 2 nm to 10 nm, although lesser and greater thicknesses may also be used.

At least one conductive material may be deposited in the plurality of backside recesses (243, 243), on the sidewalls of the backside trenches 79, and over the first contact-level dielectric layer 280. The at least one conductive material may be deposited by a conformal deposition method, which may be, for example, chemical vapor deposition (CVD), atomic layer deposition (ALD), electroless plating, electroplating, or a combination thereof. The at least one conductive material may include an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof.

In one embodiment, the at least one conductive material may include at least one metallic material, i.e., an electrically conductive material that includes at least one metallic element. Non-limiting exemplary metallic materials that may be deposited in the backside recesses (143, 243) include tungsten, tungsten nitride, titanium, titanium nitride, tantalum, tantalum nitride, cobalt, and ruthenium. For example, the at least one conductive material may include a conductive metallic nitride liner that includes a conductive metallic nitride material such as TiN, TaN, WN, or a combination thereof, and a conductive fill material such as W, Co, Ru, Mo, Cu, or combinations thereof. In one embodiment, the at least one conductive material for filling the backside recesses (143, 243) may be a combination of titanium nitride layer and a tungsten fill material.

Electrically conductive layers (146, 246) may be formed in the backside recesses (143, 243) by deposition of the at least one conductive material. A plurality of first electrically conductive layers 146 may be formed in the plurality of first backside recesses 143, a plurality of second electrically conductive layers 246 may be formed in the plurality of second backside recesses 243, and a continuous metallic material layer (not shown) may be formed on the sidewalls of each backside trench 79 and over the first contact-level dielectric layer 280. Each of the first electrically conductive layers 146 and the second electrically conductive layers 246 may include a respective conductive metallic nitride liner and a respective conductive fill material. Thus, the first and second sacrificial material layers (142, 242) may be replaced with the first and second electrically conductive layers (146, 246), respectively. Specifically, each first sacrificial material layer 142 may be replaced with an optional portion of the backside blocking dielectric layer and a first electrically conductive layer 146, and each second sacrificial material layer 242 may be replaced with an optional portion of the backside blocking dielectric layer and a second electrically conductive layer 246. A backside cavity is present in the portion of each backside trench 79 that is not filled with the continuous metallic material layer.

Residual conductive material may be removed from inside the backside trenches 79. Specifically, the deposited metallic material of the continuous metallic material layer may be etched back from the sidewalls of each backside trench 79 and from above the first contact-level dielectric layer 280, for example, by an anisotropic or isotropic etch. Each remaining portion of the deposited metallic material in the first backside recesses constitutes a first electrically conductive layer 146. Each remaining portion of the deposited metallic material in the second backside recesses constitutes a second electrically conductive layer 246. Sidewalls of the first electrically conductive material layers 146 and the second electrically conductive layers may be physically exposed to a respective backside trench 79. The backside trenches may have a pair of curved sidewalls having a non-periodic width variation along the first horizontal direction hd1 and a non-linear width variation along the vertical direction.

Each electrically conductive layer (146, 246) may be a conductive sheet including openings therein. A first subset of the openings through each electrically conductive layer (146, 246) may be filled with memory opening fill structures 58. A second subset of the openings through each electrically conductive layer (146, 246) may be filled with the support pillar structures 20. Each electrically conductive layer (146, 246) may have a lesser area than any underlying electrically conductive layer (146, 246) because of the first and second stepped surfaces. Each electrically conductive layer (146, 246) may have a greater area than any overlying electrically conductive layer (146, 246) because of the first and second stepped surfaces.

In some embodiment, drain-select-level isolation structures 72 may be provided at topmost levels of the second electrically conductive layers 246. A subset of the second electrically conductive layers 246 located at the levels of the drain-select-level isolation structures 72 constitutes drain select gate electrodes. A subset of the electrically conductive layer (146, 246) located underneath the drain select gate electrodes may function as combinations of a control gate and a word line located at the same level. The control gate electrodes within each electrically conductive layer (146, 246) are the control gate electrodes for a vertical memory device including the memory stack structure 55.

Each of the memory stack structures 55 comprises a vertical stack of memory elements located at each level of the electrically conductive layers (146, 246). A subset of the electrically conductive layers (146, 246) may comprise word lines for the memory elements. The memory-level assembly is located over the semiconductor substrate layer 909. The memory-level assembly includes at least one alternating stack (132, 146, 232, 246) and memory stack structures 55 vertically extending through the at least one alternating stack (132, 146, 232, 246).

Generally, the sacrificial material layers (142, 242) in the plurality of alternating stacks {(132, 142), (232, 242)} can be replaced with the electrically conductive layers (1'46, 246) employing the backside trenches 79 as a conduit for an etchant that etches the sacrificial material layers (142, 242) and for a reactant that deposits at least one conductive material of the electrically conductive layers (146, 246). A plurality of alternating stacks of insulating layers (132, 232) and electrically conductive layers (146, 246) can be located on a substrate 908, and can be laterally spaced apart by a plurality of backside trenches 79 that laterally extend along the first horizontal direction hd1.

Referring to FIGS. 14A-14D, a conformal dielectric material layer (such as a silicon oxide layer) can be deposited at peripheral portions of the backside trenches 79, and an anisotropic etch process can be performed to remove horizontal portions of the conformal dielectric material layer. Each remaining vertical portion of the conformal dielectric material layer in the backside trenches 79 constitutes a backside trench dielectric spacer 74.

Electrical dopants can be implanted into physically exposed portions of the second doped wells 10 to form source regions 61. In one embodiment, the second doped wells 10 and the vertical semiconductor channels 60 can have a doping of a first conductivity type, and the source regions 61 can have a doping of a second conductivity type that is the opposite of the first conductivity type. For example, the first conductivity type can be p-type and the second conductivity type can be n-type, or vice versa. In case the source regions 61 are formed, the source regions 61 can have an atomic concentration of electrical dopants of the second conductivity type in a range from $5.0 \times 10^{19}/cm^3$ to $2.0 \times 10^{21}/cm^3$.

At least one conductive fill material can be deposited in the remaining volumes of the backside trenches 79. For example, the at least one conductive fill material can include doped polysilicon, a conductive metallic nitride, and/or a metal fill material (such as tungsten). Excess portions of the at least one conductive fill material can be removed from above the horizontal plane including the top surface of the first contact-level dielectric layer 280. Each remaining portion of the at least one conductive fill material in the backside trenches 79 can constitute a source contact via structure 76. Each of the source contact via structures 76 is a conductive fill material portion. The set of all material portions filling a backside trench 79 constitutes a backside trench fill structure (74, 76). In one embodiment, a backside trench fill structure (74, 76) can include a backside trench dielectric spacer 74 and a source contact via structure 76.

A plurality of alternating stacks {(132, 146), (232, 246)} and a plurality of backside trench fill structures (74, 76) are alternately interlaced along the second horizontal direction hd2. In one embodiment, each of the plurality of backside trench fill structures (74, 76) contacts sidewalls of at least one alternating stack {(132, 146), (232, 246)} among the plurality of alternating stacks {(132, 146), (232, 246)} that laterally extend along the first horizontal direction hd1.

Referring to FIG. 15, a second contact-level dielectric layer 282 can be optionally formed over the first contact-level dielectric layer 280. The second contact-level dielectric layer 282 includes a dielectric material such as silicon oxide. A photoresist layer (not shown) may be applied over the contact-level dielectric layers (280, 282), and may be lithographically patterned to form various contact via openings therethrough. For example, openings for forming drain contact via structures may be formed over the drain regions 63 in the memory array regions 100, and openings for forming staircase region contact via structures may be formed in the staircase regions 200. An anisotropic etch process is performed to transfer the pattern in the photoresist layer through the contact-level dielectric layers (280, 282) and underlying dielectric material portions. The drain regions 63 and the electrically conductive layers (146, 246) may be used as etch stop structures. Drain contact via cavities may be formed over each drain region 63, and staircase-region contact via cavities may be formed over each electrically conductive layer (146. 246) at the stepped surfaces underlying the first and second retro-stepped dielectric material portions (165, 265). The photoresist layer may be subsequently removed, for example, by ashing.

Drain contact via structures 88 are formed in the drain contact via cavities and on a top surface of a respective one of the drain regions 63. Staircase-region contact via structures 86 are formed in the staircase-region contact via cavities and on a top surface of a respective one of the electrically conductive layers (146, 246). The staircase-region contact via structures 86 may include drain select level contact via structures that contact a subset of the second electrically conductive layers 246 that function as drain select level gate electrodes. Further, the staircase-region contact via structures 86 may include word line contact via structures that contact electrically conductive layers (146, 246) that underlie the drain select level gate electrodes and function as word lines for the memory stack structures 55.

Peripheral-device-contact via cavities may be formed through the contact-level dielectric layers (280, 282) and the second and first retro-stepped dielectric material portions (265, 165) onto a top surface of a respective one of the sacrificial via structures 477. The peripheral-device-contact via cavities can be vertically extended to a top surface of a respective component of the semiconductor devices 710 by removing the sacrificial via structures 477 selective to the etch stop dielectric layer 790 and the planarization dielectric layer 760. At least one conductive material may be deposited in the peripheral-device-contact via cavities. Excess portions of the at least one conductive material may be removed from above the horizontal plane including the top surface of the contact-level dielectric layer 280. Each remaining portion of the at least one conductive material in a peripheral-device-contact via cavity constitutes a peripheral-device-contact via structure 488. The peripheral-device-contact via structures 488 are formed in the peripheral device regions 300. The peripheral device regions 300 may include sense amplifier circuits, word line and select gate electrode switch regions, and miscellaneous peripheral device regions.

A bit-line-level dielectric layer 290 can be formed over the contact-level dielectric layers (280, 282). The bit-line-level metal interconnect structures (98, 96) can be formed in the bit-line-level dielectric layer 290. The bit-line-level metal interconnect structures (98, 96) may include bit lines 98 contacting a respective one of the drain contact via structures 88, and interconnection line structures 96 contacting, and/or electrically connected to, at least one of the staircase-region contact via structures 86 and/or the peripheral-device-contact via structures 488.

Referring to FIG. 16, upper dielectric material portions can be formed above the bit-line-level dielectric layer 290. For example, additional dielectric material layers (which are herein referred to as upper-level dielectric material layers 960) can be formed above the bit-line-level dielectric layer 290. Each of the upper-level dielectric material layers 960 can include a dielectric material such as silicon oxide. The uppermost layer among the upper-level dielectric material layers 960 can include a diffusion barrier dielectric material such as silicon nitride. Additional metal interconnect structures (which are herein referred to as upper-level metal interconnect structures 980) can be formed in the upper-level dielectric material layers 960. The upper-level metal interconnect structures 980 can include metal line structures and metal via structures that provide electrical connections between the semiconductor devices 710 and the various nodes of a three-dimensional array of memory elements including memory stack structures 55.

Referring to FIGS. 17A-17F, various views of the exemplary structure are illustrated after formation of seal ring cavities 71 and a guard ring cavity 77. FIGS. 17A-17D illustrate a configuration of the exemplary structure. FIGS. 17E and 17F illustrate an alternative embodiment of the exemplary structure of FIGS. 17A-17D.

For example, a photoresist layer can be applied over the upper-level dielectric material layers 960, and can be lithographically patterned to form a set of nested openings therein. Each of the openings in the photoresist layer can have a general shape of a rectangle with, or without, rounded corners or a polygon derived from a rectangle by additional of minor sides. Each of the openings in the photoresist layer can be formed in the seal ring and guard ring region 400.

An anisotropic etch process can be performed to transfer the pattern of the openings in the photoresist layer through upper dielectric material portions (such as the upper-level dielectric material layers 960), the bit-line-level dielectric layer 290, the contact-level dielectric layers (280, 282), and the retro-stepped dielectric material layers (165, 265) and onto the top surface of the substrate 908. A plurality of nested seal ring cavities 71 extending from the topmost surface of the upper dielectric material portions (such as the upper-level dielectric material layers 960) to the substrate 908. Each of the plurality of nested seal ring cavities 71 can include a respective pair of first sidewall segments that are parallel to first sidewalls of a semiconductor die to be subsequently formed, and a respective pair of second sidewall segments that are perpendicular to the first sidewalls of the semiconductor die. In one embodiment, the first sidewall segments of the nested seal ring cavities 71 can laterally extend along the first horizontal direction hd1, and the second sidewall segments of the nested seal ring cavities 71 can laterally extend along the second horizontal direction hd2. Each of the nested seal ring cavities 71 can have a configuration of a moat trench that laterally surrounds, and encloses, a respective inner structure bounded therein.

In an illustrative example, the plurality of nested seal ring cavities 71 can include an inner seal ring cavity 711 that is an innermost one of the plurality of nested seal ring cavities 71, an intermediate seal ring cavity 712 that laterally surrounds the inner seal ring cavity 711, and an outer seal ring cavity 713 that laterally surrounds the intermediate seal ring cavity 712. Additional seal ring cavities (not shown) may be formed around the outer seal ring cavity 713. In one embodiment, a guard ring cavity 77 can be formed outside the outermost cavity 713 of the nested seal ring cavities 71 concurrently with formation of the nested seal ring cavities 71. The guard ring cavity 77 can vertically extend from the topmost surface of the upper dielectric material portions (such as the upper-level dielectric material layers 960) to the substrate 908.

Each of the nested seal ring cavities 71 can include straight segments that laterally extend along the first horizontal direction hd1 or along the second horizontal direction hd2. In one embodiment, at least one of the nested seal ring cavities (e.g., 712) can have a width that induces formation of voids (e.g., air gaps) therein upon deposition of a fill material. In one embodiment, at least another one of the nested seal ring cavities (e.g., 711 and/or 713) can have a width that is conducive to conformal filling thereof. Generally, the plurality of nested seal ring cavities 71 can include at least one first seal ring cavity 712 having a smaller width that is conducive to formation of a first void therein upon deposition of a fill material therein, and at least one second seal ring cavity (711, 713) having a larger width that is conducive to a conformal fill with the fill material without a void or with a second void having a smaller void volume than the first void. As used herein, a width of a cavity or a segment of a cavity refers to an average width of the cavity or of the segment of the cavity. The height of the seal ring cavities 71 can be in a range from 5 micron to 40 microns, such as from 10 microns to 20 microns.

In one embodiment, each segment of a seal ring cavity 71 can have a same respective width throughout. For example, as shown in FIG. 17D, the inner seal ring cavity 711 can have an inner-cavity width WI throughout, the intermediate seal ring cavity 712 can have an intermediate-cavity width WT throughout, and the outer seal ring cavity 713 can have an outer-cavity width WO throughout. In one embodiment, the intermediate-cavity width WT can be less than the inner-cavity width WI, and can be less than the outer-cavity width WO. In one embodiment, the intermediate-cavity width WT can be less than one half of the inner-cavity width WI, and can be less than one half of the outer-cavity width WO. In one embodiment, the intermediate-cavity width WT can be less than one fourth of the inner-cavity width WI and the outer-cavity width WO, such as one fifth to one tenth of the inner-cavity width WI and the outer-cavity width WO. The outer-cavity width WO may be the same as, greater than, or less than, the inner-cavity width WI. The ratio of the height of a seal ring cavity 71 to the width of the seal ring cavity 71 is herein referred to as an aspect ratio of the seal ring cavity 71. The aspect ratio of the inner seal ring cavity 711 and the aspect ratio of the outer seal ring cavity 713 can be in a range from 5 to 40, such as from 10 to 20. The aspect ratio of the intermediate seal ring cavity 712 can be in a range from 10 to 160, such as from 20 to 80, although lesser and greater aspect ratios can also be employed. The guard ring cavity 77 can have a guard ring width WG throughout. The guard ring width WG can be the same as, or greater than, the inner-cavity width WI and/or the outer-cavity width WO. While the intermediate seal ring cavity 712 is illustrated as having a smaller width than the inner and outer seal ring cavities (711, 713), in alternative embodiments, the inner and/or outer seal ring cavities may have a smaller width than at least one other seal ring cavity. Furthermore, while three seal ring cavities are illustrated, two or more than three seal ring cavities may be used instead, one or more of which have a smaller width than at least one other seal ring cavity.

The alternative configuration illustrated in FIGS. 17E and 17F can be derived from the exemplary structure of FIGS. 17A-17D by changing the width of second segments of a seal ring cavity 71 that extend along the second horizontal direction hd2 relative to the width of first segments of the seal ring cavity 71 for at least one of the seal ring cavities 71. In this case, for at least one of the seal ring cavities (e.g., 712), the first segments of the seal ring cavity 712 that extend along the first horizontal direction hd1 can have a respective first-segment width, and second segments of the seal ring cavity 712 that extend along the second horizontal direction hd2 can have a respective second-segment width that is different from the-cavity first-segment width. For example, first segments of the inner seal ring cavity 711 that laterally extend along the first horizontal direction hd1 can have an inner-cavity first-segment width WIA, and second segments of the inner seal ring cavity 711 that laterally extend along the second horizontal direction hd2 can have an inner-cavity second-segment width WIB. First segments of the intermediate seal ring cavity 712 that laterally extend along the first horizontal direction hd1 can have an intermediate-cavity first-segment width WTA, and second segments of the intermediate seal ring cavity 712 that laterally extend along the second horizontal direction hd2 can have an intermediate-cavity second-segment width WTB. First segments of the outer seal ring cavity 713 that laterally extend along the first horizontal direction hd1 can have an outer-cavity first-segment width WOA, and second segments of the outer seal ring cavity 713 that laterally extend along the second horizontal direction hd2 can have an outer-cavity second-segment width WOB. The intermediate-cavity first-segment width WTA can be different from the intermediate-cavity second-segment width WTB. The inner-cavity first-segment width WIA can be the same as, or different from, the inner-cavity second-segment width WIB. The outer-cavity first-segment width WOA can be the same as, or different from, the outer-cavity second-segment width WOB. In one embodiment, the intermediate-cavity first-segment width WTA can be less than the inner-cavity first-segment width WIA, and can be less than the outer-cavity first-segment width WOA. White the first segment of a seal ring cavity which extends in the first horizontal direction is illustrated as having a smaller width than the second segment of the same seal ring cavity which extends in the second horizontal direction, it should be noted that in an alternative embodiment, the second segment of a seal ring cavity which extends in the second horizontal direction may have a smaller width than the first segment, depending on whether the layers of the device exert a greater concave warpage on the substrate in the second or the first horizontal direction, respectively.

Referring to FIGS. 18A-18E, various views of the exemplary structure are illustrated after formation of seal ring structures 73 and a guard ring 78. FIGS. 18A-18C illustrate a configuration of the exemplary structure. FIGS. 18D and 18E illustrate an alternative embodiment of the exemplary structure of FIGS. 18A-18C.

At least one diffusion barrier material is deposited into each of the plurality of nested seal ring cavities 71 and the guard ring cavity 77. The at least one diffusion barrier material includes a material that blocks diffusion of moisture, hydrogen and/or impurity metals. For example, the at least one diffusion barrier material can comprise, and/or consist of, at least one material selected from tungsten, a conductive metallic nitride (such as titanium nitride) and/or silicon nitride. In one embodiment, the at least one diffusion barrier material can consist of a layer stack of a conductive metallic nitride (such as titanium nitride) and tungsten. In case the at least one diffusion barrier material includes a conductive material, such as tungsten, excess portions of the at least one diffusion barrier material may be removed from above the topmost surface of the upper-level dielectric layers 960 by a planarization process such as a chemical mechanical planarization process.

Each portion of the at least one diffusion barrier material that fills a respective one of the seal ring cavities 71 constitutes a seal ring structure 73. The portion of the at least one diffusion barrier material that fills the guard ring cavity 77 constitutes a guard ring structure 78. A plurality of nested seal ring structures 73 is formed, which comprises portions of the at least one diffusion barrier material that is deposited in the plurality of nested seal ring cavities 71. The plurality of nested seal ring structures 73 extends from a topmost surface of the upper dielectric material portions (such as the upper-level dielectric material layers 960) to the substrate 908. The plurality of nested seal ring structures 73 laterally surround, and enclose, the alternating stacks of insulating layers (132, 232) and electrically conductive layers (146, 246) and an inner region of the upper dielectric material portions located inside the innermost sidewalls of the nested seal ring structures 73. The plurality of nested seal ring structures 73 can include an inner seal ring structure 731 that is formed in the inner seal ring cavity 711, an intermediate seal sing structure 732 that is formed in the intermediate seal ring cavity 712, and an outer seal ring structure 733 that is formed in the outer seal ring cavity 713.

In one embodiment, the plurality of nested seal ring structures 73 can comprise a first seal ring structure (such as the intermediate seal ring structure 732) having a first void 742 (e.g., air gap) therein, and a second seal ring structure (such as the inner seal ring structure 731 or the outer seal ring structure 733) laterally enclosing, or laterally enclosed by, the first seal ring structure, and comprising a second material portion containing the at least one diffusion barrier material. The first seal ring structure (such as the intermediate seal ring structure 732) can have a first seal ring width (such as the intermediate-cavity width WT), and the second seal ring structure (such as the outer seal ring structure 733 or the inner seal ring structure 731) can have a second seal ring width (such as the outer-cavity width WO or the inner-cavity width WI) between an inner sidewall and an outer sidewall thereof. The first seal ring width can be less than the second seal ring width. In this case, the second seal ring structure (such as the outer seal ring structure 733 or the inner seal ring structure 731) can have a second void (741 or 743) therein or lack any void therein. If present, the second void (741 or 743) has a smaller width than the first void 742.

Each seal ring structure (such as the outer seal ring structure 733 and the inner seal ring structure 731) without a void or with a smaller void functions as a conventional seal ring structure. Each seal ring structure (such as the intermediate seal ring structure 732) with a larger void 742 functions as a mechanical stress absorber structure, which can reduce the mechanical stress in the exemplary structure by deformation of the at least one diffusion barrier material around the void.

In one embodiment shown in FIG. 18C, the intermediate seal ring structure 732 can include the first void 742 having a width, which is herein referred to as an intermediate void width V2. The outer seal ring structure 733 can be free of a void therein, or can include a void 743 having a width, which is herein referred to as an outer void width V3 and is less than the intermediate void width V2. The inner seal ring structure 731 can be free of a void therein, or can include a void 741 having a width, which is herein referred to as an inner void width V1 and is less than the intermediate void width V2. The larger void width V2 tunes and/or offsets the warpage imposed on the substrate by the layers of the device, such as the electrically conductive layers (146, 246) and/or the layers of the seal ring structures 73.

In one embodiment shown in FIG. 18C, each of the plurality of nested seal ring structures 73 can comprise: a respective pair of first sidewall segments 752A that are parallel to the first horizontal direction hd1, and a respective pair of second sidewall segments 752B that are parallel to the second horizontal direction hd2. The void 742 within the intermediate seal ring structure 732 may continuously extend around the entirety of the intermediate seal ring structure 732, or the first void 742 may be confined within a segment of the intermediate seal ring structure 732. In one embodiment, the first void 742 may extend inside a sidewall segment selected from the first sidewall segments 752A or the second sidewall segments 752B of the first seal ring structure (such as the intermediate seal ring structure 732), and has a lateral extent that is at least 98% of a lateral extent of the sidewall segment in which the first void is present.

In an alternative embodiment shown in FIGS. 18D and 18E, the first sidewall segments 752A of the first seal ring structure (such as the intermediate seal ring structure 732) can have the first seal ring width (such as the intermediate-cavity first-segment width WTA), and the second sidewall segments 752B of the first seal ring structure have an additional seal ring width (such as the intermediate-cavity second-segment width WTB) that is greater than the first seal ring width. Thus, the first void 742A in the first segment of the intermediate seal ring structure 732 which extends in the first horizontal direction hd1 can have the second width V2, and the second void 742B in the second segment of the intermediate seal ring structure 732 which extends in the second horizontal direction hd2 can have a fourth void width V4 which is smaller than second void width V2 if the layers of the device exert a greater concave warpage on the substrate in the second horizontal direction. Alternatively, the fourth width V4 may be larger than the second void width V2 if the layers of the device exert a greater concave warpage on the substrate in the first horizontal direction. The larger void width V2 offsets the warpage exerted on the substrate by the device layers in the direction perpendicular to the length direction of the void (i.e., the horizontal direction which is perpendicular to the width of the void and which is parallel to the direction of the segment of the seal ring structure containing the void).

In one embodiment, the first void 742 continuously extends around the alternating stacks {(132, 146), (232, 246)} and an inner region of the upper dielectric material portions (such as the upper-level dielectric material layers 960) as a single continuous void. Alternatively, each segment (752A, 752B) may have a separate enclosed void (742A, 742B).

In the embodiment illustrated in FIGS. 18A-18E, the seal ring structures 73 are formed separately from the sacrificial via structures 477 and the peripheral-device-contact via structures 488. In an alternative embodiment, the seal ring structures 73 (e.g., the inner seal ring structure 731, the intermediate seal ring structure 732 and the outer seal ring structure 733) may be formed at the same time as the sacrificial via structures 477 and the peripheral-device-contact via structures 488. For example, the bottom portions of the seal ring structures 73 may be formed at the same time as the sacrificial via structures 477 shown in FIG. 1. Likewise, the upper portions of the seal ring structures 73 may be formed at the same time as the peripheral-device-contact via structures 488 shown in FIG. 15. In this embodiment, seal ring cavities 71 are formed at the same time as the peripheral-device-contact via cavities in FIG. 15, followed by filling both the seal ring cavities 71 and the peripheral-device-contact via cavities with an electrically conductive material to form the respective peripheral-device-contact via structures 488 and the seal ring structures 73.

Referring to FIG. 19, a dielectric passivation layer 990 can be formed over the top surfaces of the seal ring structures 73 and the guard ring structure 78. The dielectric passivation layer 990 includes a dielectric material that can function as a diffusion barrier layer for moisture, hydrogen, and metallic impurities. For example, the dielectric passivation layer 990 can include silicon nitride. The thickness of the dielectric passivation layer 990 can be in a range from 30 nm to 300 nm, although lesser and greater thicknesses can also be employed.

Referring to FIG. 20, bonding pads 996 can be formed through the dielectric passivation layer 990 on a respective one of the upper-level metal interconnect structures 980. The bonding pads 996 can include a metallic material that can be employed for metal-to-metal bonding (such as copper) or for bonding with a solder ball or a bonding wire.

Subsequently, the substrate 908 can be singulated along the dicing channels on the substrate 908. The dicing channels can be the kerf areas 500. Each diced portion of the substrate 908 and material portions attached thereto constitutes a semiconductor die, which can have a pair of first sidewalls that are parallel to the first horizontal direction hd1 and a pair of second sidewalls that are parallel to the second horizontal direction hd2.

Referring to all drawings and according to various embodiments of the present disclosure, a semiconductor die is provided, which comprises: a plurality of alternating stacks of insulating layers (132, 232) and electrically conductive layers (146, 246) that are located over a substrate 908 that laterally extend along a first horizontal direction hd1 and that are laterally spaced apart along a second horizontal direction, a plurality of sets of memory stack structures 55 extending through a respective alternating stack {(132, 146), (232, 246)}, and a plurality of nested seal ring structures 73 which include a first seal ring structure 712 comprising having a first seal ring width (WT or WTA) between an inner sidewall and an outer sidewall thereof, and a second seal ring structure (711 or 713) having a second seal ring width (WI or WO) between an inner sidewall and an outer sidewall thereof, such that the first seal ring width (WT or WTA) is less than the second seal ring width (WI or WO).

In one embodiment, each of the plurality of nested seal ring structures 73 comprises: a respective pair of first sidewall segments that are parallel to first sidewalls of the semiconductor die (which can be parallel to the first horizontal direction hd1); and a respective pair of second sidewall segments that are perpendicular to the first sidewalls of the semiconductor die (and can be parallel to the second horizontal direction hd2).

In one embodiment, a first void 742 extends inside at least one of the first sidewall segments 752A of the first seal ring structure 732.

In one embodiment the semiconductor die further comprises dielectric material portions (165, 265, 960) overlying the substrate 908 and laterally surrounding the alternating stacks {(132, 146), (232, 246)}, and backside trench fill structures (74, 76) located between the alternative stacks. The plurality of nested seal ring structures 73 extend from a topmost surface of the dielectric material portions (165, 265, 960) to the substrate 908 and laterally surround and enclose the alternating stacks {(132, 146), (232, 246)} and an inner region of the dielectric material portions (165, 265, 960).

In one embodiment, the first sidewall segments 752A of the first seal ring structure 732 have the first seal ring width (such as the intermediate-cavity first-segment width WTA), and the second sidewall segments 752B of the first seal ring structure 732 have an additional seal ring width (such as the intermediate-cavity second-segment width WTB) that is greater than the first seal ring width.

In one embodiment, the first void 742A has a first void width (such as the intermediate void width V2), and each of the second sidewall segments 752B includes an additional void 742B that has a void width V4 that is less than the first void width V2, as illustrated in FIG. 18E. In another embodiment, the second sidewall segments 752B lack a void.

In one embodiment, an entirety of the first seal ring structure 732 has the first seal ring width (such as the intermediate-cavity width WT), and an entirety of the second seal ring structure (such as the inner seal ring structure 731 or the outer seal ring structure 733) has the second seal ring width (such as the inner-cavity width WI or the outer-cavity width WO) as illustrated in FIG. 18D.

In one embodiment, the first void 742 continuously extends around the alternating stacks and an inner region of the dielectric material portions (165, 265, 960) as a single continuous void in the configuration illustrated in FIGS. 18C and 18D.

In one embodiment, the first void 742 has a vertical extent that is at least 80% of a vertical extent of the first seal ring structure 732. In one embodiment, the second seal ring structure (such as the inner seal ring structure 731 or the outer seal ring structure 733) comprises a second void (741 or 743) having a smaller seal ring width (such as the outer void width V3 or the inner void width V1) than the first void 742. In another embodiment, the second seal ring structure (such as the inner seal ring structure 731 or the outer seal ring structure 733) lacks of a void therein.

In one embodiment, the plurality of nested seal ring structures 73 comprises a third seal ring structure (such as the outer seal ring structure 733 or the inner seal ring structure 731) including a third portion of the at least one diffusion barrier material and having a third seal ring width (such as the outer-cavity width WO or the inner-cavity width WI) between an inner sidewall and an outer sidewall thereof. The first seal ring structure 732 is located between the second seal ring structure (e.g., 731 or 733) and the third seal ring structure (e.g., 733 or 731), and the third seal ring width is greater than the first seal ring width.

In one embodiment, the plurality of nested seal ring structures 73 comprise at least one diffusion barrier material selected from tungsten, a conductive metallic nitride, or silicon nitride.

In one embodiment, each of the memory stack structures 55 comprises: a memory film 50 extending through multiple electrically conductive layers (146, 246) within a respective one of the plurality of alternating stacks {(132, 232), (146, 246)}, and a vertical semiconductor channel 60 that contacts the memory film 50.

Each seal ring structure 73 including a void 742 can be used to reduce or balance out mechanical stress generated by the seal ring structures 73 and/or by the electrically conductive layers (146, 246) within the memory array regions 100 and the staircase regions 200 by having the void deform under the mechanical stress. Thus, the void(s) in the seal ring structure 73 can be advantageously employed to reduce warpage of the substrate 908. Bonding of the substrate 908 to another substrate can be facilitated by reduction of the wafer warpage. In this case, dicing of the semiconductor dies can be performed after the wafer including the substrate 908 and the devices thereupon is bonded to another wafer. Thus, the reduced warpage of the substrate through the use of the seal ring structures 73 can be utilized in various ways to facilitate manufacture of semiconductor dies with less warpage, and increased die yield and device reliability.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

The invention claimed is:

1. A semiconductor die comprising:
a plurality of alternating stacks of insulating layers and electrically conductive layers that are located over a substrate and that laterally extend along a first horizontal direction and that are laterally spaced apart along a second horizontal direction which is perpendicular to the first horizontal direction;
a plurality of sets of memory stack structures extending through the plurality of alternating stacks; and
a plurality of nested seal ring structures comprising:
a first seal ring structure comprising having a first seal ring width between an inner sidewall and an outer sidewall thereof; and
a second seal ring structure having a second seal ring width between an inner sidewall and an outer sidewall thereof, wherein the first seal ring width is less than the second seal ring width;
wherein:
each of the plurality of nested seal ring structures comprises a respective pair of first sidewall segments that are parallel to first sidewalls of the semiconductor die, and a respective pair of second sidewall segments that are perpendicular to the first sidewalls of the semiconductor die;
a first void extends inside at least one of the first sidewall segments of the first seal ring structure;
the first sidewall segments of the first seal ring structure have the first seal ring width;
the second sidewall segments of the first seal ring structure have an additional seal ring width that is greater than the first seal ring width;
the first void has a first void width; and
each of the second sidewall segments includes a second void that has a second void width that is less than the first void width.

2. The semiconductor die of claim 1, further comprising:
dielectric material portions overlying the substrate and laterally surrounding the alternating stacks; and
backside trench fill structures located between the alternative stacks,
wherein the plurality of nested seal ring structures extend from a topmost surface of the dielectric material portions to the substrate and laterally surround and enclose the alternating stacks and an inner region of the dielectric material portions.

3. The semiconductor die of claim 1, wherein the second seal ring structure comprises a second void having a smaller width than the first void.

4. The semiconductor die of claim 1, wherein the second seal ring structure lacks a void therein.

5. The semiconductor die of claim 1, wherein the first void continuously extends around the alternating stacks and an inner region of the dielectric material portions as a single continuous void, and wherein the first void has a vertical extent that is at least 80% of a vertical extent of the first seal ring structure.

6. The semiconductor die of claim 1, wherein:
the plurality of nested seal ring structures comprises a third seal ring structure including a third portion of at least one diffusion barrier material and having a third seal ring width between an inner sidewall and an outer sidewall thereof;
the first seal ring structure is located between the second seal ring structure and the third seal ring structure; and
the third seal ring width is greater than the first seal ring width.

7. The semiconductor die of claim 1, wherein the plurality of nested seal ring structures comprise at least one diffusion barrier material selected from tungsten, a conductive metallic nitride, or silicon nitride.

8. The semiconductor die of claim 1, wherein each of the memory stack structures comprises:
a memory film extending through multiple electrically conductive layers within a respective one of the plurality of alternating; and
a vertical semiconductor channel that contacts the memory film.

9. A semiconductor die comprising;
a plurality of alternating stacks of insulating layers and electrically conductive layers that are located over a substrate and that laterally extend along a first horizontal direction and that are laterally spaced apart along a second horizontal direction which is perpendicular to the first horizontal direction;
a plurality of sets of memory stack structures extending through the plurality of alternating stacks; and
a plurality of nested seal ring structures comprising:

a first seal ring structure comprising having a first seal ring width between an inner sidewall and an outer sidewall thereof; and a second seal ring structure having a second seal ring width between an inner sidewall and an outer sidewall thereof, wherein the first seal ring width is less than the second seal ring width;

wherein:

each of the plurality of nested seal ring structures comprises a respective pair of first sidewall segments that are parallel to first sidewalls of the semiconductor die, and a respective pair of second sidewall segments that are perpendicular to the first sidewalls of the semiconductor die;

a first void extends inside at least one of the first sidewall segments of the first seal ring structure;

the first sidewall segments of the first seal ring structure have the first seal ring width;

the second sidewall segments of the first seal ring structure have an additional seal ring width that is greater than the first seal ring width; and each of the second sidewall segments lacks a void.

\* \* \* \* \*